US012713654B2

(12) United States Patent
Jo et al.

(10) Patent No.: US 12,713,654 B2
(45) Date of Patent: Aug. 18, 2026

(54) INTEGRATED CIRCUIT DEVICE

(71) Applicant: Samsung Electronics Co., Ltd., Suwon-si (KR)

(72) Inventors: Gunho Jo, Suwon si (KR); Chulsung Kim, Suwon si (KR); Bomi Kim, Suwon si (KR); Heesub Kim, Suwon si (KR); Eunho Cho, Suwon si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 372 days.

(21) Appl. No.: 18/370,249

(22) Filed: Sep. 19, 2023

(65) Prior Publication Data

US 2024/0274677 A1 Aug. 15, 2024

(30) Foreign Application Priority Data

Feb. 9, 2023 (KR) ........................ 10-2023-0017576

(51) Int. Cl.

| | |
|---|---|
| ***H10D 30/67*** | (2025.01) |
| ***H10D 30/43*** | (2025.01) |
| ***H10D 62/10*** | (2025.01) |
| ***H10D 84/85*** | (2025.01) |
| ***H10W 20/20*** | (2026.01) |

(52) U.S. Cl.

CPC ......... *H10D 30/6729* (2025.01); *H10D 30/43* (2025.01); *H10D 30/6735* (2025.01); *H10D 30/6757* (2025.01); *H10D 62/121* (2025.01); *H10D 84/85* (2025.01); *H10W 20/20* (2026.01)

(58) Field of Classification Search

CPC ............. H01L 25/0657; H01L 23/5329; H01L 23/5226; H01L 21/28114; H01L 21/76897

See application file for complete search history.

(56) References Cited

U.S. PATENT DOCUMENTS

| | | | | |
|---|---|---|---|---|
| 11,282,935 | B2 | 3/2022 | Chung et al. | |
| 2010/0173470 | A1 | 7/2010 | Lee et al. | |
| 2019/0123051 | A1* | 4/2019 | Park ..................... | H10B 12/482 |
| 2021/0265501 | A1* | 8/2021 | Hung .................. | H10D 62/118 |
| 2022/0157957 | A1 | 5/2022 | Jin et al. | |

(Continued)

FOREIGN PATENT DOCUMENTS

| | | |
|---|---|---|
| CN | 110739265 A | 1/2020 |
| KR | 1020100082170 A | 7/2010 |

*Primary Examiner* — Edward Chin

(74) *Attorney, Agent, or Firm* — Muir Patent Law, PLLC

(57) ABSTRACT

An integrated circuit device includes fin-type active regions protruding from a substrate and extending lengthwise in a first horizontal direction, source/drain regions respectively arranged on the fin-type active regions, a device isolation film covering both sidewalls of each fin-type active region, an insulating structure covering the source/drain regions and the device isolation film, source/drain contacts respectively arranged on and connected to the source/drain regions and apart from each other in a second horizontal direction perpendicular to the first horizontal direction, and a contact isolation insulating film arranged between the source/drain contacts in the second horizontal direction and having a lower surface closer to the substrate than a lower surface of each source/drain contact. At least one of the source/drain contacts includes a first portion extending in a vertical direction toward the substrate along a surface of the contact isolation insulating film.

20 Claims, 58 Drawing Sheets

(56) References Cited

U.S. PATENT DOCUMENTS

| | | | | |
|---|---|---|---|---|
| 2022/0208679 | A1* | 6/2022 | Lee | H10D 30/6757 |
| 2022/0208982 | A1* | 6/2022 | Chung | H10D 30/6735 |
| 2022/0223698 | A1* | 7/2022 | Xie | H10D 30/6729 |
| 2022/0278196 | A1 | 9/2022 | Kuang et al. | |
| 2022/0399251 | A1* | 12/2022 | Cho | H10W 20/20 |
| 2022/0415796 | A1* | 12/2022 | Wei | H10W 20/427 |
| 2023/0098671 | A1* | 3/2023 | Wang | H10B 10/12<br>257/288 |
| 2023/0187353 | A1* | 6/2023 | Ostermayr | H10W 20/20<br>257/773 |
| 2023/0197599 | A1* | 6/2023 | Waidhas | H10D 84/811<br>257/369 |
| 2023/0307285 | A1* | 9/2023 | Huang | H10W 10/014 |
| 2024/0250161 | A1* | 7/2024 | Tsai | H10D 30/6735 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2023-0017576, filed on Feb. 9, 2023, in the Korean Intellectual Property Office, the disclosure of which is incorporated by reference herein in its entirety.

BACKGROUND

Aspects of the inventive concept relate to an integrated circuit device, and more particularly, to an integrated circuit device including a backside contact structure.

Due to the advance of electronics technology, integrated circuit devices have been rapidly down-scaled. Because highly down-scaled integrated circuit devices require accuracy in operations as well as high operation speeds, there is a need to provide a wiring structure that is stable and optimized in a relatively small area.

SUMMARY

Aspects of the inventive concept provide an integrated circuit device having a structure capable of improving the reliability of the integrated circuit device when a device region of the integrated circuit device is reduced in area due to down-scaling.

According to an aspect of the inventive concept, there is provided an integrated circuit device including a pair of fin-type active regions, which protrude from a substrate and extend lengthwise in a first horizontal direction, and which are apart from each other in a second horizontal direction that is perpendicular to the first horizontal direction, a pair of source/drain regions respectively arranged one-to-one on the pair of fin-type active regions, a device isolation film covering both sidewalls of each of the pair of fin-type active regions, an insulating structure covering the pair of source/drain regions and the device isolation film, a pair of source/drain contacts, which are respectively arranged on the pair of source/drain regions to be connected one-to-one to the pair of source/drain regions, and which are apart from each other in the second horizontal direction, and a contact isolation insulating film arranged between the pair of source/drain contacts in the second horizontal direction and having a lower surface that is closer to the substrate than a lower surface of each of the pair of source/drain contacts, wherein at least one of the pair of source/drain contacts includes a first portion, which is arranged between one source/drain region selected from the pair of source/drain regions and the contact isolation insulating film and extends in a vertical direction toward the substrate along a surface of the contact isolation insulating film.

According to another aspect of the inventive concept, there is provided an integrated circuit device including a plurality of fin-type active regions, which protrude from a substrate and extend lengthwise in a first horizontal direction, and which are apart from each other in a second horizontal direction that is perpendicular to the first horizontal direction, a plurality of source/drain regions arranged on each of the plurality of fin-type active regions, a device isolation film covering both sidewalls of each of the plurality of fin-type active regions, an insulating structure covering the plurality of source/drain regions and the device isolation film, a plurality of source/drain contacts arranged respectively on the plurality of source/drain regions to be apart from each other in the second horizontal direction, each of the plurality of source/drain contacts being connected to at least one of the plurality of source/drain regions, a via power rail passing through the insulating structure in a vertical direction and connected integrally with a first source/drain contact selected from the plurality of source/drain contacts, and a plurality of contact isolation insulating films, which are each arranged one-by-one between a pair of source/drain contacts adjacent to each other in the second horizontal direction from among the plurality of source/drain contacts, and which each have a lower surface that is closer to the substrate than a lower surface of each of the plurality of source/drain contacts, wherein at least one of the plurality of source/drain contacts includes a first portion, which is arranged between one source/drain region selected from the plurality of source/drain regions and one contact isolation insulating film selected from the plurality of contact isolation insulating films and extends in the vertical direction toward the substrate along a surface of the selected one contact isolation insulating film.

According to yet another aspect of the inventive concept, there is provided an integrated circuit device including a plurality of fin-type active regions, which protrude from a substrate and extend lengthwise in a first horizontal direction, and which are apart from each other in a second horizontal direction that is perpendicular to the first horizontal direction, a pair of gate lines arranged over the plurality of fin-type active regions to extend lengthwise in the second horizontal direction, a plurality of source/drain regions between the pair of gate lines, the plurality of source/drain regions being respectively arranged one-to-one on the plurality of fin-type active regions, a device isolation film covering both sidewalls of each of the plurality of fin-type active regions, an insulating structure arranged between the pair of gate lines to cover the plurality of source/drain regions and the device isolation film, a plurality of source/drain contacts arranged respectively on the plurality of source/drain regions to be apart from each other in the second horizontal direction and having different cross-sectional shapes from each other in the second horizontal direction, each of the plurality of source/drain contacts being connected to at least one of the plurality of source/drain regions, a via power rail passing through the insulating structure in a vertical direction and connected integrally with a first source/drain contact selected from the plurality of source/drain contacts, a power rail wiring line passing through the substrate and the device isolation film in the vertical direction and connected to the via power rail, and a contact isolation insulating film between two source/drain contacts adjacent to each other from among the plurality of source/drain contacts, the contact isolation insulating film having an uppermost surface, which is coplanar with an upper surface of each of the plurality of source/drain contacts, and a lowermost surface, which is closer to the substrate in the vertical direction than a lower surface of each of the plurality of source/drain contacts and farther from the substrate in the vertical direction than a lower surface of the via power rail, wherein a source/drain contact contacting the contact isolation insulating film from among the plurality of source/drain contacts includes a first portion, which is arranged between one source/drain region selected from the plurality of source/drain regions and the contact isolation insulating film and extends in the vertical direction toward the substrate along a surface of the contact isolation insulating film.

BRIEF DESCRIPTION OF THE DRAWINGS

Embodiments will be more clearly understood from the following detailed description taken in conjunction with the accompanying drawings in which:

FIGS. 11A to 23D are diagrams respectively illustrating a sequence of processes of a method of fabricating an integrated circuit device, according to some embodiments, and in particular, FIGS. 11A, 12A, 14A, 15A, 16A, 17A, 18A, 19A, 20A, 21A, 22A, and 23A are cross-sectional views respectively illustrating cross-sectional structures of a region corresponding to the cross-section taken along the line X1-X1' of FIG. 2, according to the sequence of processes, FIG. 11B, 12B, 13, 14B, 15B, 17C, 18D, 19D, 20D, 21D, 22D, and 23D are cross-sectional views respectively illustrating cross-sectional structures of a region corresponding to the cross-section taken along the line Y1-Y1' of FIG. 2, according to the sequence of processes.

DETAILED DESCRIPTION OF THE EMBODIMENTS

Figure 1:
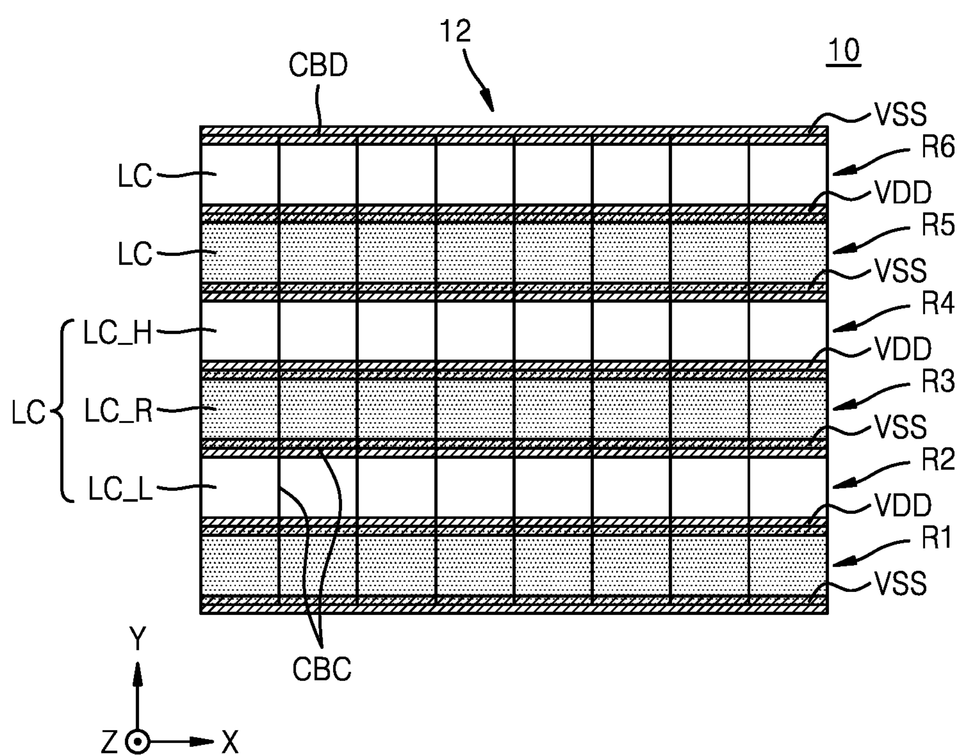
FIG. 1 is a planar layout diagram illustrating an example of a cell block of an integrated circuit device according to some embodiments.

Hereinafter, embodiments of the inventive concept will be described in detail with reference to the accompanying drawings. Like components are denoted by like reference numerals throughout the specification, and repeated descriptions thereof are omitted.

FIG. 1 is a planar layout diagram illustrating an example of a cell block 12 of an integrated circuit device 10 according to some embodiments.

Referring to FIG. 1, the cell block 12 of the integrated circuit device 10 may include a plurality of logic cells LC including circuit patterns for constituting various circuits. The plurality of logic cells LC may be arranged in a matrix form in a width direction (X direction in FIG. 1) and a height direction (Y direction in FIG. 1) in the cell block 12.

The plurality of logic cells LC may include a circuit pattern having a layout designed by a Place and Route (PnR) technique to perform at least one logical function. The plurality of logic cells LC may perform various logical functions. In some embodiments, the plurality of logic cells LC may include a plurality of standard cells. In some embodiments, at least some of the plurality of logic cells LC may perform the same logical function. In some embodiments, at least some of the plurality of logic cells LC may perform different logical functions from each other.

The plurality of logic cells LC may include various types of logic cells including a plurality of circuit elements. For example, each of the plurality of logic cells LC may include, but is not limited to, AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OR/AND/INVERTER (OAI), AND/OR (AO), AND/OR/INVERTER (AOI), a D flip-flop, a reset flip-flop, a master-slave flip-flop, a latch, or a combination thereof.

In the cell block 12, at least some of the plurality of logic cells LC constituting one row (R1, R2, R3, R4, R5, or R6) in the width direction (X direction in FIG. 1) may have the same width. In addition, at least some of the plurality of logic cells LC constituting one row (R1, R2, R3, R4, R5, or R6) may each have the same height. However, aspects of the inventive concept are not limited to the example shown in FIG. 1, and at least some of the plurality of logic cells LC constituting one row (R1, R2, R3, R4, R5, or R6) may have different widths and heights from each other.

The area of each of the plurality of logic cells LC in the cell block 12 of the integrated circuit device 10 may be defined by a cell boundary CBD. A cell interface portion CBC, at which respective cell boundaries CBD meet each other, may be arranged between two logic cells LC adjacent to each other in the width direction (X direction in FIG. 1) or the height direction (Y direction in FIG. 1) from among the plurality of logic cells LC.

In some embodiments, two logic cells LC adjacent to each other in the width direction from among the plurality of logic cells LC constituting one row (R1, R2, R3, R4, R5, or R6) may be in contact with each other at the cell interface portion CBC without a separation distance therebetween. In some embodiments, two logic cells LC adjacent to each other in the width direction from among the plurality of logic cells LC constituting one row (R1, R2, R3, R4, R5, or R6) may be apart from each other with a certain separation distance therebetween. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact.

In some embodiments, in the plurality of logic cells LC constituting one row (R1, R2, R3, R4, R5, or R6), two adjacent logic cells LC may perform the same function. In this case, the two adjacent logic cells LC may have the same structure. In some embodiments, in the plurality of logic cells LC constituting one row (R1, R2, R3, R4, R5, or R6), two adjacent logic cells LC may perform different functions from each other.

In some embodiments, one logic cell LC selected from the plurality of logic cells LC, which are included in the cell block 12 of the integrated circuit device 10, and another logic cell LC adjacent to the selected logic cell LC in the height direction (Y direction in FIG. 1) may have symmetric structures to each other about the cell interface portion CBC therebetween. For example, a reference logic cell LC_R in a third row R3 and a lower logic cell LC_L in a second row R2 may have symmetric structures to each other about the cell interface portion CBC therebetween. In addition, the reference logic cell LC_R in the third row R3 and an upper logic cell LC_H in a fourth row R4 may have symmetric structures to each other about the cell interface portion CBC therebetween.

Although FIG. 1 illustrates the cell block 12 including six rows (that is, R1, R2, . . . , and R6), this is only an example, the cell block 12 may include rows in various numbers selected as needed, and one row may include logic cells in various numbers selected as needed.

One, selected from among a plurality of ground lines VSS and a plurality of power lines VDD, may be arranged between a plurality of rows (that is, R1, R2, R3, R4, R5, and R6), which each include the plurality of logic cells LC arranged in a line in the width direction (X direction in FIG. 1). The plurality of ground lines VSS and a plurality of power lines VDD may each extend in a first horizontal direction (X direction) and may be alternately arranged apart from each other in a second horizontal direction (Y direction). Therefore, each of the plurality of ground lines VSS and the plurality of power lines VDD may be arranged to overlap the cell boundary CBD of a logic cell LC, which extends in the second horizontal direction (Y direction).

Figure 2:
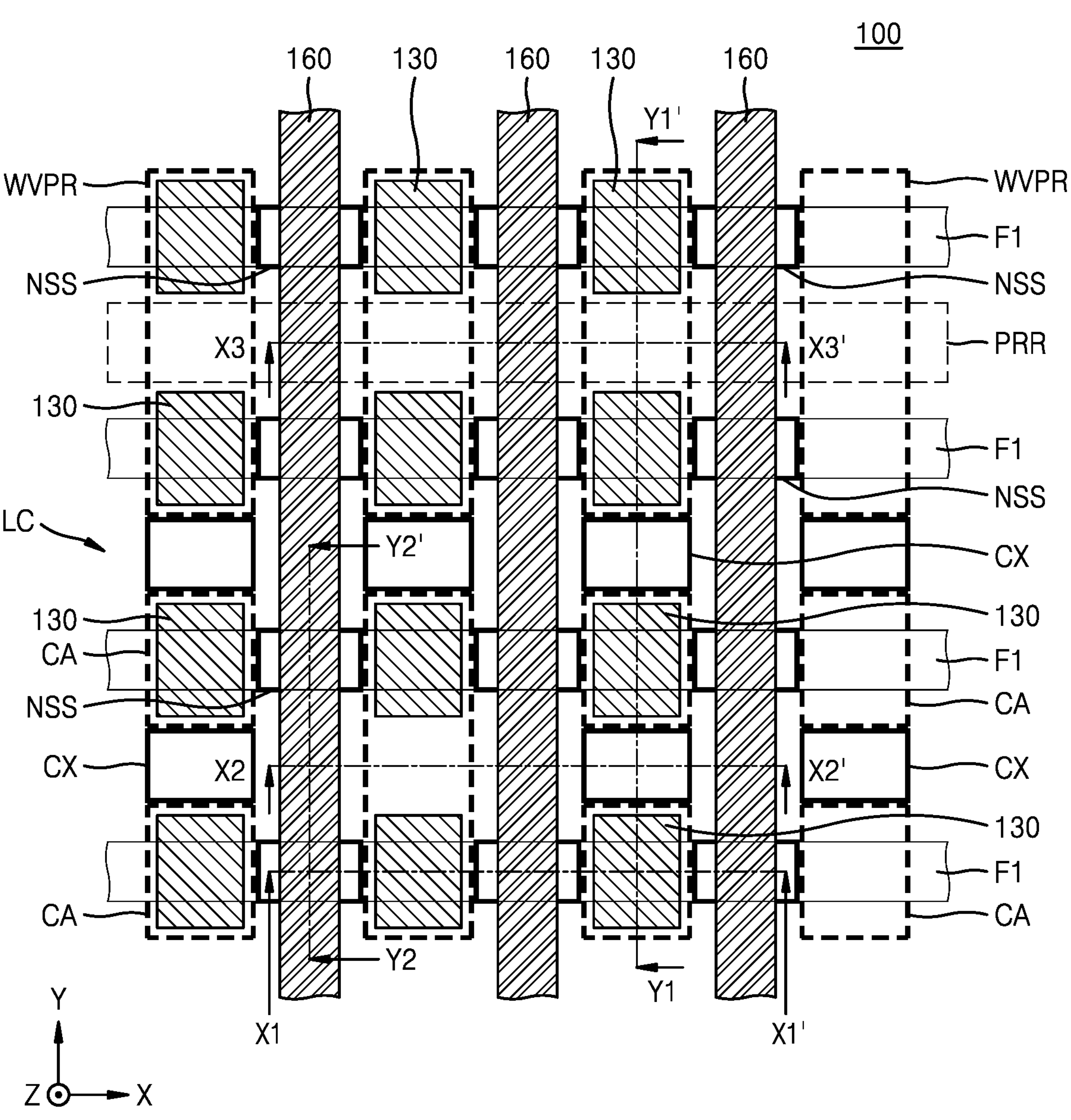
FIG. 2 is a planar layout diagram illustrating an integrated circuit device according to some embodiments.
Figure 3A:
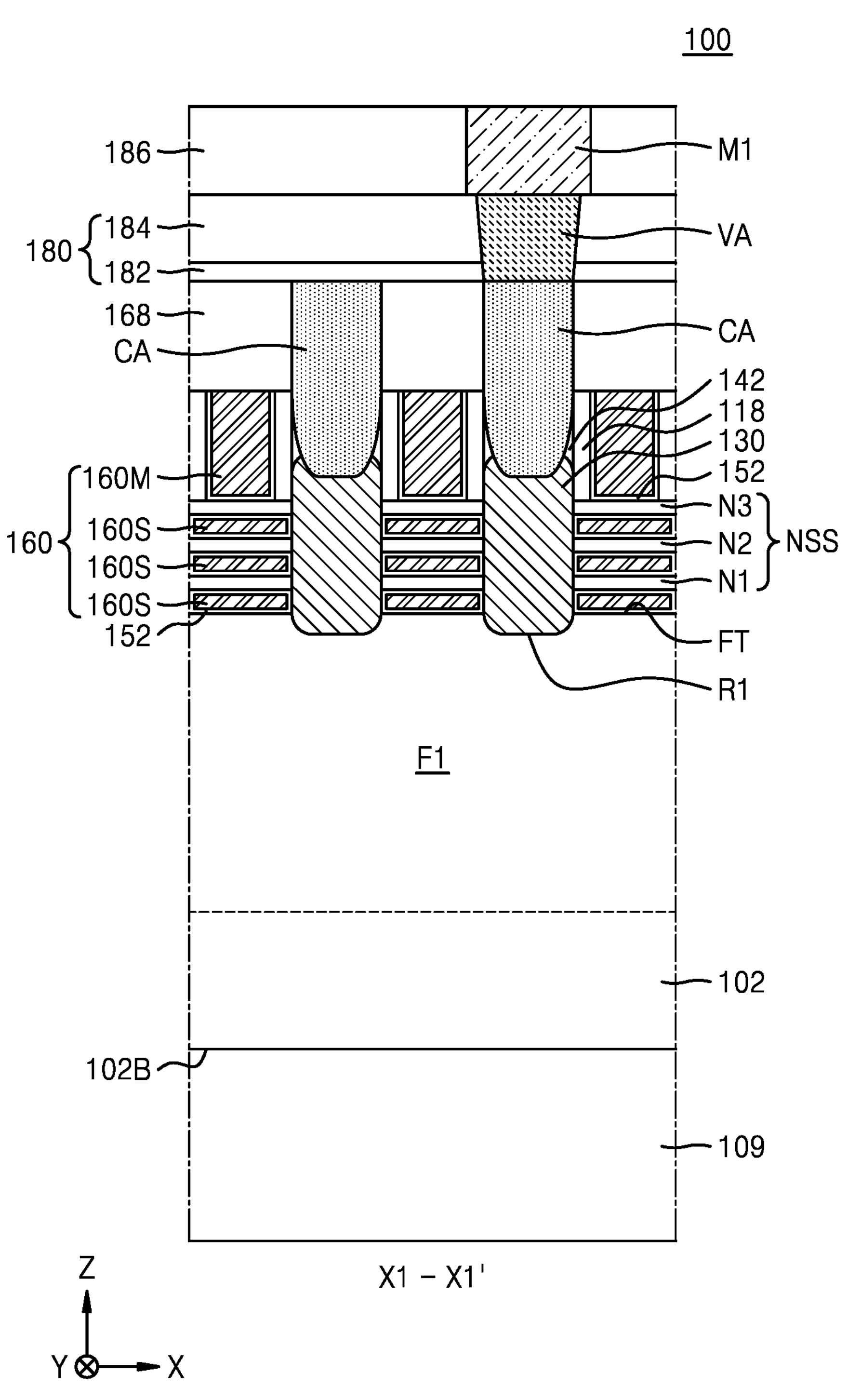
FIG. 3A is a cross-sectional view of the integrated circuit device, taken along a line X1-X1' of FIG. 2.
Figure 3B:
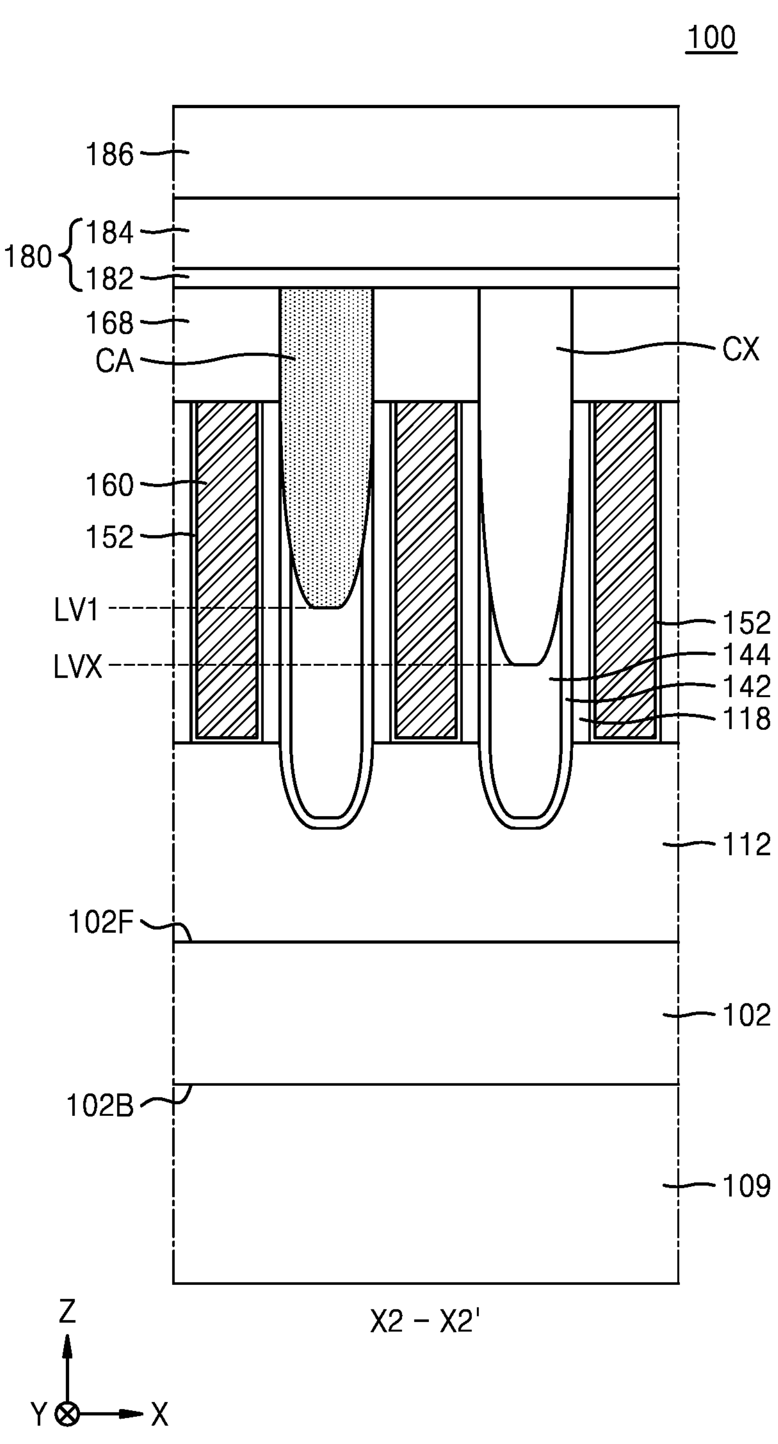
FIG. 3B is a cross-sectional view of the integrated circuit device, taken along a line X2-X2' of FIG. 2.
Figure 3C:
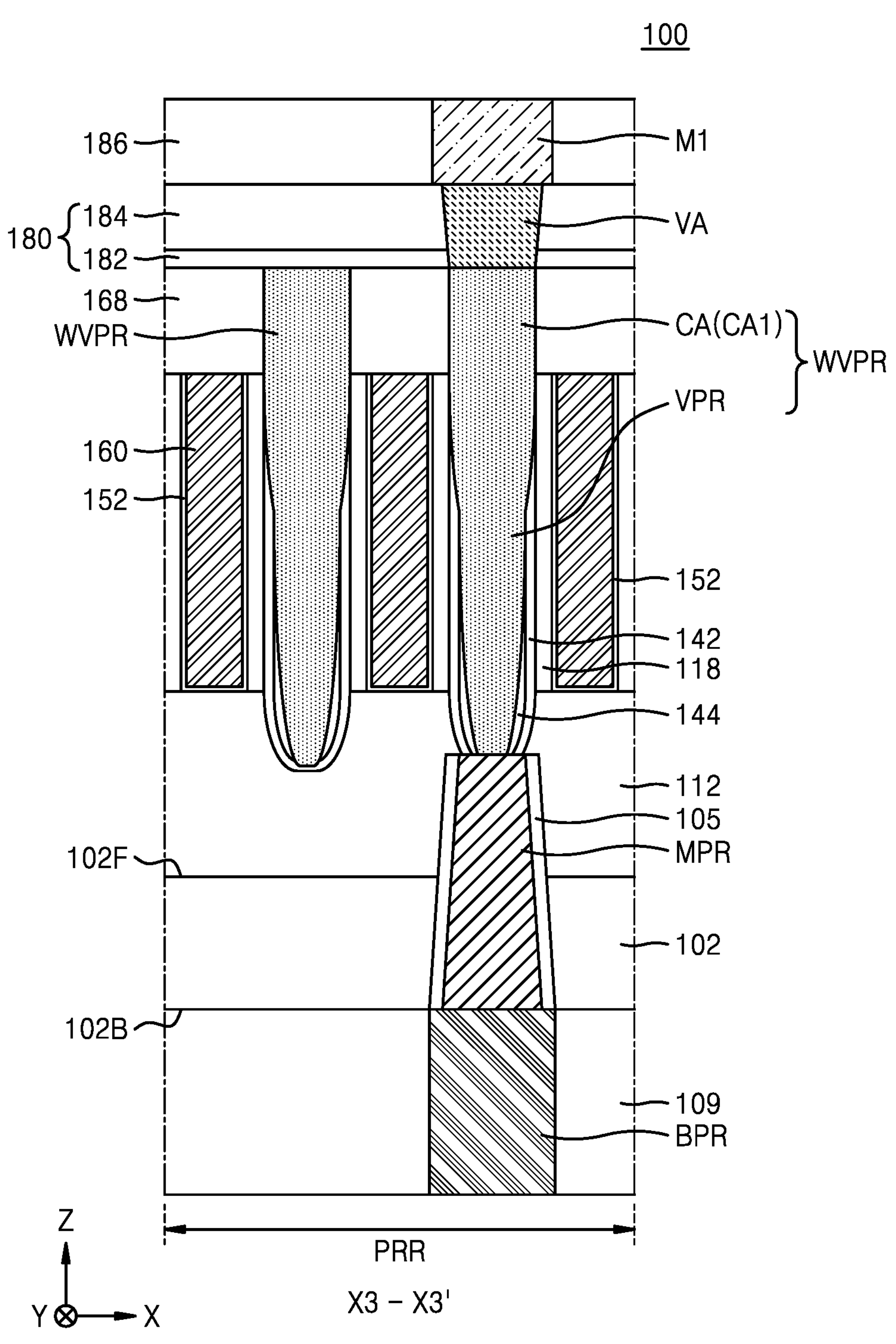
FIG. 3C is a cross-sectional view of the integrated circuit device, taken along a line X3-X3' of FIG. 2.
Figure 3D:
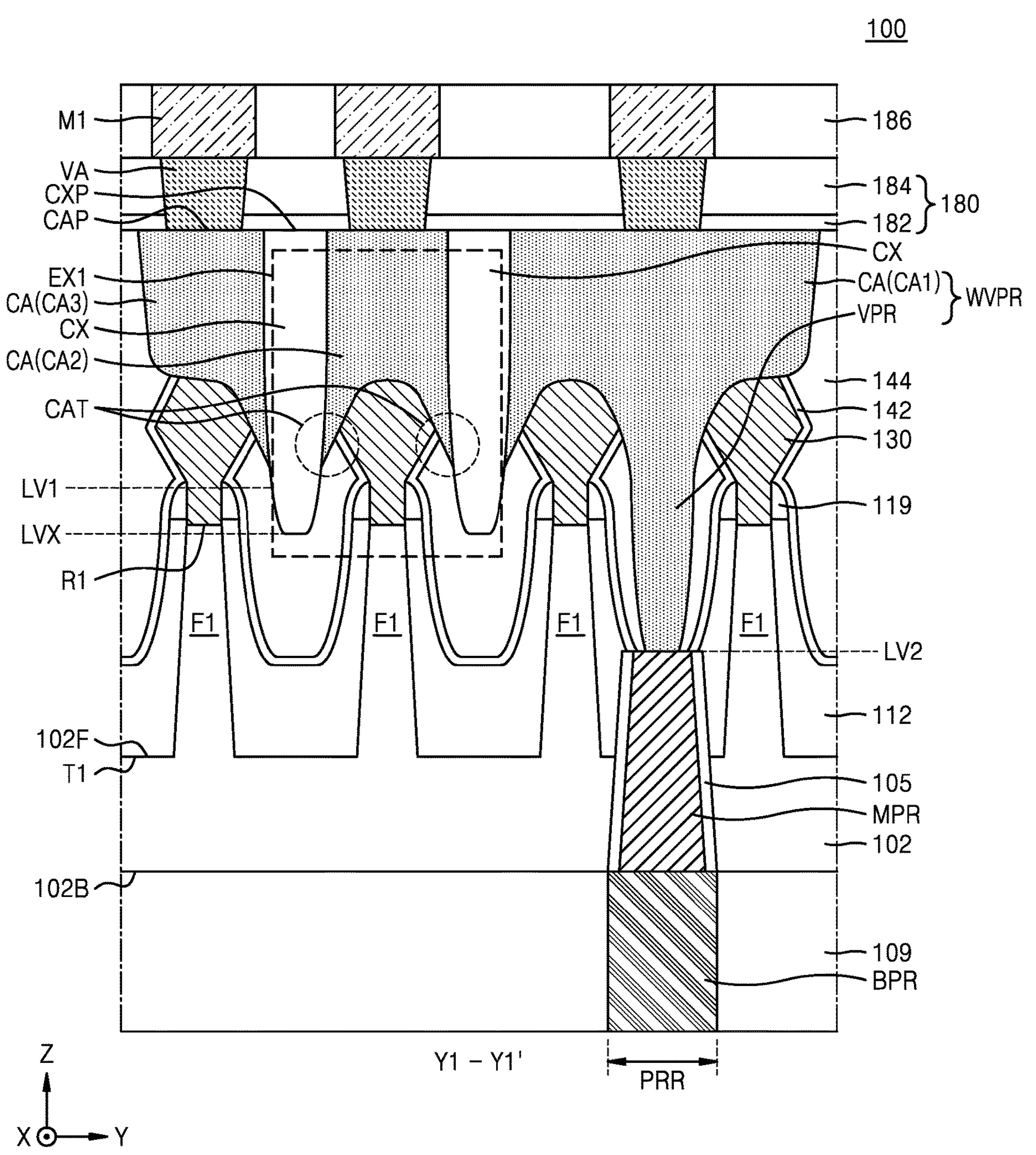
FIG. 3D is a cross-sectional view of the integrated circuit device, taken along a line Y1-Y1' of FIG. 2.
Figure 3E:
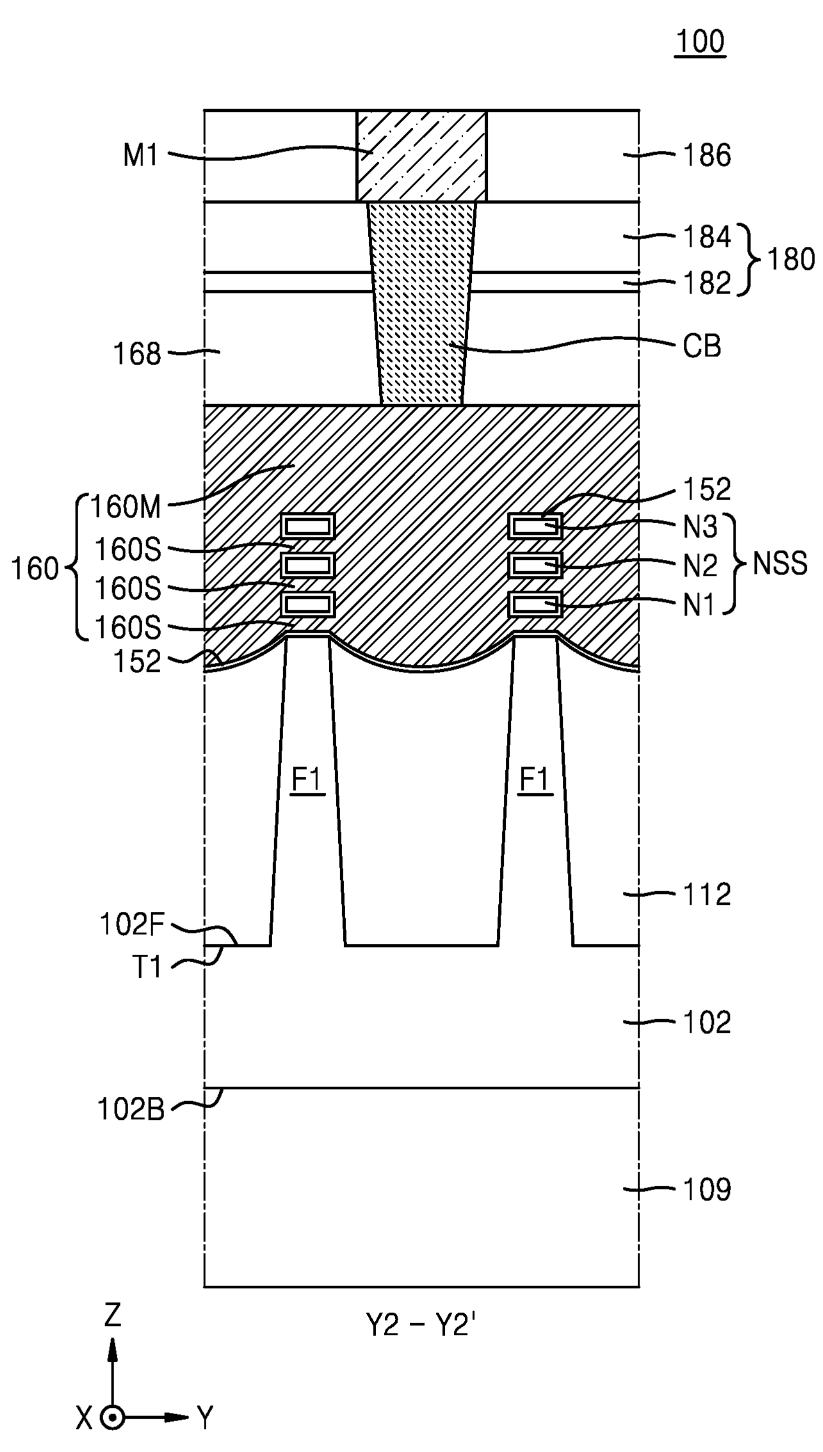
FIG. 3E is a cross-sectional view of the integrated circuit device, taken along a line Y2-Y2' of FIG. 2.
Figure 3F:
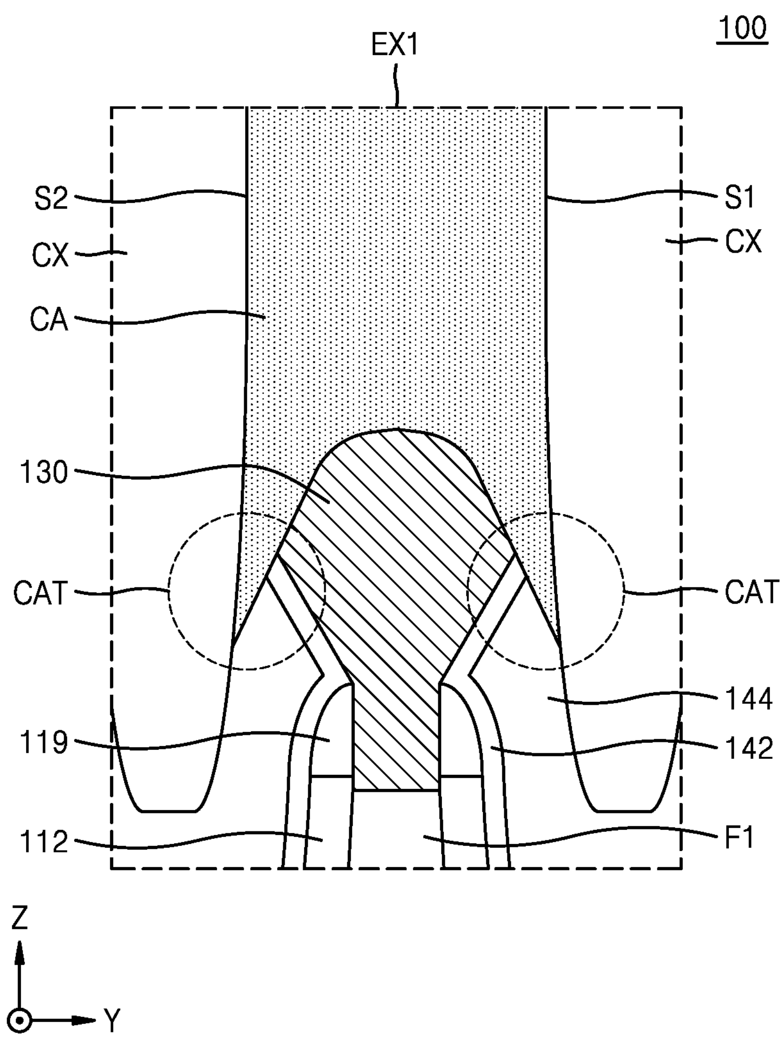
FIG. 3F is an enlarged cross-sectional view of a region EX1 of FIG. 3D.

FIG. 2 is a planar layout diagram illustrating an integrated circuit device 100 according to some embodiments. FIG. 3A is a cross-sectional view of the integrated circuit device 100, taken along a line X1-X1' of FIG. 2. FIG. 3B is a cross-sectional view of the integrated circuit device 100, taken along a line X2-X2' of FIG. 2. FIG. 3C is a cross-sectional view of the integrated circuit device 100, taken along a line X3-X3' of FIG. 2. FIG. 3D is a cross-sectional view of the integrated circuit device 100, taken along a line Y1-Y1' of FIG. 2. FIG. 3E is a cross-sectional view of the integrated circuit device 100, taken along a line Y2-Y2' of FIG. 2. FIG. 3F is an enlarged cross-sectional view of a region EX1 of FIG. 3D. The integrated circuit device 100 including a field-effect transistor, which has a gate-all-around structure including a nanowire or nanosheet-shaped active region and a gate surrounding the active region, is described with reference to FIGS. 2 and 3A to 3F. The integrated circuit device 100 may constitute a portion of the plurality of logic cells LC shown in FIG. 1.

Referring to FIGS. 2 and 3A to 3F, the integrated circuit device 100 may include a substrate 102, which has a frontside surface 102F and a backside surface 102B, and a plurality of fin-type active regions F1 protruding from the substrate 102 to define a plurality of trench regions T1 on the substrate 102 from the frontside surface 102F of the substrate 102. The plurality of fin-type active regions F1 may be arranged on the substrate 102 to extend lengthwise in the first horizontal direction (X direction) and to be apart from each other in the second horizontal direction (Y direction) that is perpendicular to the first horizontal direction (X direction).

The substrate 102 and the plurality of fin-type active regions F1 may each include a semiconductor, such as Si or Ge, or a compound semiconductor, such as SiGe, SiC, GaAs, InAs, InGaAs, or InP. As used herein, each of the terms "SiGe", "SiC", "GaAs", "InAs", "InGaAs", and "InP" refers to a material including elements contained in each term and is not a chemical formula representing a stoichiometric relationship. The substrate 102 may include a conductive region, for example, an impurity-doped well or an impurity-doped structure.

A plurality of logic cells LC may be arranged on the substrate 102. The substrate 102 may include a power rail region PRR extending lengthwise in the first horizontal direction (X direction) in a region adjacent to a logic cell LC. The power rail region PRR may extend lengthwise in the first horizontal direction (X direction) to be apart from the plurality of fin-type active regions F1 in the second horizontal direction (Y direction). At least one power rail wiring line MPR may be arranged in the power rail region PRR to pass through the substrate 102 in the vertical direction (Z direction) from the backside surface 102B of the substrate 102. In some embodiments, the at least one power rail wiring line MPR may constitute a ground line VSS shown in FIG. 1. The power rail wiring line MPR may include a metal wiring layer and a conductive barrier layer surrounding the metal wiring layer. The metal wiring layer may include Ru, Co, W, or a combination thereof. The conductive barrier layer may include Ti, TiN, Ta, TaN, or a combination thereof.

As shown in FIG. 3D, an insulating liner 105 may be arranged between a sidewall of the power rail wiring line MPR and the substrate 102. The insulating liner 105 may include silicon oxide (SiO), silicon nitride (SiN), silicon oxynitride (SiON), silicon oxycarbonitride (SiOCN), silicon oxycarbide (SiOC), or a combination thereof. As used herein, each of the terms "SiO", "SiN", "SiON", "SiOCN", and "SiOC" refers to a material including elements contained in each term and is not a chemical formula representing a stoichiometric relationship. In some embodiments, silicon oxide (SiO) may include $SiO_2$. Silicon nitride (SiN) may include $Si_3N_4$.

A device isolation film 112 may be arranged in the plurality of trench regions T1 on the substrate 102. The device isolation film 112 may be arranged in the plurality of trench regions T1 to cover a portion of a sidewall of each of the plurality of fin-type active regions F1. The device isolation film 112 may include, but is not limited to, a silicon oxide film.

As shown in FIGS. 2, 3A, 3B, 3C, and 3E, a plurality of gate lines 160 may be arranged over the plurality of fin-type active regions F1 and the device isolation film 112. Each of the plurality of gate lines 160 may extend lengthwise in the second horizontal direction (Y direction) to intersect with the plurality of fin-type active regions F1. In intersection areas between the plurality of fin-type active regions F1 and the plurality of gate lines 160, a plurality of nanosheet stacks NSS may be arranged over a fin top surface FT of each of the plurality of fin-type active regions F1. Each of the plurality of nanosheet stacks NSS may include at least one nanosheet arranged apart from the fin top surface FT of a fin-type active region F1 in the vertical direction (Z direction) to face the fin top surface FT of the fin-type active region F1. As used herein, the term "nanosheet" refers to a conductive structure having a cross-section that is substantially perpendicular to a current-flowing direction. The nanosheet should be understood as including a nanowire.

As shown in FIGS. 3A and 3E, each of the plurality of nanosheet stacks NSS may include a first nanosheet N1, a second nanosheet N2, and a third nanosheet N3, which overlap each other in the vertical direction (Z direction), over the fin-type active region F1. The first nanosheet N1, the second nanosheet N2, and the third nanosheet N3 may respectively have different vertical distances (Z-direction distances) from the fin top surface FT of the fin-type active region F1. Each of the plurality of gate lines 160 may surround the first nanosheet N1, the second nanosheet N2, and the third nanosheet N3, which overlap each other in the vertical direction (Z direction).

FIG. 2 illustrates an example in which the planar shape of a nanosheet stack NSS is approximately quadrangular, but aspects of the inventive concept are not limited thereto. The nanosheet stack NSS may have various planar shapes depending on respective planar shapes of the fin-type active region F1 and a gate line 160. In the present example, it is illustrated that the plurality of nanosheet stacks NSS and the plurality of gate lines 160 are arranged over one fin-type active region F1 and the plurality of nanosheet stacks NSS are arranged in a line in the first horizontal direction (X direction) over the one fin-type active region F1. However, the respective numbers of nanosheet stacks NSS and gate lines 160, which are arranged over one fin-type active region F1, are not particularly limited.

Each of the first nanosheet N1, the second nanosheet N2, and the third nanosheet N3 of the nanosheet stack NSS may function as a channel region. In some embodiments, each of the first nanosheet N1, the second nanosheet N2, and the third nanosheet N3 may have, but is not limited to, a thickness selected from a range of about 4 nm to about 6 nm. Here, the thickness of each of the first nanosheet N1, the second nanosheet N2, and the third nanosheet N3 refers to a size (e.g., height) in the vertical direction (Z direction). In some embodiments, the first nanosheet N1, the second nanosheet N2, and the third nanosheet N3 may have substantially the same thickness in the vertical direction (Z direction). In some embodiments, at least some of the first nanosheet N1, the second nanosheet N2, and the third nanosheet N3 may have different thicknesses from each other in the vertical direction (Z direction). In some embodiments, each of the first nanosheet N1, the second nanosheet N2, and the third nanosheet N3 of the nanosheet stack NSS may include an Si layer, an SiGe layer, or a combination thereof.

As shown in FIG. 3A, the first nanosheet N1, the second nanosheet N2, and the third nanosheet N3, which are included in one nanosheet stack NSS, may have equal or similar sizes to each other in the first horizontal direction (X direction). In some embodiments, unlike the example shown in FIG. 3A, at least some of the first nanosheet N1, the second nanosheet N2, and the third nanosheet N3, which are included in one nanosheet stack NSS, may have different sizes from each other in the first horizontal direction (X direction). In the present example, it is illustrated that each of the plurality of nanosheet stacks NSS include three nanosheets, but aspects of the inventive concept are not limited thereto. For example, the nanosheet stack NSS may include at least one nanosheet, and the number of nanosheets constituting the nanosheet stack NSS is not particularly limited.

As shown in FIGS. 3A and 3E, each of the plurality of gate lines 160 may include a main gate portion 160M and a plurality of sub-gate portions 160S. The main gate portion 160M may extend lengthwise in the second horizontal direction (Y direction) to cover an upper surface of the nanosheet stack NSS. The plurality of sub-gate portions 160S may be integrally connected to the main gate portion 160M and may be respectively arranged one-by-one between the first nanosheet N1, the second nanosheet N2, and the third nanosheet N3 and between the first nanosheet N1 and the fin-type active region F1. In the vertical direction (Z direction), the thickness of each of the plurality of sub-gate portions 160S may be less than the thickness of the main gate portion 160M.

As shown in FIGS. 3A and 3D, a plurality of recesses R1 may be formed in the fin-type active region F1. A vertical level of the lowermost surface of each of the plurality of recesses R1 may be lower than a vertical level of the fin top surface FT of the fin-type active region F1. As used herein, the term "vertical level" refers to a distance in the vertical direction (Z direction or −Z direction) from the frontside surface 102F of the substrate 102. A plurality of source/drain regions 130 may be respectively arranged in the plurality of recesses R1. Each of the plurality of source/drain regions 130 may be arranged adjacent to at least one gate line 160 selected from the plurality of gate lines 160. Each of the plurality of source/drain regions 130 may have surfaces facing the first nanosheet N1, the second nanosheet N2, and the third nanosheet N3, which are included in the nanosheet stack NSS adjacent thereto. Each of the plurality of source/drain regions 130 may be in contact with the first nanosheet N1, the second nanosheet N2, and the third nanosheet N3, which are included in the nanosheet stack NSS adjacent thereto.

Each of the plurality of source/drain regions 130 may include an epitaxially grown semiconductor layer. In some embodiments, each of the plurality of source/drain regions 130 may include an epitaxially grown Si layer, an epitaxially grown SiC layer, an embedded SiGe structure including a plurality of SiGe layers that are epitaxially grown, or the like.

In some embodiments, when a source/drain region 130 constitutes an NMOS transistor, the source/drain region 130 may include an SiC layer doped with an n-type dopant. The n-type dopant may be selected from phosphorus (P), arsenic (As), and antimony (Sb).

In some embodiments, when the source/drain region 130 constitutes a PMOS transistor, the source/drain region 130 may include an SiGe layer doped with a p-type dopant. The p-type dopant may be selected from boron (B) and gallium (Ga). When the source/drain region 130 constitutes a PMOS transistor, the source/drain region 130 may include a blocking layer, which forms the outermost surface of the source/drain region 130, and a main body layer surrounded by the blocking layer. The blocking layer and the main body layer may be integrally connected with each other. The blocking layer and the main body layer may include SiGe layers having different Ge contents from each other, and the Ge content in the blocking layer may be less than the Ge content in the main body layer. In some embodiments, when the source/drain region 130 constitutes a PMOS transistor, the source/drain region 130 may include a blocking layer, a buffer layer, and a main body layer, which are sequentially arranged in the stated order in the vertical direction (Z direction) from a bottom surface of a recess R1 and continuously form one body. The blocking layer, the buffer layer, and the main body layer may each include an $Si_{1-x}Ge_x$ layer (where x>0) doped with a p-type dopant and may have different Ge contents from each other. In some embodiments, each of the blocking layer, the buffer layer, and the main body layer may include an $Si_{1-x}Ge$, layer (where x>0) doped with a p-type dopant, and the Ge content in the buffer layer may be greater than the Ge content in the blocking layer and less than the Ge content in the main body layer. For example, each of the blocking layer, the buffer layer, and the main body layer may include an $Si_{1-x}Ge_x$ layer (where x>0) doped with element B, and the blocking layer, the buffer layer, and the main body layer may respectively have increasing Ge contents with the increasing distance from a backside contact structure DBC. For example, the blocking layer may include an $Si_{1-x}Ge_x$ layer (where $0.05 \leq x \leq 0.07$) doped with element B, the buffer layer may include an $Si_{1-x}Ge_x$ layer (where $0.40 \leq x \leq 0.45$) doped with element B, and the main body layer may include an $Si_{1-x}Ge_x$ layer (where $0.45 \leq x \leq 0.70$) doped with element B. That is, the Ge content in the blocking layer may be about 5 at % to about 7 at %, the Ge content in the buffer layer may be about 40 at % to about 45 at %, and the Ge content in the main body layer may be greater than about 45 at % and less than or equal to about 60 at %, but aspects of the inventive concept are not limited thereto.

Each of the plurality of gate lines 160 may include a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC. However, a material constituting each of the plurality of gate lines 160 is not limited to the examples set forth above.

A gate dielectric film 152 may be arranged between the nanosheet stack NSS and the gate line 160. In some embodiments, the gate dielectric film 152 may include a stack structure of an interface dielectric film and a high-K film. The interface dielectric film may include a low-K material film having a dielectric constant of about 9 or less, for example, a silicon oxide film, a silicon oxynitride film, or a combination thereof. In some embodiments, the interface dielectric film may be omitted. The high-K film may include a material having a dielectric constant that is greater than that of a silicon oxide film. For example, the high-K film may have a dielectric constant of about 10 to about 25. The high-K film may include, but is not limited to, hafnium oxide.

Either sidewall of each of the plurality of sub-gate portions 160S, which are included in each of the plurality of gate lines 160, may be apart from the source/drain region 130 with the gate dielectric film 152 therebetween. The gate dielectric film 152 may be arranged between a sub-gate portion 160S of the gate line 160 and each of the first nanosheet N1, the second nanosheet N2, and the third nanosheet N3 and between the sub-gate portion 160S of the gate line 160 and the source/drain region 130.

The plurality of nanosheet stacks NSS may be respectively arranged over fin top surfaces FT of the plurality of fin-type active regions F1 in the intersection areas between the plurality of fin-type active regions F1 and the plurality of gate lines 160 and may each be apart from the fin-type active region F1 to face the fin top surface FT of the fin-type active region F1. A plurality of nanosheet transistors may be respectively formed on the substrate 102 in the intersection areas between the plurality of fin-type active regions F1 and the plurality of gate lines 160. Each of the plurality of nanosheet transistors may include an NMOS transistor, a PMOS transistor, or a combination thereof.

As shown in FIGS. 3A to 3C, both sidewalls of each of the gate line 160 may be covered by an outer insulating spacer 118. The outer insulating spacer 118 may be arranged on an upper surface of each of the plurality of nanosheet stacks NSS to cover both sidewalls of the main gate portion 160M. The outer insulating spacer 118 may be apart from the gate line 160 with the gate dielectric film 152 therebetween. An upper surface of each of the gate line 160, the gate dielectric film 152, and the outer insulating spacer 118 may be covered by the capping insulating pattern 168. Each capping insulating pattern 168 may include a silicon nitride film.

As shown in FIG. 3D, a plurality of recess-side insulating spacers 119 may be arranged on the device isolation film 112. At least a portion of each of the plurality of recess-side insulating spacers 119 may cover a sidewall of the source/drain region 130. In some embodiments, each of the plurality of recess-side insulating spacers 119 may be integrally connected with the outer insulating spacer 118 adjacent thereto. A plurality of outer insulating spacers 118 and the plurality of recess-side insulating spacers 119 may each include silicon nitride, silicon oxide, SiCN, SiBN, SiON, SiOCN, SiBCN, SiOC, or a combination thereof. As used herein, each of the terms "SiCN", "SiBN", "SiON", "SiOCN", "SiBCN", and "SiOC" refers to a material including elements contained in each term and is not a chemical formula representing a stoichiometric relationship.

The plurality of source/drain regions 130, the device isolation film 112, the plurality of outer insulating spacers 118, and the plurality of recess-side insulating spacers 119 on or over the substrate 102 may be covered by an insulating liner 142. An inter-gate dielectric 144 may be arranged on the insulating liner 142. In some embodiments, the insulating liner 142 may include, but is not limited to, silicon nitride, SiCN, SiBN, SION, SiOCN, SiBCN, or a combination thereof. The inter-gate dielectric 144 may include, but is not limited to, a silicon oxide film. Herein, the insulating liner 142 and the inter-gate dielectric 144 may be collectively referred to as an insulating structure.

As shown in FIGS. 3A and 3B, a plurality of source/drain contacts CA may be respectively arranged on the plurality of source/drain regions 130. Each of the plurality of source/drain contacts CA may be configured to be electrically connected to at least one source/drain region 130 selected from the plurality of source/drain regions 130. For example, one source/drain contact CA may be connected to one source/drain region 130 or two source/drain regions 130, but aspects of the inventive concept are not limited thereto. The plurality of source/drain contacts CA may be arranged in a line in the second horizontal direction (Y direction) between a pair of gate lines 160 adjacent to each other. The plurality of source/drain contacts CA, which are arranged between two adjacent gate lines 160 from among the plurality of gate lines 160, may be arranged in a line in the second horizontal direction (Y direction) to be apart from each other in the second horizontal direction (Y direction). The plurality of source/drain contacts CA may be arranged in a plurality of lines in the second horizontal direction (Y direction) and may be arranged in a plurality of lines in the first horizontal direction (X direction).

As shown in FIG. 2, at least one contact isolation insulating film CX may be arranged between the plurality of gate lines 160. The contact isolation insulating film CX may be arranged between two source/drain contacts CA adjacent to each other in the second horizontal direction (Y direction) to electrically isolate the two source/drain contacts CA from each other. A plurality of contact isolation insulating films CX, which are arranged between two adjacent gate lines 160 from among the plurality of gate lines 160, may each be arranged one-by-one between a pair of source/drain contacts CA adjacent to each other in the second horizontal direction (Y direction) from among the plurality of source/drain contacts CA. In the integrated circuit device 100, each of the plurality of contact isolation insulating films CX may be arranged at a position away from the power rail region PRR.

As shown in FIGS. 3C and 3D, the integrated circuit device 100 may include a via power rail VPR passing through the insulating structure, which includes the insulating liner 142 and the inter-gate dielectric 144, in the vertical direction. The via power rail VPR may be integrally connected with one source/drain contact CA selected from the plurality of source/drain contacts CA. Herein, the source/drain contact CA integrally connected with the via power rail VPR, from among the plurality of source/drain contacts CA, may be referred to as a first source/drain contact CA1 (see FIG. 3D).

As shown in FIGS. 3B and 3D, a vertical level LVX of a lower surface of each of the plurality of contact isolation insulating films CX may be closer to the substrate 102 than a vertical level LV1 of a lower surface of each of the plurality of source/drain contacts CA. In particular, as shown in FIG. 3B, the vertical level LVX of the lowermost surface of each of the plurality of contact isolation insulating films CX may be closer to the substrate 102 than the vertical level LV1 of the lowermost surface of each of the plurality of source/drain contacts CA. In addition, as shown in FIG. 3D, the vertical level LVX of the lowermost surface of each of the plurality of contact isolation insulating films CX may be farther from the substrate 102 than a vertical level LV2 of a lower surface of the via power rail VPR. The uppermost surface CXP of each of the plurality of contact isolation insulating films CX may be coplanar with an upper surface CAP of each of the plurality of source/drain contacts CA. The lower surface of the via power rail VPR, which is at the vertical level LV2, may be connected to the power rail wiring line MPR. In the present example, it is illustrated that the via power rail VPR and the power rail wiring line MPR are in contact with each other at the vertical level LV2 near a portion of the insulating liner 142, which is closest to the substrate 102, as shown in FIG. 3D. However, aspects of the inventive concept are not limited to the example shown in FIG. 3D. For example, the via power rail VPR and the power rail wiring line MPR may be in contact with each other at a vertical level near an interface between the frontside surface 102F of the substrate 102 and the device isolation film 112.

In some embodiments, the source/drain region 130 and the source/drain contact CA, which are connected to each other, may be in contact with each other. In some embodiments, a metal silicide film (not shown) may be arranged between the source/drain region 130 and the source/drain contact CA, which are connected to each other. The metal silicide film may include a metal including Ti, W, Ru, Nb, Mo, Hf, Ni, Co, Pt, Yb, Tb, Dy, Er, or Pd. For example, the metal silicide film may include, but is not limited to, titanium silicide. The metal silicide film may be omitted.

Each of the plurality of source/drain contacts CA may pass through the inter-gate dielectric 144 and the insulating liner 142 in the vertical direction (Z direction) to be connected to the source/drain region 130. Lower surfaces of at least some source/drain contacts CA, which face source/drain regions 130 corresponding thereto, from among the plurality of source/drain contacts CA may be concave toward the source/drain regions 130, respectively, and surfaces of at least some source/drain regions 130, which face source/drain contacts CA corresponding thereto, from among the plurality of source/drain regions 130 may be convex toward the source/drain contacts CA, respectively.

As shown in FIGS. 3A to 3C, each of the plurality of source/drain contacts CA may be apart from, in the first horizontal direction (X direction), the main gate portion 160M of the gate line 160 adjacent thereto with the outer insulating spacer 118 therebetween.

As shown in FIGS. 3D and 3F, at least one source/drain contact CA from among the plurality of source/drain contacts CA may include a contact tail CAT. The contact tail CAT of the source/drain contact CA may be arranged between one source/drain region 130 selected from the plurality of source/drain regions 130 and one contact isolation insulating film CX selected from the plurality of contact isolation insulating films CX to extend in the vertical direction (Z direction) toward the substrate 102 along the selected one contact isolation insulating film CX. The contact tail CAT may have a wedge shape that is acuminate toward the substrate 102. The contact tail CAT may also be referred to herein as a "first portion" of the source/drain contact CA.

In some embodiments, the plurality of source/drain contacts CA may include, for example, a source/drain contact CA including two contact tails CAT (e.g., two first portions), which are apart from each other in the second horizontal direction (Y direction) with one source/drain region 130 therebetween, such as the source/drain contact CA in the region EX1 in FIG. 3D. In some embodiments, the plurality of source/drain contacts CA may include, for example, a source/drain contact CA including one contact tail CAT at only one side out of both sides thereof in the second horizontal direction (Y direction), such as the source/drain contact CA at the left outside or right outside of the region EX in FIG. 3D.

The plurality of source/drain contacts CA may include two source/drain contacts CA (for example, the first source/drain contact CA1 and the second source/drain contact CA2 in FIG. 3D, or the second source/drain contact CA2 and the third source/drain contact CA3 in FIG. 3D), which are in contact with one contact isolation insulating film CX selected from the plurality of contact isolation insulating films CX. As shown in FIG. 3D, in a cross-sectional view taken in the second horizontal direction (Y direction), two source/drain contacts CA, which are in contact with one contact isolation insulating film CX, may respectively have different cross-sectional shapes and different cross-sectional areas. In an example, in a cross-sectional view taken in the second horizontal direction (Y direction), the first source/drain contact CA1 and the second source/drain contact CA2 may respectively have different cross-sectional shapes and different cross-sectional areas. In another example, in a cross-sectional view taken in the second horizontal direction (Y direction), the second source/drain contact CA2 and the third source/drain contact CA3 may respectively have different cross-sectional shapes and different cross-sectional areas.

As shown in FIG. 3D, the first source/drain contact CA1 integrally connected with the via power rail VPR from among the plurality of source/drain contacts CA, together with the via power rail VPR, may constitute a via power rail structure WVPR. The via power rail structure WVPR may have a T-shaped cross-sectional structure in a cross-sectional view taken in the second horizontal direction (Y direction). The first source/drain contact CA1 integrally connected with the via power rail VPR from among the plurality of source/drain contacts CA may be in contact with two source/drain regions 130 selected from the plurality of source/drain regions 130. The two source/drain regions 130 may be apart from each other with the via power rail VPR therebetween. A portion of the via power rail VPR and a portion of the contact Isolation insulating film CX, which is in contact with the first source/drain contact CA1 integrally connected with the via power rail VPR, may be apart from each other in the second horizontal direction (Y direction) with one source/drain region 130 therebetween and may face each other with the one source/drain region 130 therebetween.

As shown in FIGS. 3D and 3F, the plurality of source/drain contacts CA may include the second source/drain contact CA2, which is arranged between two contact isolation insulating films CX adjacent to each other in the second horizontal direction (Y direction) from among the plurality of contact isolation insulating films CX, and which is in contact with each of the two contact isolation insulating films CX. The second source/drain contact CA2 may include a first side portion S1, which is in contact with one contact isolation insulating film CX out of the two contact isolation insulating films CX, and a second side portion S2 that is in contact with the other contact isolation insulating film CX. Each of the first side portion S1 and the second side portion S2 of the second source/drain contact CA2 may include a contact tail CAT arranged between the source/drain region 130 and the contact isolation insulating film CX to extend in the vertical direction (Z direction) toward the substrate 102 along a surface of the contact isolation insulating film CX.

In the integrated circuit device 100, no other insulating film around the source/drain region 130 may be arranged between the source/drain contact CA and the contact isolation insulating film CX. For example, none of the insulating liner 142 and the inter-gate dielectric 144 may include a portion between the source/drain contact CA and the contact isolation insulating film CX.

As shown in FIG. 3D, a pair of source/drain contacts CA adjacent to each other in the second horizontal direction (Y direction) from among the plurality of source/drain contacts CA may be respectively in contact with both sidewalls of one contact isolation insulating film CX arranged therebetween, and the pair of source/drain contacts CA adjacent to each other may have asymmetrical structures to each other about the one contact isolation insulating film CX. For example, as shown in FIG. 3D, in a cross-sectional view taken in second horizontal direction (Y direction), the first source/drain contact CA1 and the second source/drain contact CA2, which are in contact with one contact isolation insulating film CX, may have asymmetrical structures to each other about the contact isolation insulating film CX therebetween. In addition, the second source/drain contact CA2 and the third source/drain contact CA3, which are in contact with one contact isolation insulating film CX, may have asymmetrical structures to each other about the contact isolation insulating film CX therebetween. The via power rail structure WVPR including the first source/drain contact CA1 and the via power rail VPR, which are integrally coupled with each other, may have an approximately T-shaped cross-sectional structure, in a cross-sectional view taken in second horizontal direction (Y direction).

In some embodiments, the plurality of source/drain contacts CA and the via power rail structure WVPR, which includes the first source/drain contact CA1 and the via power rail VPR integrally coupled with each other, may each include only a metal plug including a single metal. In some embodiments, each of the plurality of source/drain contacts CA may include a metal plug and a conductive barrier film surrounding the metal plug. The metal plug may include or may be formed of, but is not limited to, molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. The conductive barrier film may include or may be formed of a metal or a conductive metal nitride. For example, the conductive barrier film may include or may be formed of, but is not limited to, Ti, Ta, W, TiN, TaN, WN, WCN, TiSiN, TaSIN, WSiN, or a combination thereof.

In some embodiments, each of the plurality of contact isolation insulating films CX may include or may be formed of a silicon nitride film, a silicon oxynitride film, a silicon oxycarbide film, or a combination thereof. In some embodiments, a portion of each of the plurality of contact isolation insulating films CX may include an air gap. As used herein, the term "air gap" may refer to a space including the atmosphere or including other gases that may be present during a fabrication process.

As shown in FIGS. 3A to 3E, an upper surface of each of the plurality of source/drain contacts CA, the plurality of capping insulating patterns 168, the plurality of contact isolation insulating films CX, and the inter-gate dielectric 144 may be covered by an upper insulating structure 180. The upper insulating structure 180 may include an etch stop film 182 and an upper insulating film 184, which are stacked in the stated order on each of the plurality of source/drain contacts CA, the plurality of capping insulating patterns 168, the plurality of contact isolation insulating films CX, and the inter-gate dielectric 144. The etch stop film 182 may include or may be formed of silicon carbide (SiC), SiN, nitrogen-doped silicon carbide (SiC:N), SiOC, AlN, AION, AlO, AlOC, or a combination thereof. The upper insulating film 184 may include or may be formed of an oxide film, a nitride film, an ultra-low K (ULK) film having an ultra-low dielectric constant (that is, K) of about 2.2 to about 2.4, or a combination thereof. For example, the upper insulating film 184 may include, but is not limited to, a tetraethylorthosilicate (TEOS) film, a high density plasma (HDP) oxide film, a boro-phospho-silicate glass (BPSG) film, a flowable chemical vapor deposition (FCVD) oxide film, an SiON film, an SiN film, an SiOC film, an SiCOH film, or a combination thereof.

As shown in FIGS. 3A, 3C, and 3D, a plurality of source/drain via contacts VA may be respectively arranged on the plurality of source/drain contacts CA. Each of the plurality of source/drain via contacts VA may pass through the upper insulating structure 180 to contact the source/drain contact CA. Each of the plurality of source/drain regions 130 may be configured to be electrically connected to a source/drain via contact VA through the source/drain contact CA. A lower surface of each of the plurality of source/drain via contacts VA may be in contact with the upper surface of the source/drain contact CA.

As shown in FIG. 3E, a gate contact CB may be arranged on the gate line 160. The gate contact CB may be configured to pass through the upper insulating structure 180 and the capping insulating pattern 168 in the vertical direction (Z direction) and be connected to the gate line 160. A lower surface of the gate contact CB may be in contact with an upper surface of the gate line 160.

Each of the plurality of source/drain via contacts VA and the gate contact CB may include a contact plug including or formed of molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, but a constituent material of the contact plug is not limited to the examples set forth above. In some embodiments, each of the plurality of source/drain via contacts VA and the gate contact CB may further include a conductive barrier pattern surrounding a portion of the contact plug. The conductive barrier pattern, which is included in each of the plurality of source/drain via contacts VA and the gate contact CB, may include or may be formed of a metal or a metal nitride. For example, the conductive barrier pattern may include, but is not limited to, Ti, Ta, W, TiN, TaN, WN, WCN, TiSiN, TaSIN, WSiN, or a combination thereof.

An upper surface of each of the upper insulating structure 180, the plurality of source/drain via contacts VA, and the gate contact CB may be covered by an interlayer dielectric 186. A constituent material of the interlayer dielectric 186 is substantially the same as that of the upper insulating film 184 described above.

A plurality of upper wiring layers M1 may be arranged through the interlayer dielectric 186. Each of the plurality of upper wiring layers M1 may be connected to one source/drain via contact VA, which is selected from the plurality of source/drain via contacts VA thereunder, or to the gate contact CB (see FIG. 3E). Each of the plurality of upper wiring layers M1 may include, but is not limited to, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof.

As shown in FIG. 3D, the plurality of upper wiring layers M1 may include an upper wiring layer M1 connected, through the source/drain via contact VA, to the via power rail structure WVPR, which includes the source/drain contact CA and the via power rail VPR that are integrally connected with each other. A source/drain region 130 connected to the via power rail structure WVPR from among the plurality of source/drain regions 130 may be configured to be connected to the upper wiring layer M1 through the via power rail structure WVPR and the source/drain via contact VA.

A frontside wiring structure (not shown) may be arranged on the plurality of upper wiring layers M1 and the upper insulating film 184. The frontside wiring structure may include a plurality of wiring layers, a plurality of via contacts, and an interlayer dielectric covering the plurality of wiring layers and the plurality of via contacts.

The backside surface 102B of the substrate 102 may be covered by a backside insulating film 109. A backside power rail BPR may pass through the backside insulating film 109 in the vertical direction (Z direction) to be connected to the power rail wiring line MPR. The power rail wiring line MPR may include a metal wiring layer and a conductive barrier layer surrounding the metal wiring layer. The metal wiring layer may include Ru, Co, W, or a combination thereof. The conductive barrier layer may include Ti, TiN, Ta, TaN, or a combination thereof. The backside insulating film 109 may include a silicon oxide film, a silicon nitride film, a silicon carbide film, a low-K film, or a combination thereof. The low-K film may include, but is not limited to, fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof.

The backside power rail BPR and the backside insulating film 109 on the backside surface 102B of the substrate 102 may be covered by a backside wiring structure (not shown). The backside wiring structure may have substantially the same configuration as the frontside wiring structure described above. The backside wiring structure may include wiring layers connected to the backside power rail BPR.

As described with reference to FIGS. 2 and 3A to 3F, the integrated circuit device 100 includes the contact isolation insulating film CX arranged between the plurality of source/drain contacts CA and having a lower surface that is closer to the substrate 102 than a lower surface of each of the plurality of source/drain contacts CA, the plurality of source/drain contacts CA being respectively connected to the plurality of source/drain regions 130. The contact isolation insulating film CX may be formed by first forming a conductive layer for forming the plurality of source/drain contacts CA and then cutting a portion of the conductive layer to form the plurality of source/drain contacts CA and subsequently forming the contact isolation insulating film CX in order to electrically isolate the source/drain contacts CA from each other. Accordingly, there is no concern of generating a defect of electrical connection between a pair of source/drain contacts CA that are apart from each other with the contact isolation insulating film CX therebetween.

As a comparative example, as in general processes, in the case where an isolation insulating film is formed first on source/drain regions and then contact holes for exposing the source/drain regions by etching portions of the isolation insulating film are formed for the formation of source/drain contacts for connection to the source/drain regions, when the vertical-direction size of an isolation region required between each two adjacent source/drain contacts from among the source/drain contacts is increased, a phenomenon (which may be referred to as a "not-open" phenomenon), in which the etching of some of the contact holes is stopped while not exposing targeted source/drain regions, may occur. In addition, a portion of an unintended oxide film (for example, a silicon oxide film used as an inter-gate dielectric) may remain with a relatively low thickness between a source/drain contact and an isolation insulating film adjacent thereto, and as a result, an interface between the source/drain contacts and the isolation insulating film may be in an electrically unstable state. To prevent such an issue, when an etch rate of an oxide film is increased in a process of forming the contact holes for exposing the source/drain regions for the unintended oxide film not to remain between the source/drain contact and the isolation insulating film adjacent thereto, a recess may be excessively formed in a device isolation film under the oxide film, and thus, the reliability of an integrated circuit device may deteriorate. That is, as in general processes, in the case where an isolation insulating film is formed first on source/drain regions and then contact holes for exposing the source/drain regions by etching portions of the isolation insulating film are formed for the formation of source/drain contacts for connection to the source/drain regions, there are issues in that, in an etching process for forming the contact holes, it is difficult to adjust the width and depth of each of the contact holes to target values and procedures for obtaining an intended result are complicated.

Unlike the general technique set forth above, the integrated circuit device 100 according to aspects of the inventive concept employ a structure including a backside contact structure connected to the source/drain region 130, such as the via power rail VPR, whereby, even when the vertical-direction size of an isolation region required between each two adjacent source/drain contacts CA from among the plurality of source/drain contacts CA is increased, the contact isolation insulating film CX capable of stably isolating the plurality of source/drain contacts CA from each other may be arranged between each two adjacent source/drain contacts CA. Therefore, even when the integrated circuit device 100 has a device region reduced in area due to down-scaling, the reliability of the integrated circuit device 100 may improve.

Figure 4:
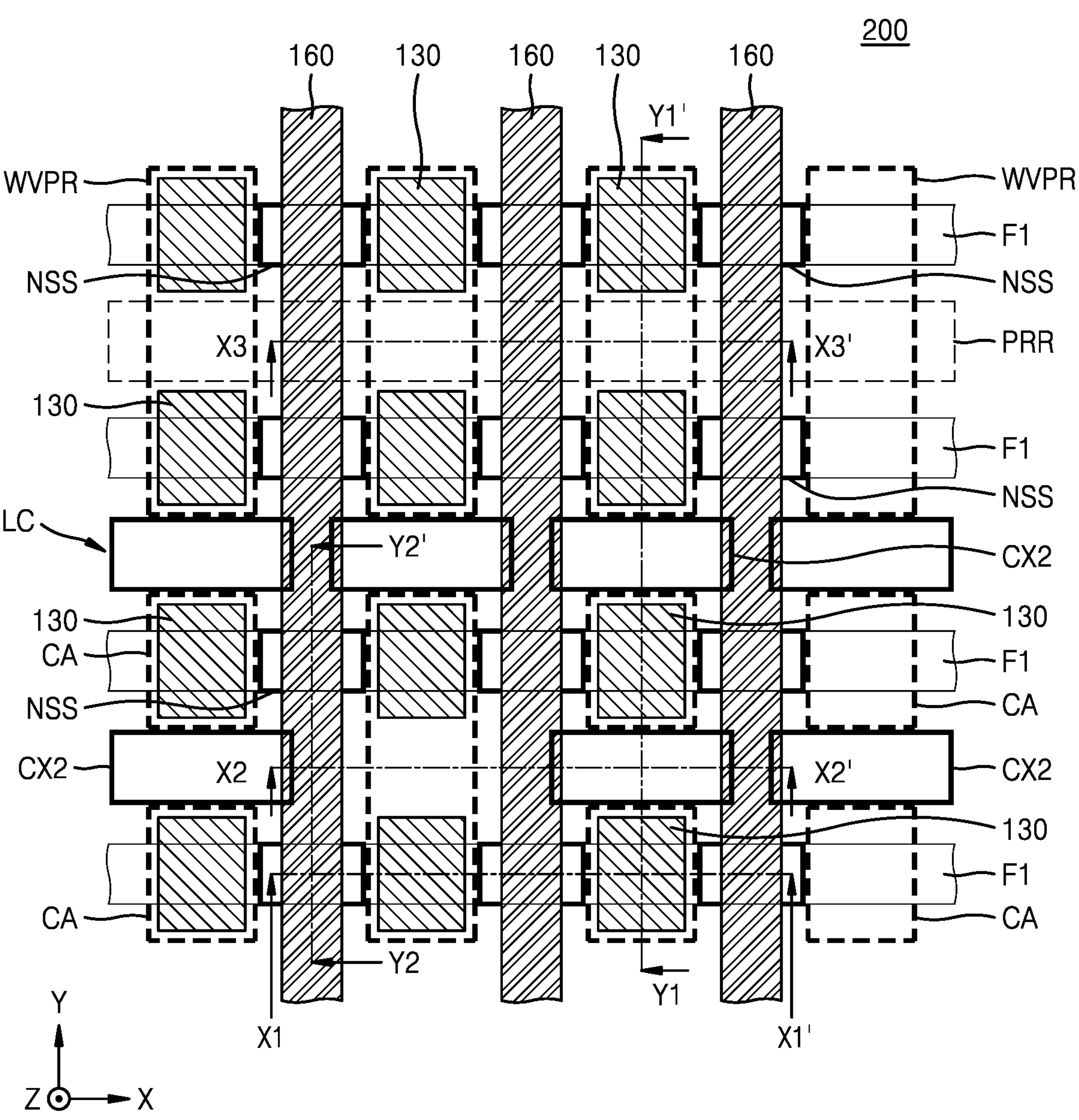
FIG. 4 is a planar layout diagram illustrating an integrated circuit device according to some embodiments.
Figure 5:
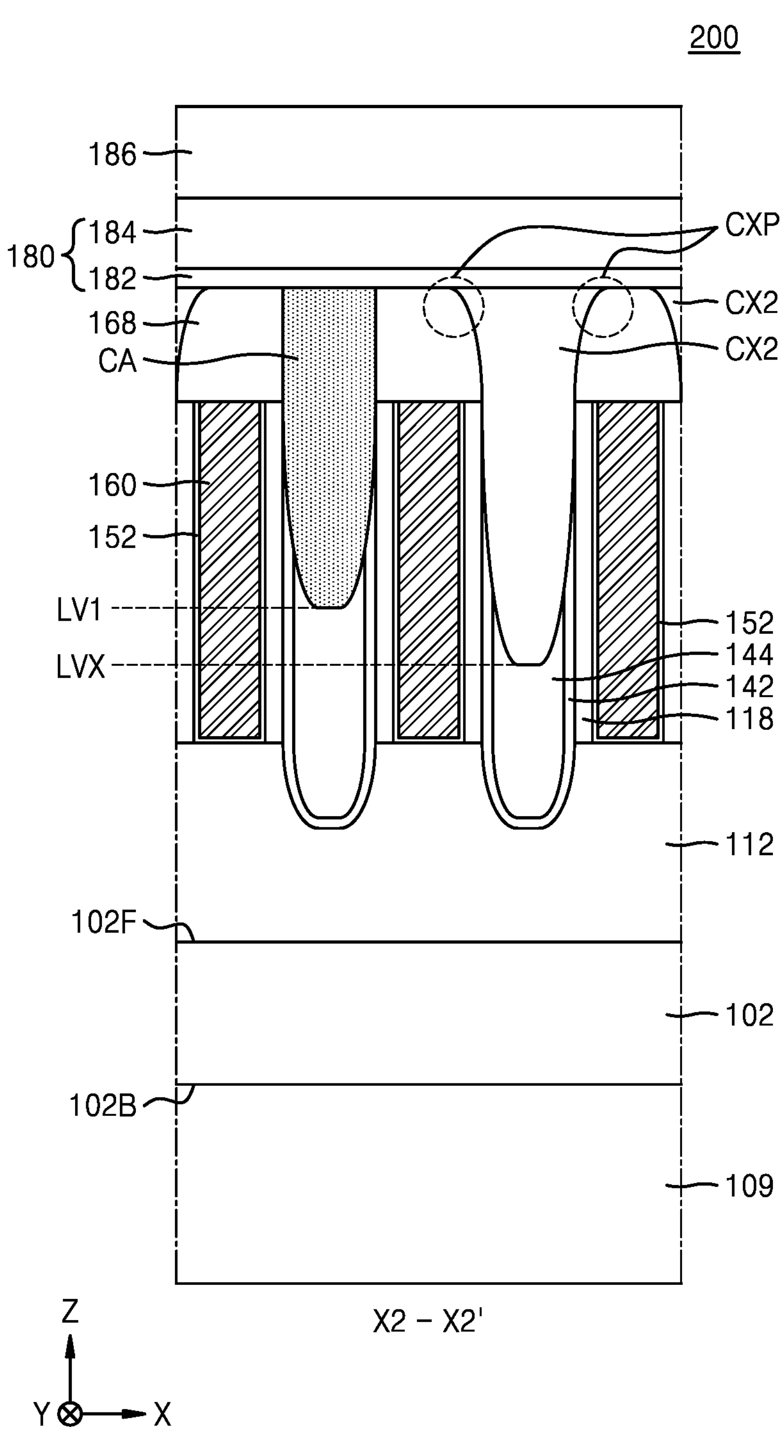
FIG. 5 is a cross-sectional view of the integrated circuit device, taken along a line X2-X2' of FIG. 4.

FIG. 4 is a planar layout diagram illustrating an integrated circuit device 200 according to some embodiments. FIG. 5 is a cross-sectional view of the integrated circuit device 200, taken along a line X2-X2' of FIG. 4. In FIGS. 4 and 5, the same reference numerals as in FIGS. 2 and 3A to 3F respectively denote the same members, and here, repeated descriptions thereof are omitted.

Referring to FIGS. 4 and 5, the integrated circuit device 200 has substantially the same configuration as the integrated circuit device 100 described with reference to FIGS. 2 and 3A to 3F. In particular, respective configurations of a cross-section taken along a line X1-X1' of FIG. 4, a cross-section taken along a line X3-X3' of FIG. 4, a cross-section taken along a line Y1-Y1' of FIG. 4, and a cross-section taken along a line Y2-Y2' of FIG. 4 are the same as described with reference to FIGS. 3A, 3C, 3D, and 3F. However, in the integrated circuit device 200, instead of the plurality of contact isolation insulating films CX, a plurality of contact isolation insulating films CX2 are formed.

As shown in FIG. 5, a contact isolation insulating film CX2 may be arranged between a pair of gate lines 160 adjacent to each other. The contact isolation insulating film CX2 may include portions respectively contacting a pair of capping insulating patterns 168 and the outer insulating spacer 118, the pair of capping insulating patterns 168 respectively covering upper surfaces of the pair of gate lines 160. The portion of the contact isolation insulating film CX2, which is in contact with the pair of capping insulating patterns 168, may have an increasing width in the first horizontal direction (X direction) with the increasing distance from the substrate 102 in the vertical direction (Z direction).

The contact isolation insulating film CX2 may include a portion overlapping at least one of the gate line 160, the capping insulating pattern 168, and the outer insulating spacer 118 in the vertical direction (Z direction). FIGS. 4 and 5 illustrate an example in which the contact isolation insulating film CX2 overlaps, in the vertical direction (Z direction), the pair of gate lines 160 arranged on both sides thereof, the pair of capping insulating patterns 168 respectively covering the pair of gate lines 160, and a pair of outer insulating spacers 118 respectively covering the pair of gate lines 160, but aspects of the inventive concept are not limited thereto. For example, the contact isolation insulating film CX2 may include a portion overlapping, in the vertical direction (Z direction), at least one of the pair of gate lines 160, the pair of capping insulating patterns 168 respectively covering the pair of gate lines 160, and the pair of capping insulating patterns 168 respectively covering the pair of gate lines 160. For example, the contact isolation insulating film CX2 may have a structure of overlapping at least one capping insulating pattern 168 and at least one outer insulating spacer 118, which both are in contact therewith, in the vertical direction (Z direction) and not overlapping the gate line 160 in the vertical direction (Z direction).

Figure 6:
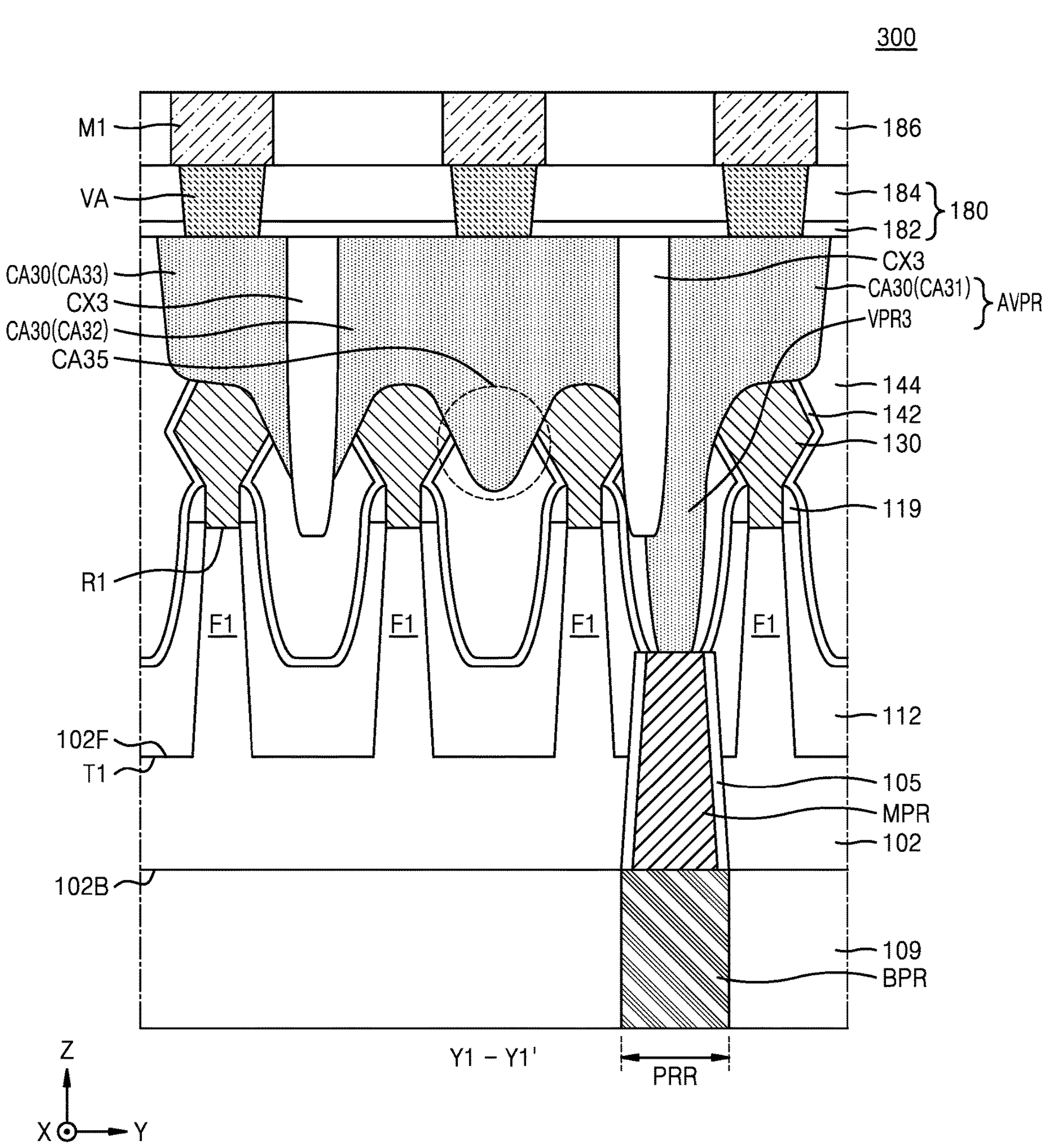
FIG. 6 is a cross-sectional view illustrating an integrated circuit device according to some embodiments.

FIG. 6 is a cross-sectional view illustrating an integrated circuit device 300 according to some embodiments. FIG. 6 illustrates a cross-sectional configuration of a portion of the integrated circuit device 300, which corresponds to the cross-section taken along the line Y1-Y1' of FIG. 2. In FIG. 6, the same reference numerals as in FIGS. 2 and 3A to 3F respectively denote the same members, and here, repeated descriptions thereof are omitted.

Referring to FIG. 6, the integrated circuit device 300 has substantially the same configuration as the integrated circuit device 100 described with reference to FIGS. 2 and 3A to 3F. However, the integrated circuit device 300 may include a plurality of source/drain contacts CA30 respectively having different cross-sectional shapes and different cross-sectional sizes in the second horizontal direction (Y direction). The plurality of source/drain contacts CA30 may include a first source/drain contact CA31, a second source/drain contact CA32, and a third source/drain contact CA33, which are arranged in a line in the second horizontal direction (Y direction). A contact isolation insulating film CX3 may be arranged between the first source/drain contact CA31, the second source/drain contact CA32, and the third source/drain contact CA33.

The first source/drain contact CA31 may be integrally connected to a via power rail VPR3. The first source/drain contact CA31, together with the via power rail VPR3, may constitute a via power rail structure AVPR. The second source/drain contact CA32 may be apart from the first source/drain contact CA31 in the second horizontal direction (Y direction) with one contact isolation insulating film CX3 therebetween. Each of the first source/drain contact CA31 and the second source/drain contact CA32 may be in contact with the one contact isolation insulating film CX3. The third source/drain contact CA33 may be apart from the second source/drain contact CA32 in the second horizontal direction (Y direction) with one contact isolation insulating film CX3 therebetween. Each of the second source/drain contact CA32 and the third source/drain contact CA33 may be in contact with the one contact isolation insulating film CX3.

The source/drain region 130 connected to the first source/drain contact CA31 and the source/drain region 130 connected to the second source/drain contact CA32 may be apart from each other in the second horizontal direction (Y direction) with the via power rail VPR3 and one contact isolation insulating film CX3 therebetween. The contact isolation insulating film CX3 between the first source/drain contact CA31 and the second source/drain contact CA32 may include a portion overlapping the via power rail VPR3 in the vertical direction (Z direction).

The second source/drain contact CA32 may have an approximately T-shaped cross-sectional structure in a cross-sectional view taken in the second horizontal direction (Y direction). The second source/drain contact CA32 may be connected to two source/drain regions 130 arranged between two contact isolation insulating films CX3 adjacent to each other in the second horizontal direction (Y direction). Each of the two source/drain regions 130 may be apart from the via power rail VPR3 in the second horizontal direction (Y direction) with the contact isolation insulating film CX3 contacting the via power rail VPR3. The second source/drain contact CA32 may include a contact sag portion CA35, which is arranged between the two source/drain regions 130 connected to the second source/drain contact CA32 to protrude toward the substrate 102 in the vertical direction (Z direction). The lowermost surface, which is closest to the substrate 102, in the contact isolation insulating film CX3 may be closer to the substrate 102 than the lowermost surface, which is closest to the substrate 102, in the contact sag portion CA35.

In some embodiments, each of the first source/drain contact CA31, the second source/drain contact CA32, and the third source/drain contact CA33 may be in contact with the source/drain region 130 connected thereto. In some embodiments, a metal silicide film (not shown) may be arranged between each of the first source/drain contact CA31, the second source/drain contact CA32, and the third source/drain contact CA33 and the source/drain region 130 connected thereto.

A more detailed configuration of each of the first source/drain contact CA31, the second source/drain contact CA32, and the third source/drain contact CA33 is substantially the same as that of the source/drain contact CA described with reference to FIGS. 3A to 3D. A more detailed configuration of the contact isolation insulating film CX3 is substantially the same as that of the contact isolation insulating film CX described with reference to FIGS. 3B and 3D. More detailed configurations of the via power rail VPR3 and the via power rail structure AVPR are substantially the same as those of the via power rail VPR and the via power rail structure WVPR, which are described with reference to FIGS. 3C and 3D.

Figure 7:
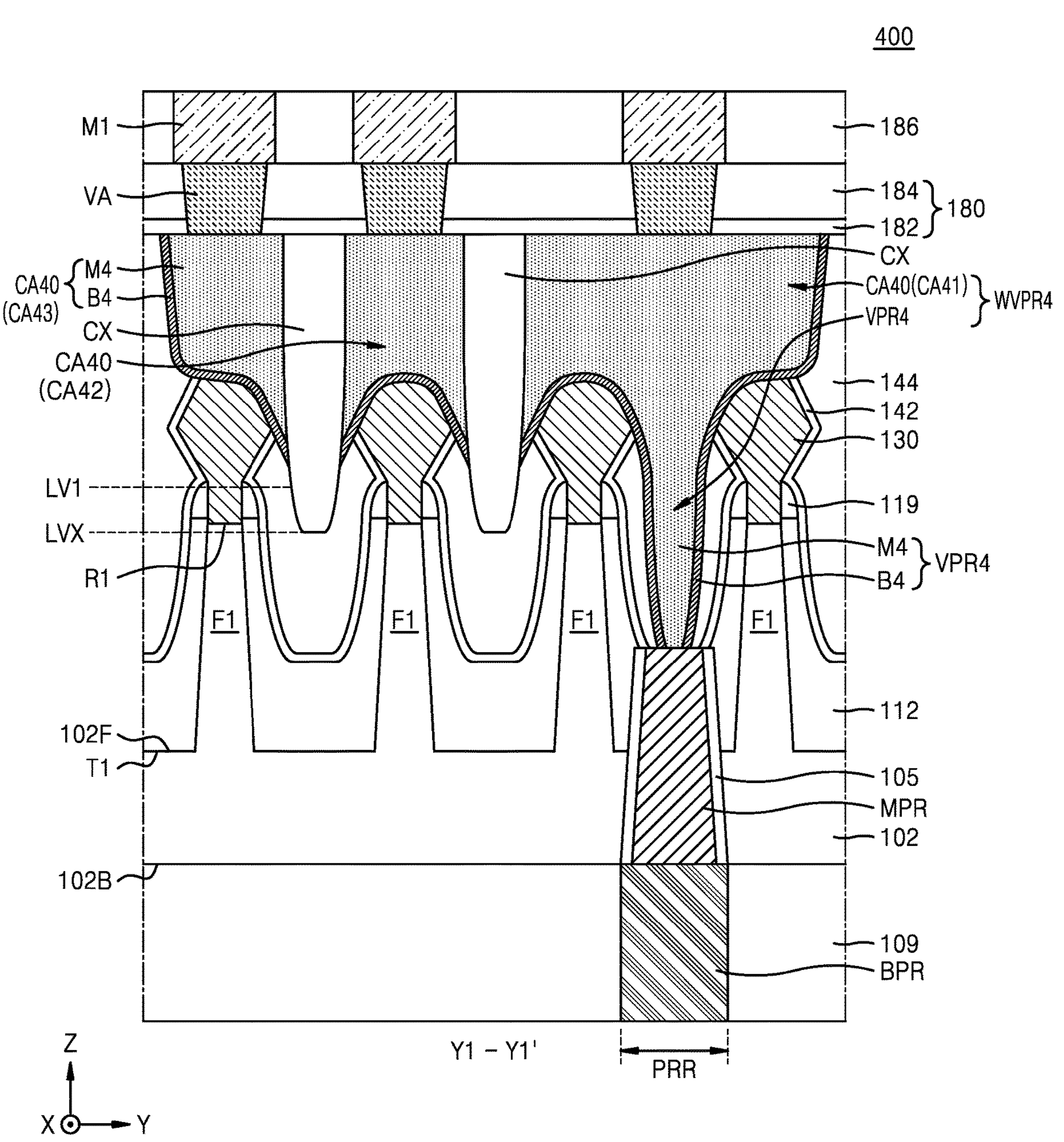
FIG. 7 is a cross-sectional view illustrating an integrated circuit device according to some embodiments.

FIG. 7 is a cross-sectional view illustrating an integrated circuit device 400 according to some embodiments. FIG. 7 illustrates a cross-sectional configuration of a portion of the integrated circuit device 400, which corresponds to the cross-section taken along the line Y1-Y1' of FIG. 2. In FIG. 7, the same reference numerals as in FIGS. 2 and 3A to 3F respectively denote the same members, and here, repeated descriptions thereof are omitted.

Referring to FIG. 7, the integrated circuit device 400 has substantially the same configuration as the integrated circuit device 100 described with reference to FIGS. 2 and 3A to 3F. However, the integrated circuit device 400 may include a plurality of source/drain contacts CA40 respectively having different cross-sectional shapes and different cross-sectional sizes in the second horizontal direction (Y direction). The plurality of source/drain contacts CA40 may include a first source/drain contact CA41, a second source/drain contact CA42, and a third source/drain contact CA43, which are arranged in a line in the second horizontal direction (Y direction). The contact isolation insulating film CX may be arranged between the first source/drain contact CA41, the second source/drain contact CA42, and the third source/drain contact CA43. The first source/drain contact CA41 may be integrally connected with a via power rail VPR4. The first source/drain contact CA41, together with the via power rail VPR4, may constitute a via power rail structure WVPR4.

Each of the first source/drain contact CA41, the second source/drain contact CA42, and the third source/drain contact CA43 may have substantially the same configuration as the source/drain contact CA described with reference to FIGS. 3A to 3D. However, each of the first source/drain contact CA41, the second source/drain contact CA42, and the third source/drain contact CA43 may include a metal plug M4 and a conductive barrier film B4 surrounding a portion of the metal plug M4. Each of the plurality of source/drain regions 130 may be apart from the metal plug M4 with the conductive barrier film B4 therebetween.

In some embodiments, each of the first source/drain contact CA41, the second source/drain contact CA42, and the third source/drain contact CA43 may be in contact with the source/drain region 130 connected thereto. In some embodiments, a metal silicide film (not shown) may be arranged between each of the first source/drain contact CA41, the second source/drain contact CA42, and the third source/drain contact CA43 and the source/drain region 130 connected thereto.

The conductive barrier film B4 may not be arranged between each of the first source/drain contact CA41, the second source/drain contact CA42, and the third source/drain contact CA43 and the contact isolation insulating film CX that is in contact therewith. The contact isolation insulating film CX may be in contact with the metal plug M4 of the first source/drain contact CA41, the second source/drain contact CA42, or the third source/drain contact CA43, which is in contact therewith.

In some embodiments, the metal plug M4 may include, but is not limited to, molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. The conductive barrier film B4 may include a metal or a conductive metal nitride. For example, the conductive barrier film B4 may include, but is not limited to, Ti, Ta, W, TiN, TaN, WN, WCN, TiSiN, TaSiN, WSIN, or a combination thereof.

Figure 8:
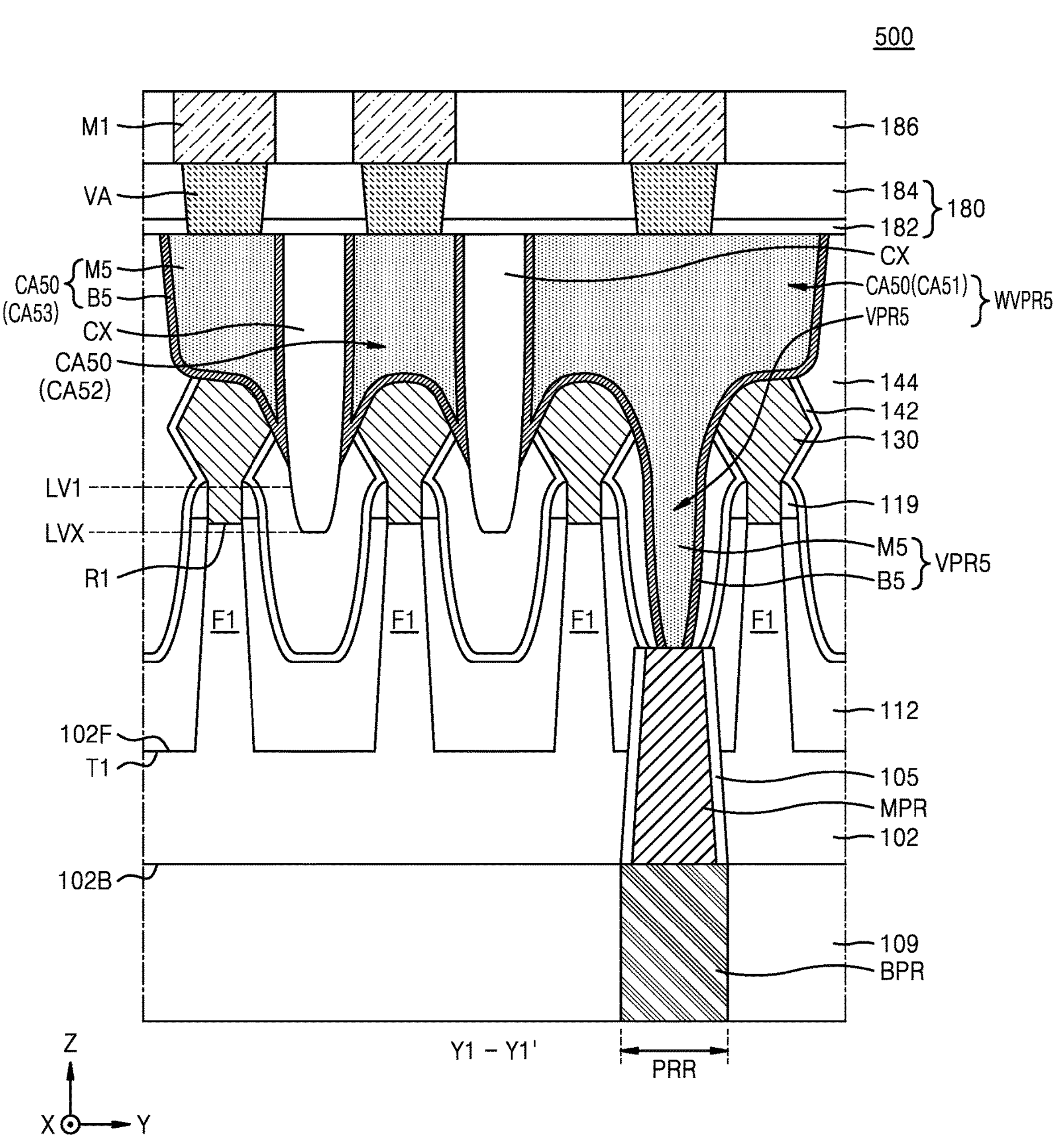
FIG. 8 is a cross-sectional view illustrating an integrated circuit device according to some embodiments.

FIG. 8 is a cross-sectional view illustrating an integrated circuit device 500 according to some embodiments. FIG. 8 illustrates a cross-sectional configuration of a portion of the integrated circuit device 500, which corresponds to the cross-section taken along the line Y1-Y1' of FIG. 2. In FIG. 8, the same reference numerals as in FIGS. 2 and 3A to 3F respectively denote the same members, and here, repeated descriptions thereof are omitted.

Referring to FIG. 8, the integrated circuit device 500 has substantially the same configuration as the integrated circuit device 100 described with reference to FIGS. 2 and 3A to 3F. However, the integrated circuit device 500 may include a plurality of source/drain contacts CA50 respectively having different cross-sectional shapes and different cross-sectional sizes in the second horizontal direction (Y direction). The plurality of source/drain contacts CA50 may include a first source/drain contact CA51, a second source/drain contact CA52, and a third source/drain contact CA53, which are arranged in a line in the second horizontal direction (Y direction). The contact isolation insulating film CX may be arranged between the first source/drain contact CA51, the second source/drain contact CA52, and the third source/drain contact CA53. The first source/drain contact CA51 may be integrally connected with a via power rail VPR5. The first source/drain contact CA51, together with the via power rail VPR5, may constitute a via power rail structure WVPR5.

Each of the first source/drain contact CA51, the second source/drain contact CA52, and the third source/drain contact CA53 may have substantially the same configuration as the source/drain contact CA described with reference to FIGS. 3A to 3D. However, each of the first source/drain contact CA51, the second source/drain contact CA52, and the third source/drain contact CA53 may include a metal plug M5 and a conductive barrier film B5 surrounding a portion of the metal plug M5. Each of the plurality of source/drain regions 130 may be apart from the metal plug M5 with the conductive barrier film B5 therebetween.

In some embodiments, each of the first source/drain contact CA51, the second source/drain contact CA52, and the third source/drain contact CA53 may be in contact with the source/drain region 130 connected thereto. In some embodiments, a metal silicide film (not shown) may be arranged between each of the first source/drain contact CA51, the second source/drain contact CA52, and the third source/drain contact CA53 and the source/drain region 130 connected thereto.

The metal plug M5, which is included in each of the first source/drain contact CA51, the second source/drain contact CA52, and the third source/drain contact CA53, may be apart from the contact isolation insulating film CX with the conductive barrier film B5 therebetween. More detailed configurations of the metal plug M5 and the conductive barrier film B5 are substantially the same as those of the metal plug M4 and the conductive barrier film B4, which are described with reference to FIG. 7.

Figure 9A:
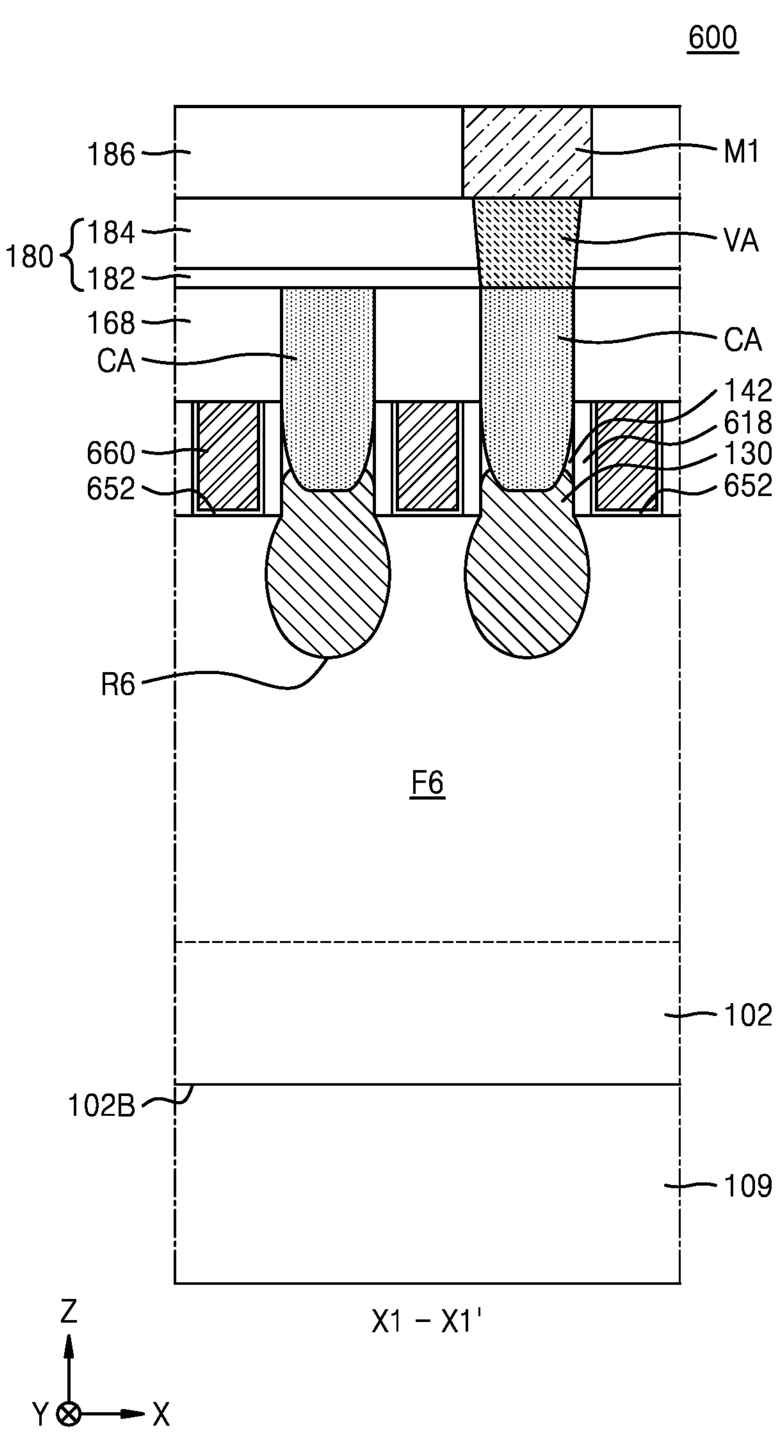
FIGS. 9A and 9B are cross-sectional views illustrating an integrated circuit device according to some embodiments.
Figure 9B:
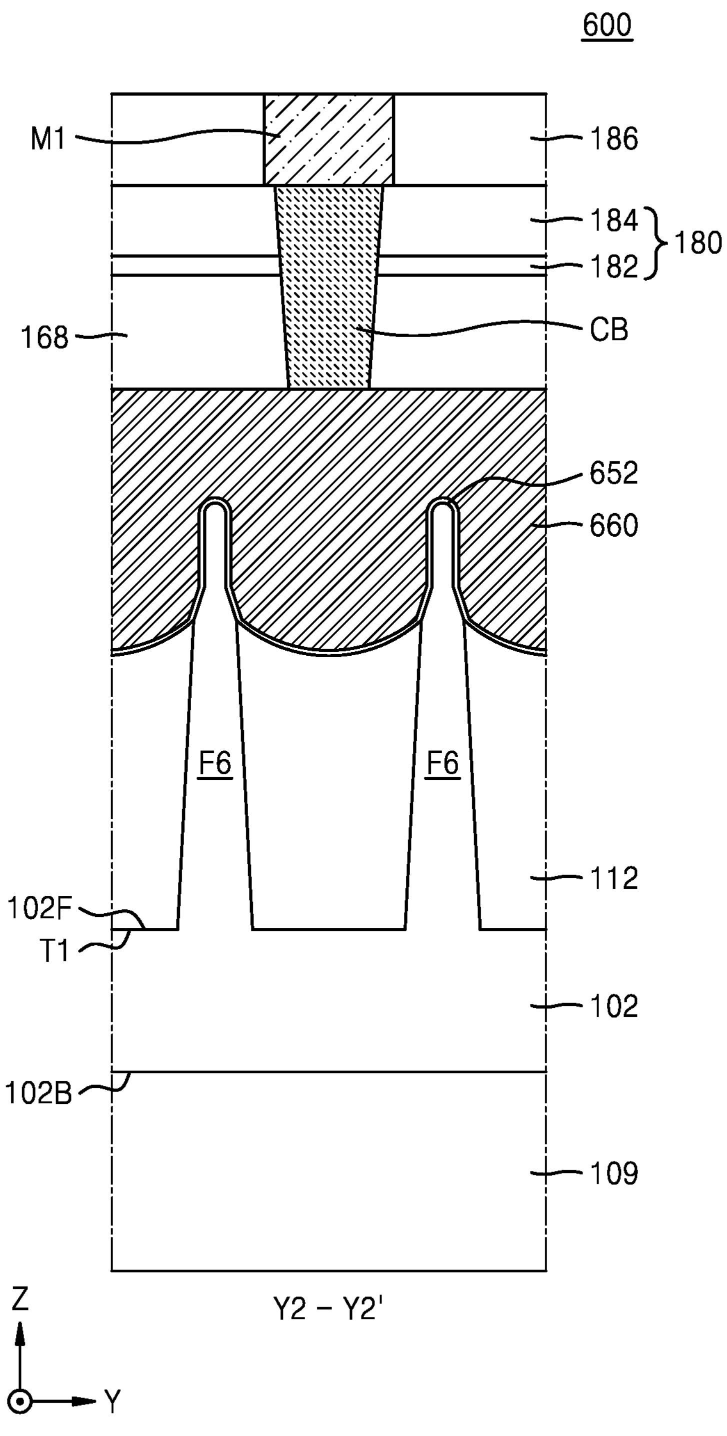

FIGS. 9A and 9B are cross-sectional views illustrating an integrated circuit device 600 according to some embodiments. More specifically, FIG. 9A illustrates a cross-sectional configuration of a portion of the integrated circuit device 600, which corresponds to the cross-section taken along the line X1-X1' of FIG. 2, and FIG. 9B illustrates a cross-sectional configuration of a portion of the integrated circuit device 600, which corresponds to the cross-section taken along the line Y2-Y2' of FIG. 2. In FIGS. 9A and 9B, the same reference numerals as in FIGS. 2 and 3A to 3F respectively denote the same members, and here, repeated descriptions thereof are omitted.

Referring to FIGS. 9A and 9B, the integrated circuit device 600 may constitute a logic cell including a fin field-effect transistor (FinFET). The integrated circuit device 600 may include a plurality of fin-type active regions F6 protruding from the substrate 102. Each of the plurality of fin-type active regions F6 may have substantially the same configuration as the fin-type active region F1 described with reference to FIGS. 2 and 3A to 3F. The device isolation film 112 may be arranged between the plurality of fin-type active regions F6 and cover a lower sidewall of each of the plurality of fin-type active regions F6.

A plurality of gate dielectric films 652 and a plurality of gate lines 660 may extend lengthwise in the second horizontal direction (Y direction) on the plurality of fin-type active regions F6 and the device isolation film 112. The plurality of gate dielectric films 652 and the plurality of gate lines 660 may each cover an upper surface and both sidewalls of each of the plurality of fin-type active regions F6 and the upper surface of the device isolation film 112. The plurality of gate dielectric films 652 and the plurality of gate lines 660 may respectively have substantially the same configurations as the gate dielectric film 152 and the gate line 160, which are described with reference to FIGS. 2 and 3A to 3F. A plurality of MOS transistors may be formed along the plurality of gate lines 660. Each of the plurality of MOS transistors may include a 3-dimensional-structure MOS transistor in which a channel is formed at the upper surface and both sidewalls of each of the plurality of fin-type active regions F6. Each of the plurality of MOS transistors may include an NMOS transistor, a PMOS transistor, or a combination thereof.

Each of the plurality of outer insulating spacers 118 may cover both sidewalls of each of the plurality of gate lines 660. The plurality of gate lines 660, the plurality of gate dielectric films 652, and the plurality of outer insulating spacers 118 may be covered by the capping insulating pattern 168.

A plurality of recess regions R6 may be formed in the upper surface of each of the plurality of fin-type active regions F6. The plurality of source/drain regions 130 may be respectively arranged in the plurality of recess regions R6. The gate line 660 may be apart from the source/drain region 130 with the gate dielectric film 652 and the outer insulating spacer 118 therebetween.

As shown in FIG. 9A, the plurality of source/drain contacts CA may be respectively arranged on the plurality of source/drain regions 130. As shown in FIG. 9B, the gate contact CB may be arranged on the gate line 660. Each of the plurality of source/drain regions 130 may be connected to the source/drain via contact VA through the source/drain contact CA. Regarding detailed configurations of the plurality of source/drain regions 130, the plurality of source/drain contacts CA, and the gate contact CB, a reference may be made to the descriptions made with reference to FIGS. 3A to 3F.

Similar to the integrated circuit device 100 described with reference to FIGS. 2 and 3A to 3F, the integrated circuit device 600 may include the plurality of contact isolation insulating films CX respectively arranged between the plurality of gate lines 160. Each of the plurality of contact isolation insulating films CX may be arranged between two source/drain contacts CA adjacent to each other in the second horizontal direction (Y direction) to electrically isolate the two source/drain contacts CA from each other.

Similar to the integrated circuit device 100 described with reference to FIGS. 2 and 3A to 3F, each of the integrated circuit devices 200, 300, 400, 500, and 600 described with reference to FIGS. 4 to 9B includes the contact isolation insulating film CX, CX2, or CX3, which is arranged between the plurality of source/drain contacts CA, CA30, CA40, or CA50 respectively connected to the plurality of source/drain regions 130, and which has a lower surface that is closer to the substrate 102 than the lower surface of each of the plurality of source/drain contacts CA, CA30, CA40, or CA50. The contact isolation insulating film CX, CX2, or CX3 may be formed by first forming a conductive layer for forming the plurality of source/drain contacts CA, CA30, CA40, or CA50 and then cutting a portion of the conductive layer to form the plurality of source/drain contacts CA, CA30, CA40, or CA50 and subsequently forming the contact isolation insulating film CX in order to electrically isolate the plurality of source/drain contacts CA, CA30, CA40, or CA50 from each other. Accordingly, there is no concern of generating a defect of electrical connection between a pair of source/drain contacts CA, CA30, CA40, or CA50 that are apart from each other with the contact isolation insulating film CX, CX2, or CX3 therebetween. Therefore, each of the integrated circuit devices 200, 300, 400, 500, and 600 according to aspects of the inventive concept employ a structure including a backside contact structure connected to the source/drain region 130, such as the via power rail VPR, VPR3, VPR4, or VPR5, whereby, even when the vertical-direction size of an isolation region required between each two adjacent source/drain contacts CA, CA30, CA40, or CA50 from among the plurality of source/drain contacts CA, CA30, CA40, or CA50 is increased, the contact isolation insulating film CX, CX2, or CX3 capable of stably isolating the plurality of source/drain contacts CA, CA30, CA40, or CA50 from each other may be arranged between each two adjacent source/drain contacts CA. Therefore, even when each of the integrated circuit devices 200, 300, 400, 500, and 600 has a device region reduced in area due to down-scaling, the reliability of each of the integrated circuit devices 200, 300, 400, 500, and 600 may improve.

Figure 10:
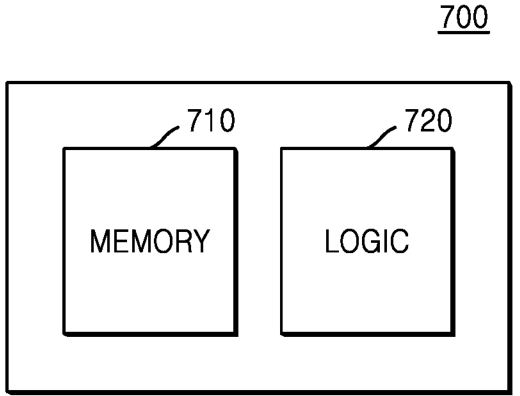
FIG. 10 is a block diagram of an integrated circuit device according to some embodiments.

FIG. 10 is a cross-sectional view illustrating an integrated circuit device 700 according to some embodiments.

Referring to FIG. 10, the integrated circuit device 700 may include a memory region 710 and a logic region 720. At least one of the memory region 710 and the logic region 720 may include at least one of the configurations of the integrated circuit devices 100, 200, 300, 400, 500, and 600 described with reference to FIGS. 2 to 9B.

The memory region 710 may include at least one of static random access memory (SRAM), dynamic RAM (DRAM), magnetic RAM (MRAM), resistive RAM (RRAM), and phase-change RAM (PRAM). For example, the memory region 710 may include SRAM. The logic region 720 may include standard cells performing intended logical functions, such as a counter, a buffer, and the like. The standard cells may include various logic cells including a plurality of circuit elements, such as a transistor, a register, and the like. A logic cell may include, for example, AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OR/AND/INVERTER (OAI), AND/OR (AO), AND/OR/INVERTER (AOI), a D flip-flop, a reset flip-flop, a master-slave flip-flop, a latch, or a combination thereof.

Next, a method of fabricating an integrated circuit device, according to some embodiments, is described in detail.

FIGS. 11A to 23D are diagrams respectively illustrating a sequence of processes of a method of fabricating an integrated circuit device, according to some embodiments. More specifically, FIGS. 11A, 12A, 14A, 15A, 16A, 17A, 18A, 19A, 20A, 21A, 22A, and 23A are cross-sectional views respectively illustrating cross-sectional structures of a region corresponding to the cross-section taken along the line X1-X1' of FIG. 2, according to the sequence of processes. FIGS. 17B, 18B, 19B, 20B, 21B, 22B, and 23B are cross-sectional views respectively illustrating cross-sectional structures of a region corresponding to the cross-section taken along the line X2-X2' of FIG. 2, according to the sequence of processes. FIGS. 18C, 19C, 20C, 21C, 22C, and 23C are cross-sectional views respectively illustrating cross-sectional structures of a region corresponding to the cross-section taken along the line X3-X3' of FIG. 2, according to the sequence of processes. FIG. 11B, 12B, 13, 14B, 15B, 17C, 18D, 19D, 20D, 21D, 22D, and 23D are cross-sectional views respectively illustrating cross-sectional structures of a region corresponding to the cross-section taken along the line Y1-Y1' of FIG. 2, according to the sequence of processes. FIGS. 12C, 14C, 15C, 16B, and 17D are cross-sectional views respectively illustrating cross-sectional structures of a region corresponding to the cross-section taken along the line Y2-Y2' of FIG. 2, according to the sequence of processes. An example of a method of fabricating the integrated circuit device 100 described with reference to FIGS. 2 and 3A to 3F is described with reference to FIGS. 11A to 23D. In FIGS. 11A to 23D, the same reference numerals as in FIGS. 2 and 3A to 3F respectively denote the same members, and here, repeated descriptions thereof are omitted.

Figure 11A:
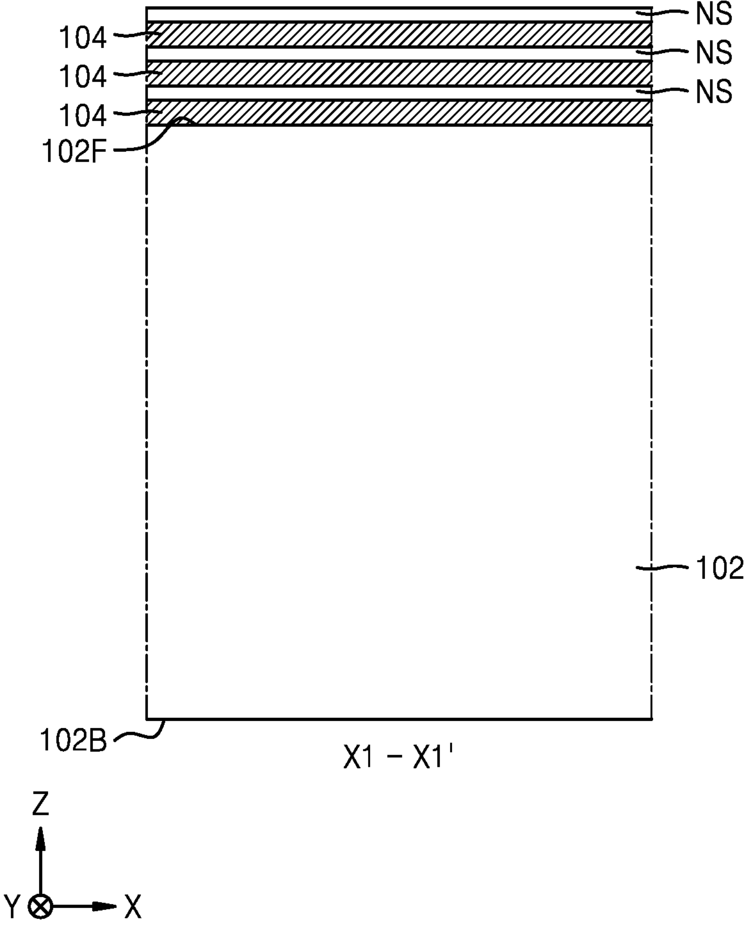
Figure 11B:
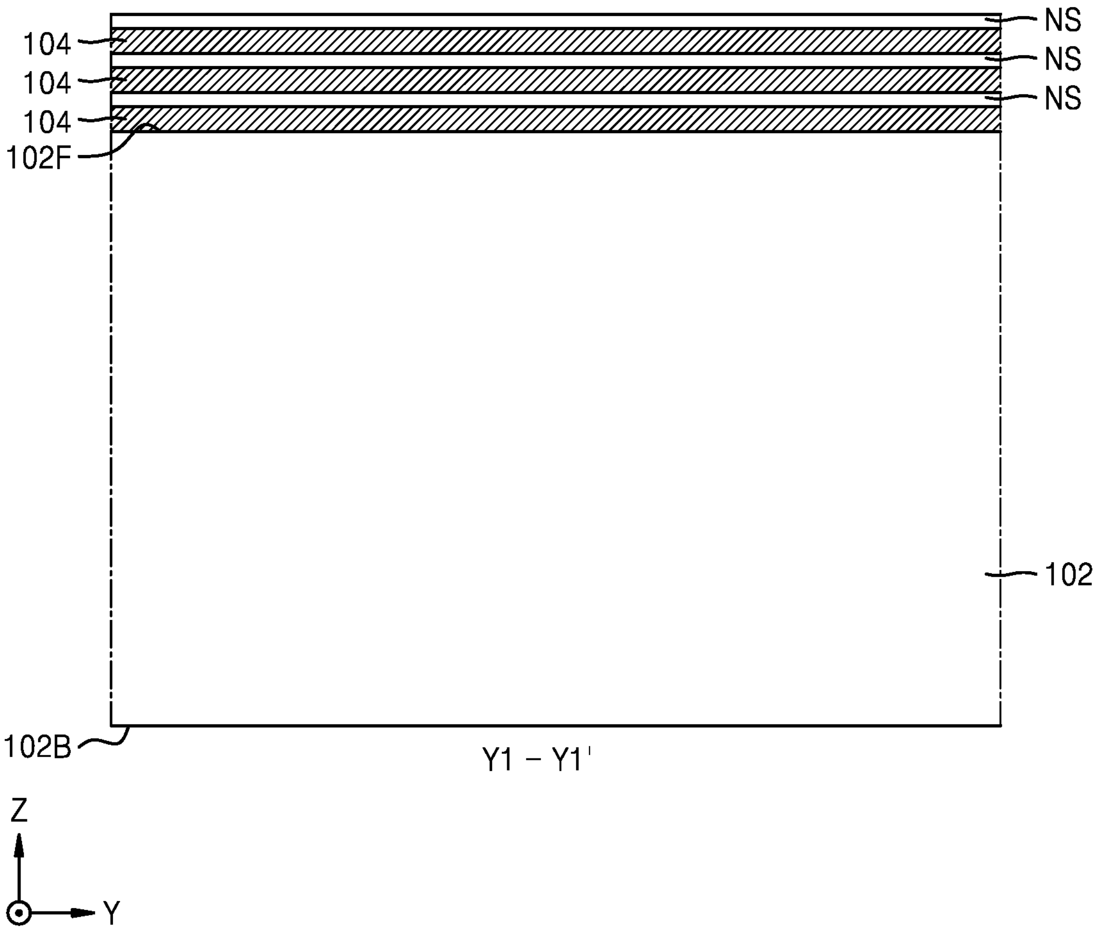

Referring to FIGS. 11A and 11B, the substrate 102 having the frontside surface 102F and the backside surface 102B may be prepared, and a plurality of sacrificial semiconductor layers 104 and a plurality of nanosheet semiconductor layers NS may be alternately stacked one-by-one on the frontside surface 102F of the substrate 102.

Each of the plurality of sacrificial semiconductor layers 104 and each of the plurality of nanosheet semiconductor layers NS may respectively include semiconductor materials having different etch selectivities from each other. In some embodiments, each of the plurality of nanosheet semiconductor layers NS may include an Si layer, and each of the plurality of sacrificial semiconductor layers 104 may include an SiGe layer. In some embodiments, Ge may be present in a constant amount in the plurality of sacrificial semiconductor layers 104. The SiGe layer constituting each of the plurality of sacrificial semiconductor layers 104 may include Ge in a constant amount selected from a range of about 5 at % to about 50 at %, for example, about 10 at % to about 40 at %. The amount of Ge in the SiGe layer constituting each of the plurality of sacrificial semiconductor layers 104 may be variously selected, as needed.

Figure 12A:
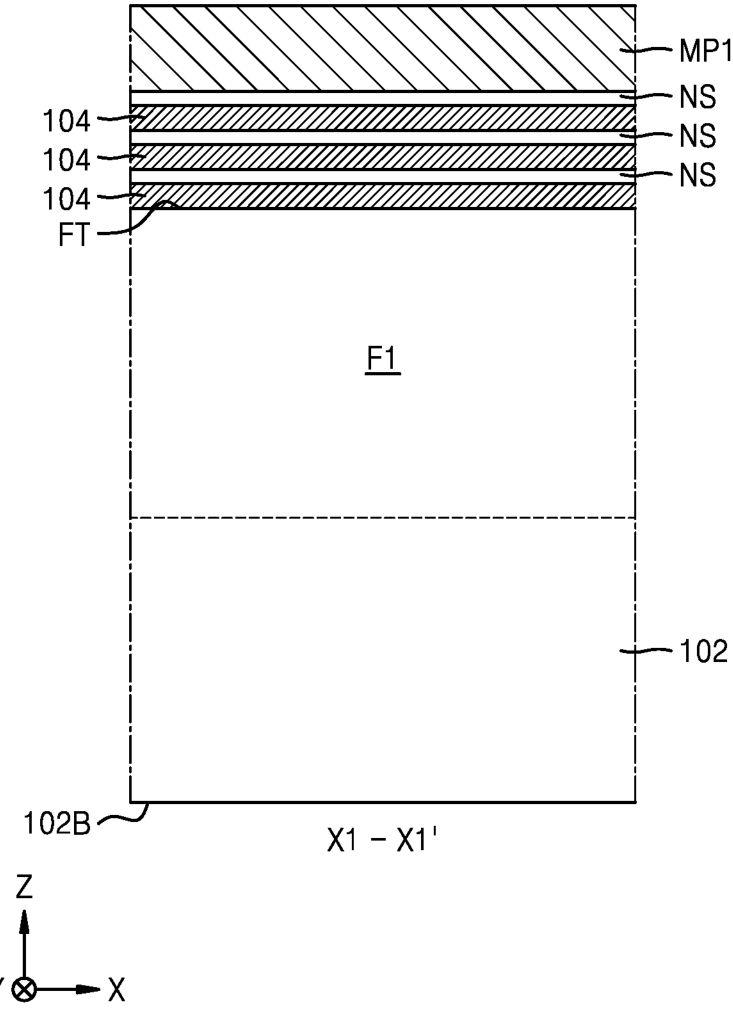
Figure 12B:
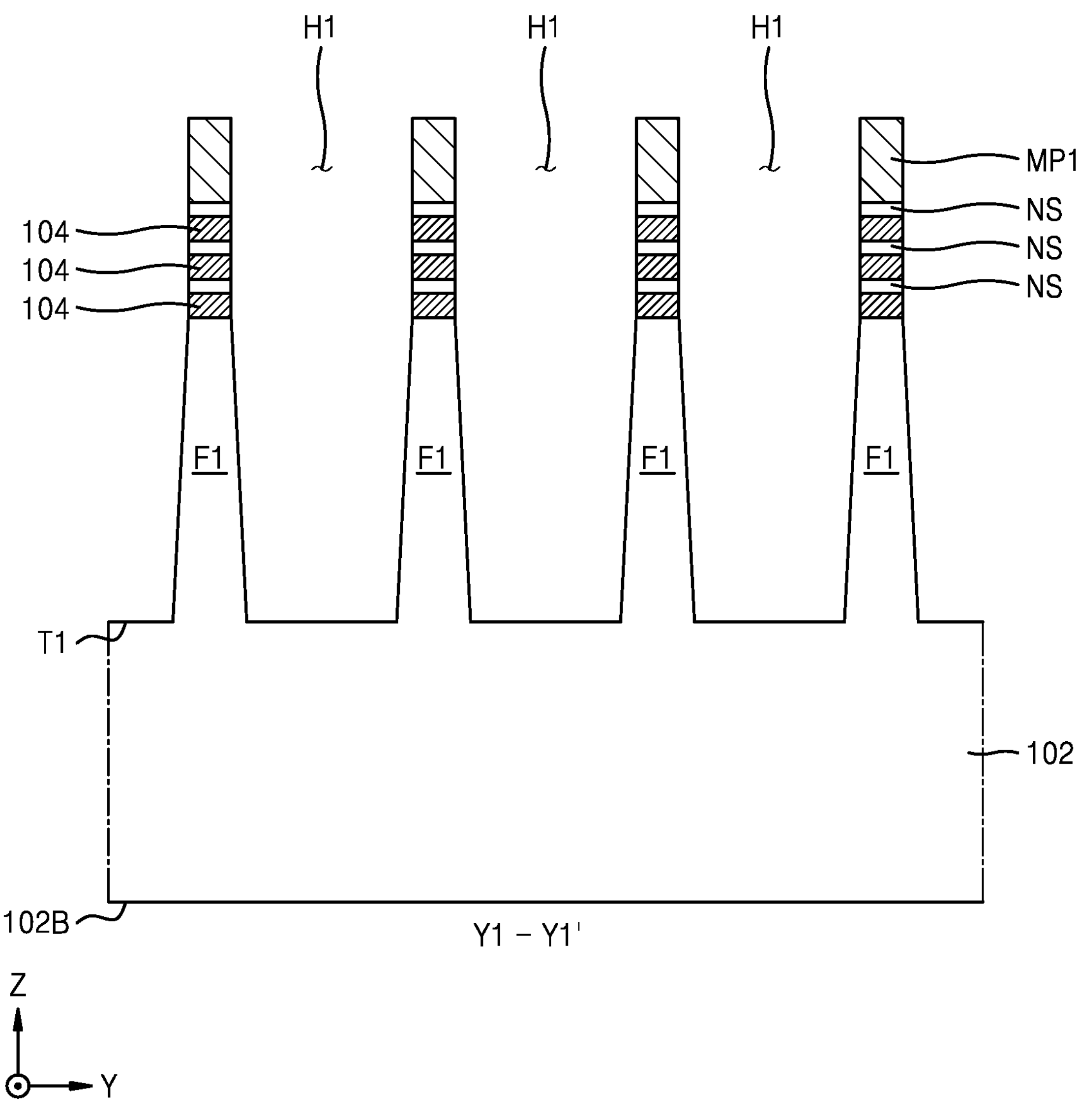
Figure 12C:
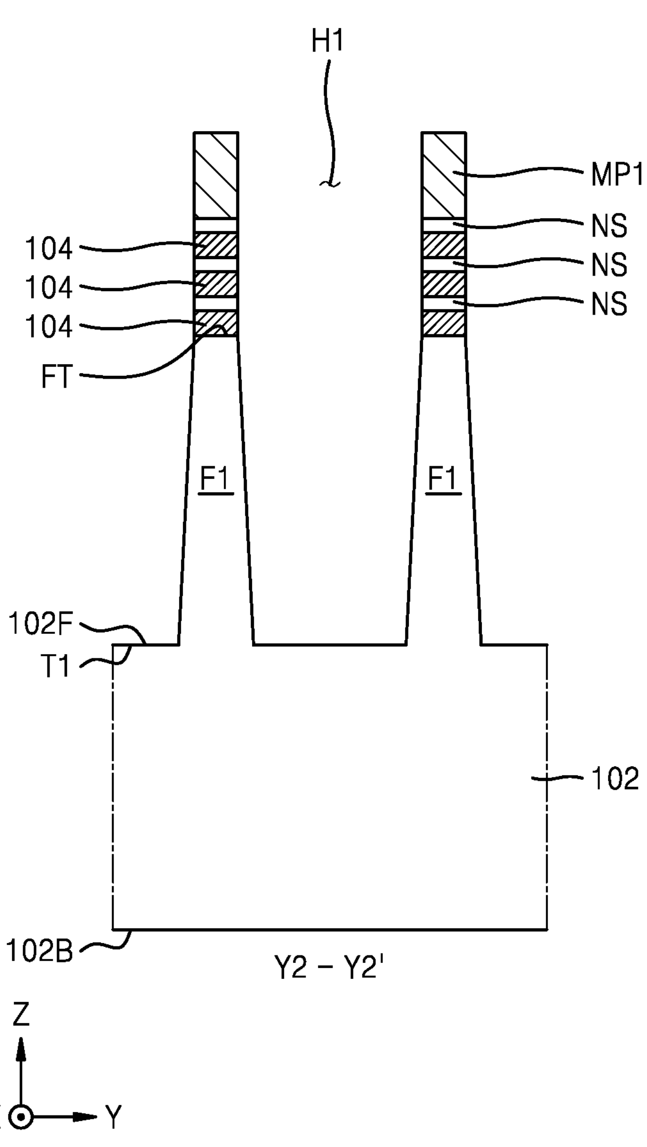
FIGS. 12C, 14C, 15C, 16B, and 17D are cross-sectional views respectively illustrating cross-sectional structures of a region corresponding to the cross-section taken along the line Y2-Y2' of FIG. 2, according to the sequence of processes.

Referring to FIGS. 12A, 12B, and 12C, a first mask pattern MP1 having a plurality of openings H1 may be formed on the resulting product of FIGS. 11A and 11B. Next, each of the plurality of sacrificial semiconductor layers 104, the plurality of nanosheet semiconductor layers NS, and the substrate 102 may be partially etched from exposed portions of the resulting product of FIGS. 11A and 11B through the plurality of openings H1 by using the first mask pattern MP1 as an etch mask, thereby forming a plurality of fin-type active regions F1 in the substrate 102. A plurality of trench regions T1 may be defined on the substrate 102 by the plurality of fin-type active regions F1. In some embodiments, the first mask pattern MP1 may include a stack structure of a silicon oxide film pattern and a silicon nitride film pattern. The first mask pattern MP1 may include portions extending parallel to each other in the first horizontal direction (X direction) over the substrate 102. A stack structure of the plurality of sacrificial semiconductor layers 104 and the plurality of nanosheet semiconductor layers NS may remain on the fin top surface FT of each of the plurality of fin-type active regions F1.

Figure 13:
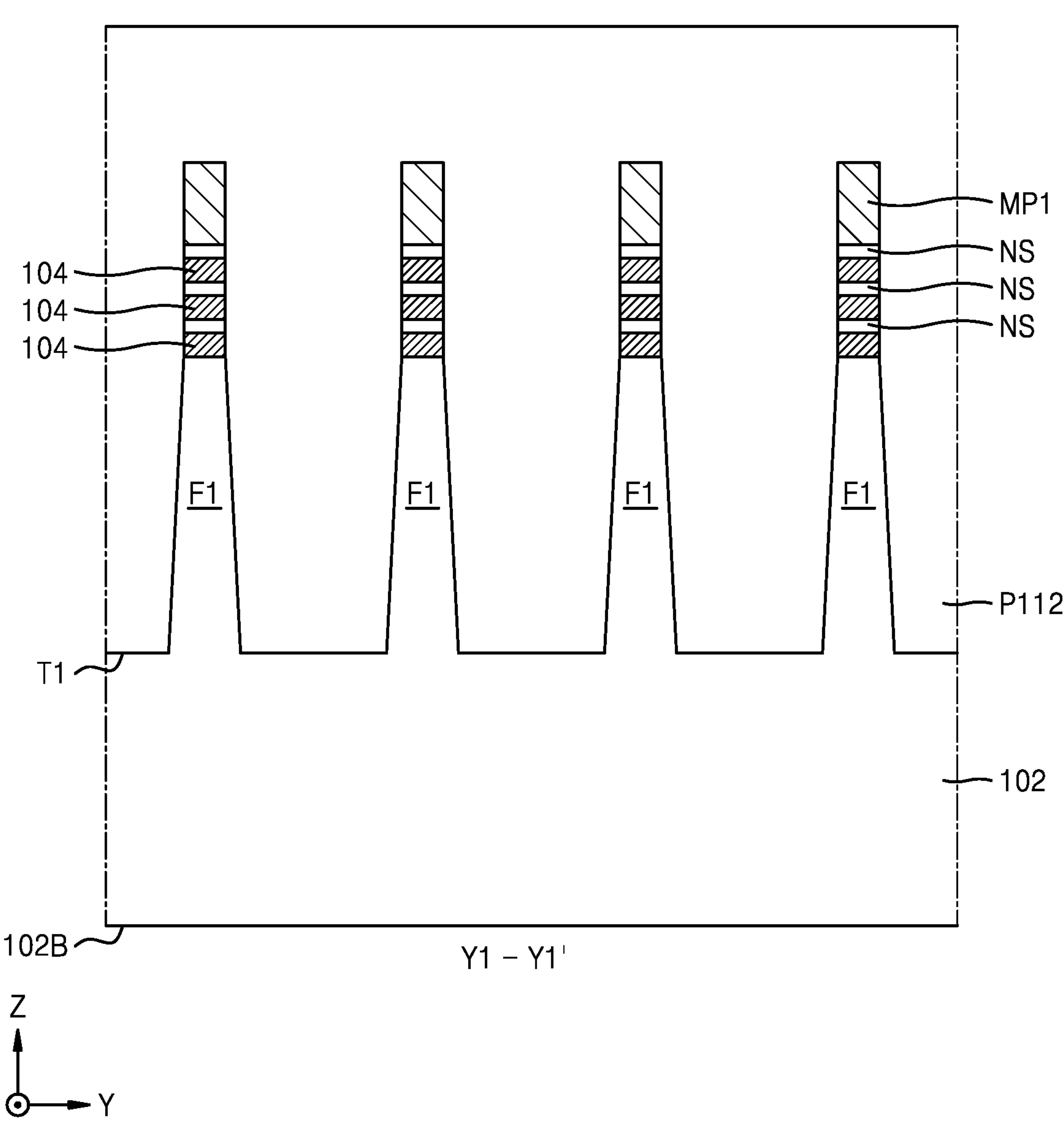

Referring to FIG. 13, a device isolation insulating film P112 may be formed on the resulting product of FIGS. 12A, 12B, and 12C. The device isolation insulating film P112 may be formed to a thickness enough to fill the plurality of trench regions T1. In some embodiments, the device isolation insulating film P112 may include, but is not limited to, a silicon oxide film.

To form the device isolation insulating film P112, a plasma-enhanced chemical vapor deposition (PECVD) process, a high-density plasma CVD (HDP CVD) process, an inductively coupled plasma CVD (ICP CVD) process, a capacitively coupled plasma CVD (CCP CVD) process, a flowable chemical vapor deposition (FCVD) process, a spin coating process, or the like may be used.

Figure 14A:
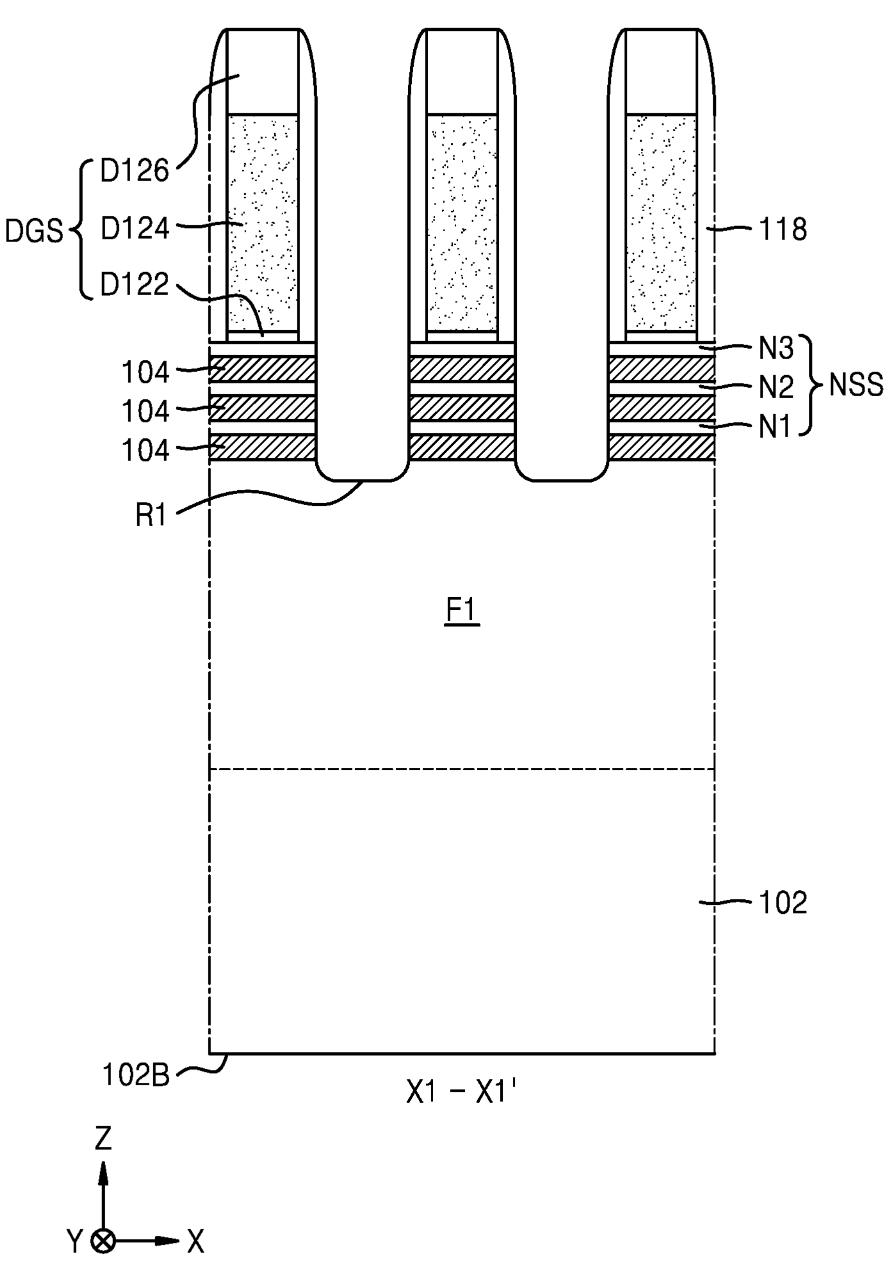
Figure 14B:
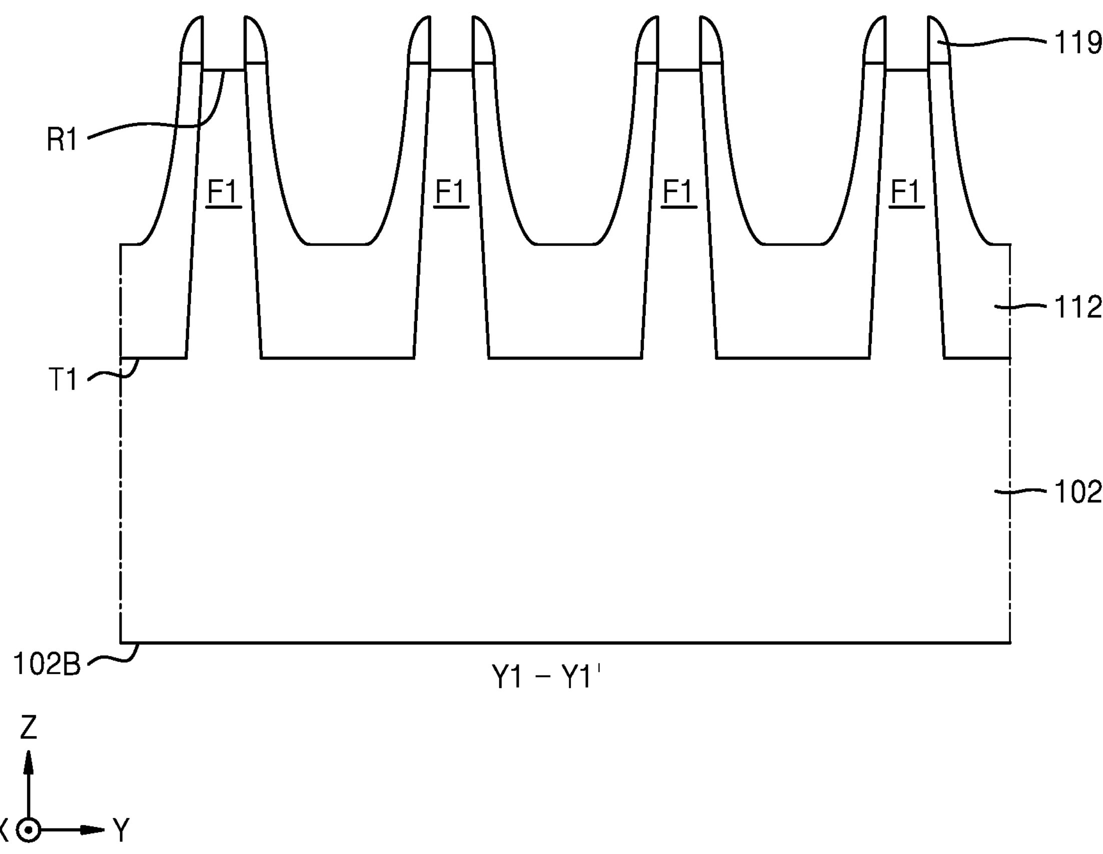
Figure 14C:
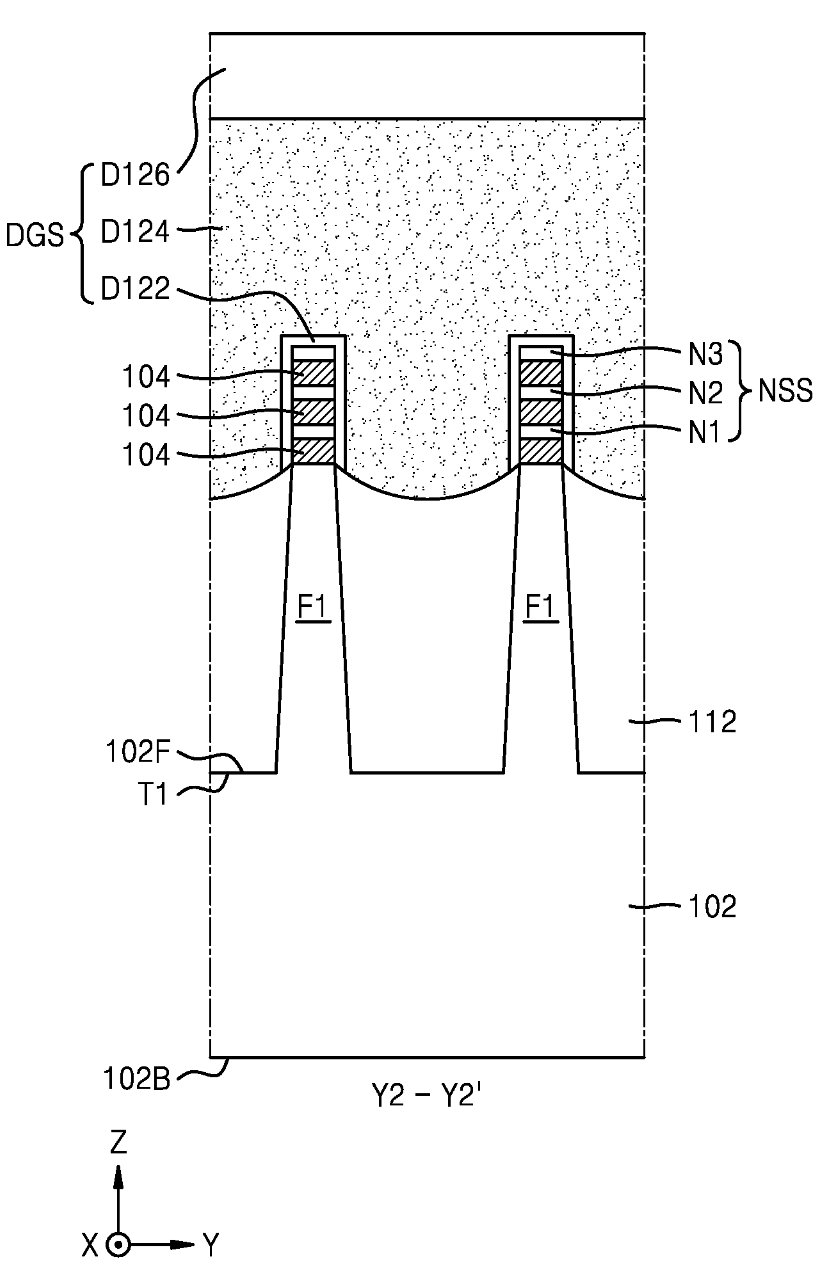

Referring to FIGS. 14A, 14B, and 14C, the resulting product of FIG. 13 may be planarized to expose an upper surface of the first mask pattern MP1, followed by removing the exposed first mask pattern MP1, and then, a recess process for removing a portion of the device isolation insulating film P112 may be performed, thereby forming the device isolation film 112, which includes the remaining portion of the device isolation insulating film P112. As a result, the plurality of sacrificial semiconductor layers 104 and the plurality of nanosheet semiconductor layers NS may protrude from the upper surface of the device isolation film 112.

To perform the recess process of the device isolation insulating film P112, a dry etching process, a wet etching process, or a combination process of dry etching and wet etching may be used. Here, a wet etching process using $NH_4OH$, tetramethylammonium hydroxide (TMAH), potassium hydroxide (KOH), or the like as an etchant or a dry etching process by a method, such as ICP, transformer coupled plasma (TCP), electron cyclotron resonance (ECR), or reactive ion etch (RIE), may be used. When the recess process of the device isolation insulating film P112 is performed by a dry etching process, a fluorine-containing gas, such as $CF_4$, a chlorine-containing gas, such as $Cl_2$, HBr, or the like may be used as an etching gas.

Next, a plurality of dummy gate structures DGS may be formed on a stack structure of the plurality of sacrificial semiconductor layers 104 and the plurality of nanosheet semiconductor layers NS. Each of the plurality of dummy gate structures DGS may be formed to extend lengthwise in the second horizontal direction (Y direction). Each of the plurality of dummy gate structures DGS may have a structure in which an oxide film D122, a dummy gate layer D124, and a capping layer D126 are stacked in the stated order. In some embodiments, the oxide film D122 may be obtained by oxidizing a surface of each of the plurality of sacrificial semiconductor layers 104 and the plurality of nanosheet semiconductor layers NS (see FIG. 16). The dummy gate layer D124 may include polysilicon, and the capping layer D136 may include a silicon nitride film.

The plurality of outer insulating spacers 118 may be formed to cover both sidewalls of each of the plurality of dummy gate structures DGS, followed by etching a portion of each of the plurality of sacrificial semiconductor layers 104 and the plurality of nanosheet semiconductor layers NS and a portion of the fin-type active region F1 by using the plurality of dummy gate structures DGS and the plurality of outer insulating spacers 118 as an etch mask, whereby the plurality of nanosheet semiconductor layers NS may be divided into the plurality of plurality of nanosheet stacks NSS, which each include the first nanosheet N1, the second nanosheet N2, and the third nanosheet N3, and the plurality of recesses R1 may be formed in an upper portion of the fin-type active region F1. To form the plurality of recesses R1, etching may be performed by dry etching, wet etching, or a combination thereof. After the plurality of recesses R1 are formed, the plurality of recess-side insulating spacers 119 may be formed as shown in FIG. 14B, the plurality of recess-side insulating spacers 119 being arranged on the device isolation film 112 on both sides of each fin-type active region F1 in the second horizontal direction (Y direction) to be respectively adjacent to the plurality of recesses R1.

Figure 15A:
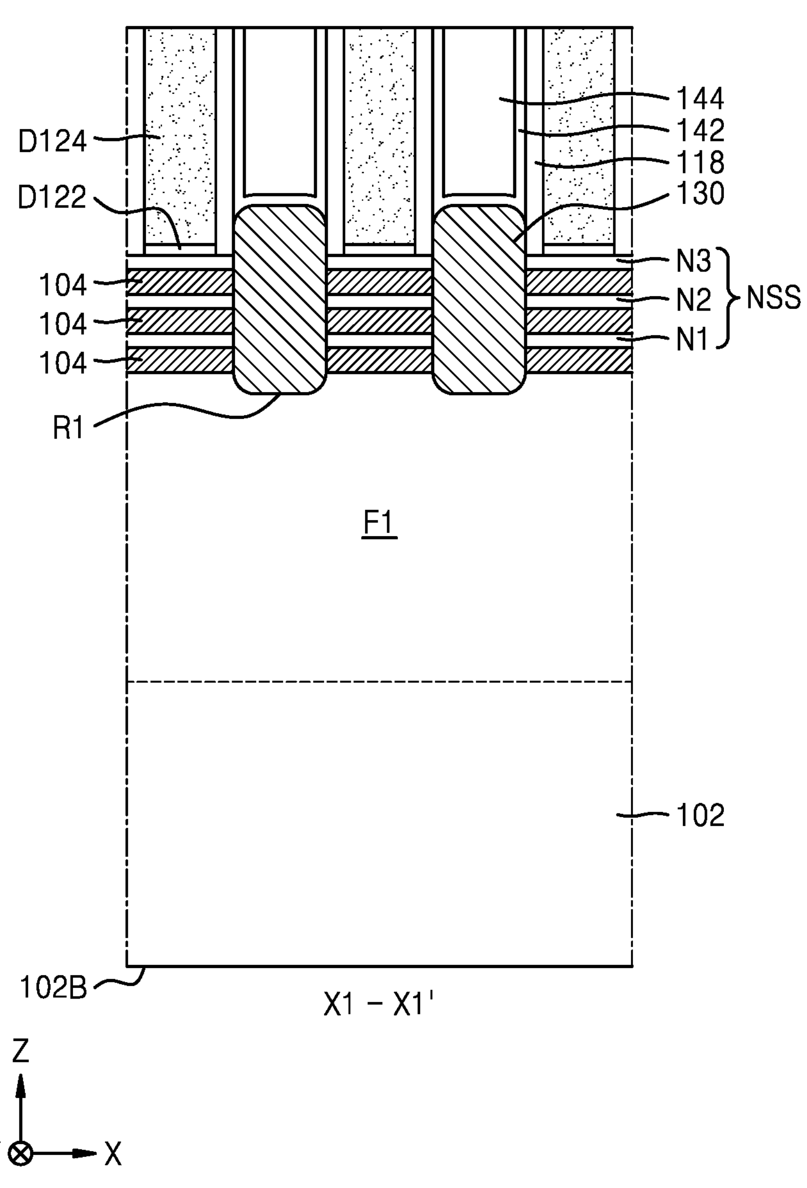
Figure 15B:
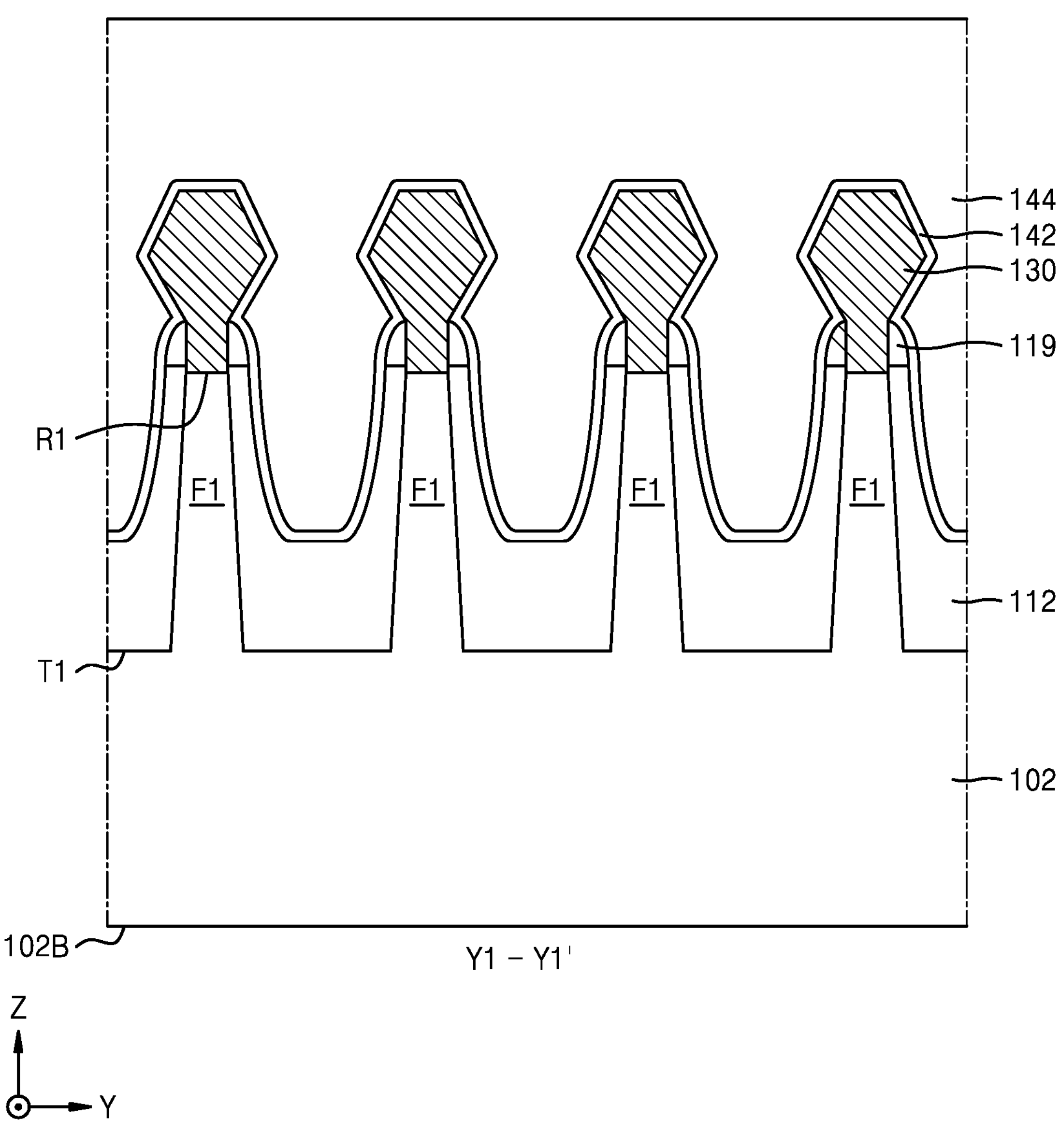
Figure 15C:
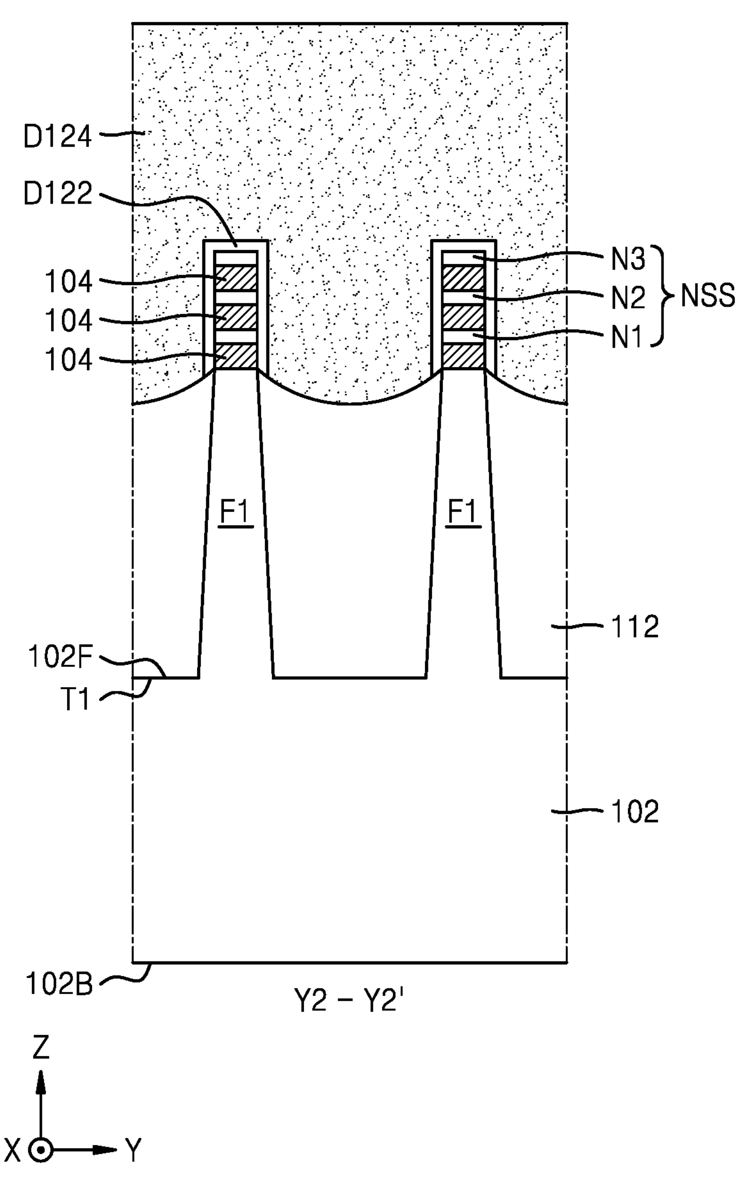

Referring to FIGS. 15A, 15B, and 15C, in the resulting product of FIGS. 14A, 14B, and 14C, the plurality of source/drain regions 130 may be formed to respectively fill the plurality of recesses R1. To form the plurality of source/drain regions 130, a semiconductor material may be epitaxially grown on an exposed surface of the fin-type active region F1 and an exposed sidewall of each of the first nanosheet N1, the second nanosheet N2, and the third nanosheet N3 of the nanosheet stack NSS in the plurality of recesses R1.

Next, the insulating liner 142 may be formed to cover the resulting product in which the plurality of source/drain regions 130 are formed, followed by forming the inter-gate dielectric 144 on the insulating liner 142, and then, each of the insulating liner 142 and the inter-gate dielectric 144 may be partially etched, thereby exposing upper surfaces of a plurality of capping layers D126. Next, the dummy gate layer D124 may be exposed by removing the plurality of capping layers D126, and the insulating liner 142 and the inter-gate dielectric 144 may be partially etched such that an upper surface of the inter-gate dielectric 144 and an upper surface of the dummy gate layer D124 are at an approximately equal level.

Figure 16A:
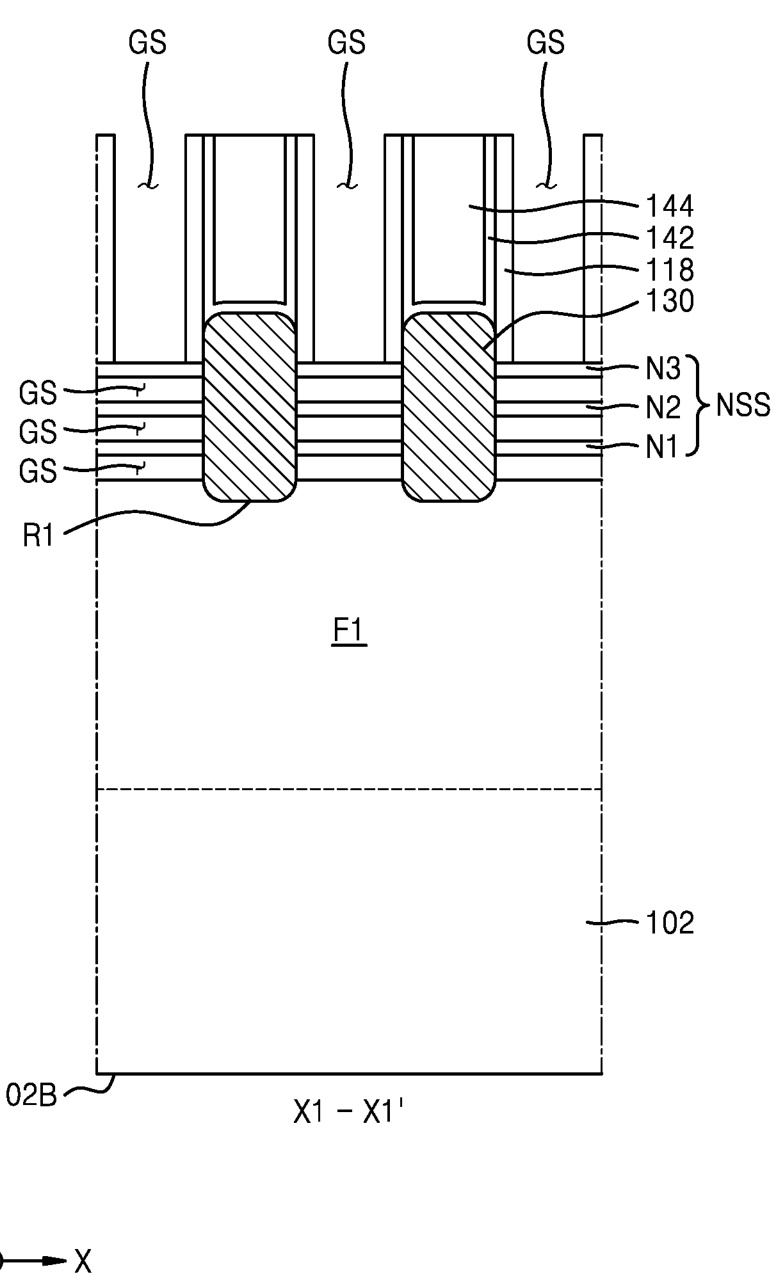
Figure 16B:
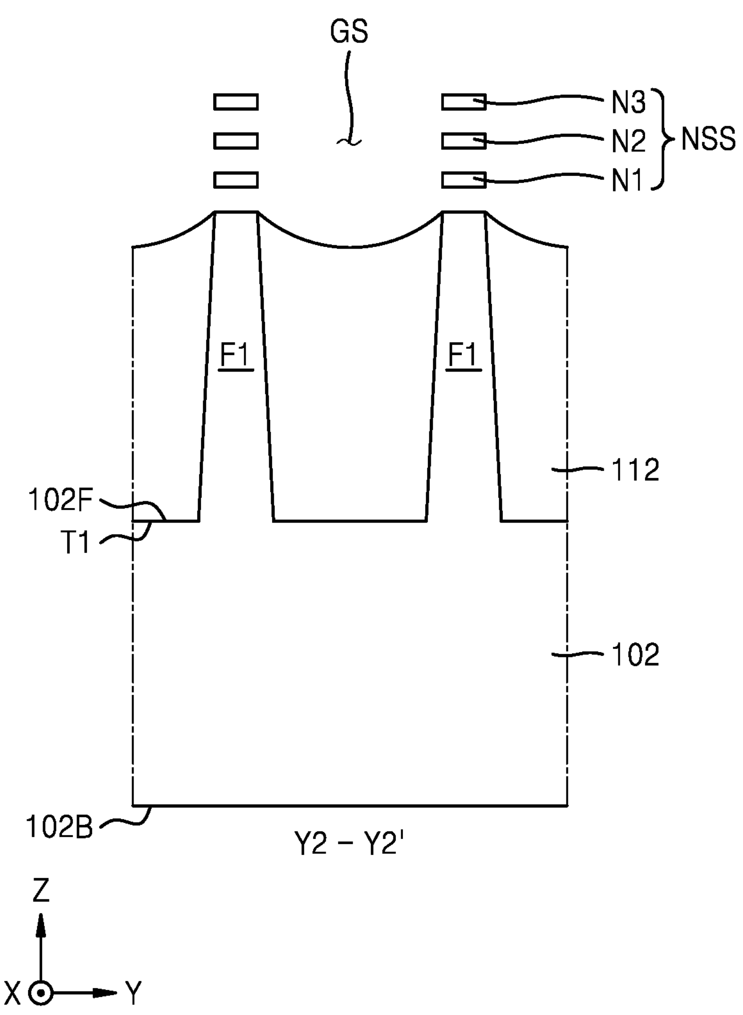
Figure 17A:
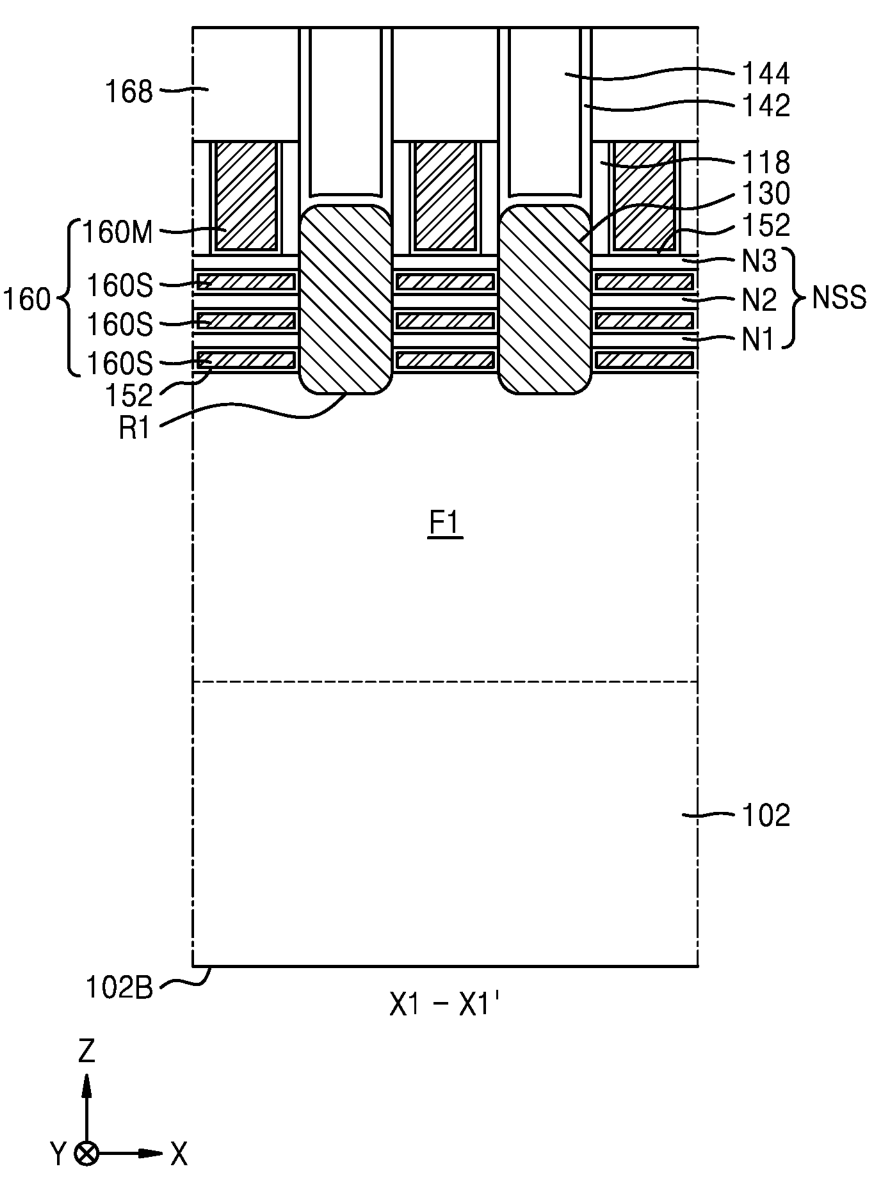
Figure 17B:
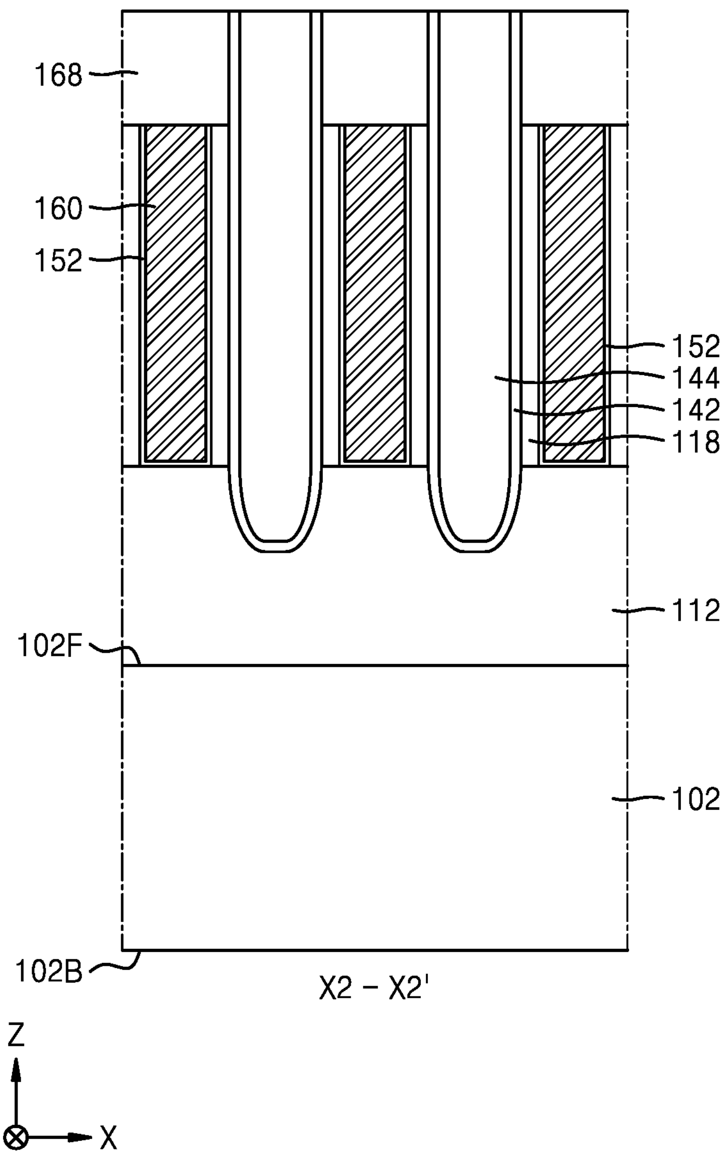
FIGS. 17B, 18B, 19B, 20B, 21B, 22B, and 23B are cross-sectional views respectively illustrating cross-sectional structures of a region corresponding to the cross-section taken along the line X2-X2' of FIG. 2, according to the sequence of processes.
Figure 17C:
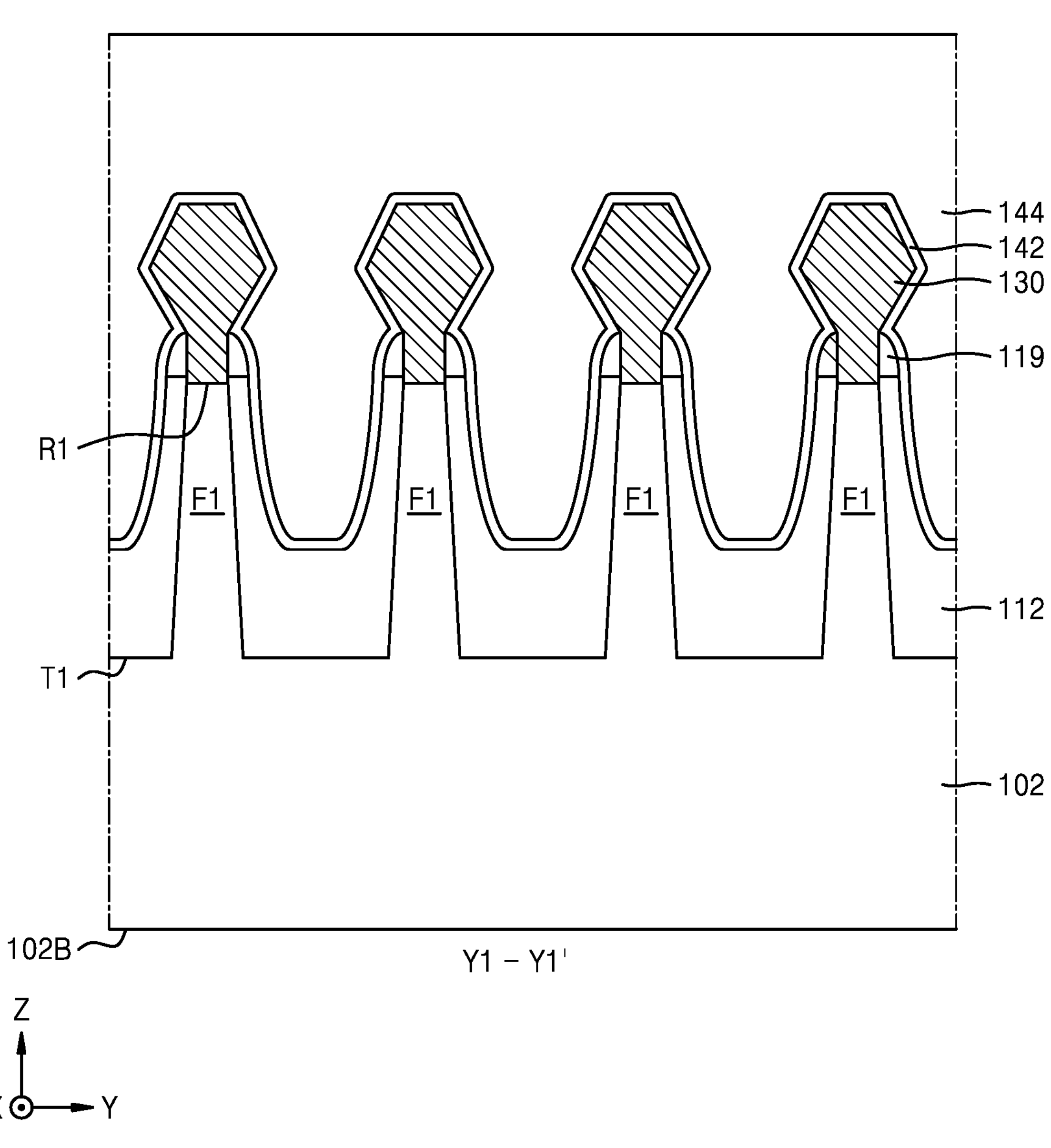
Figure 17D:
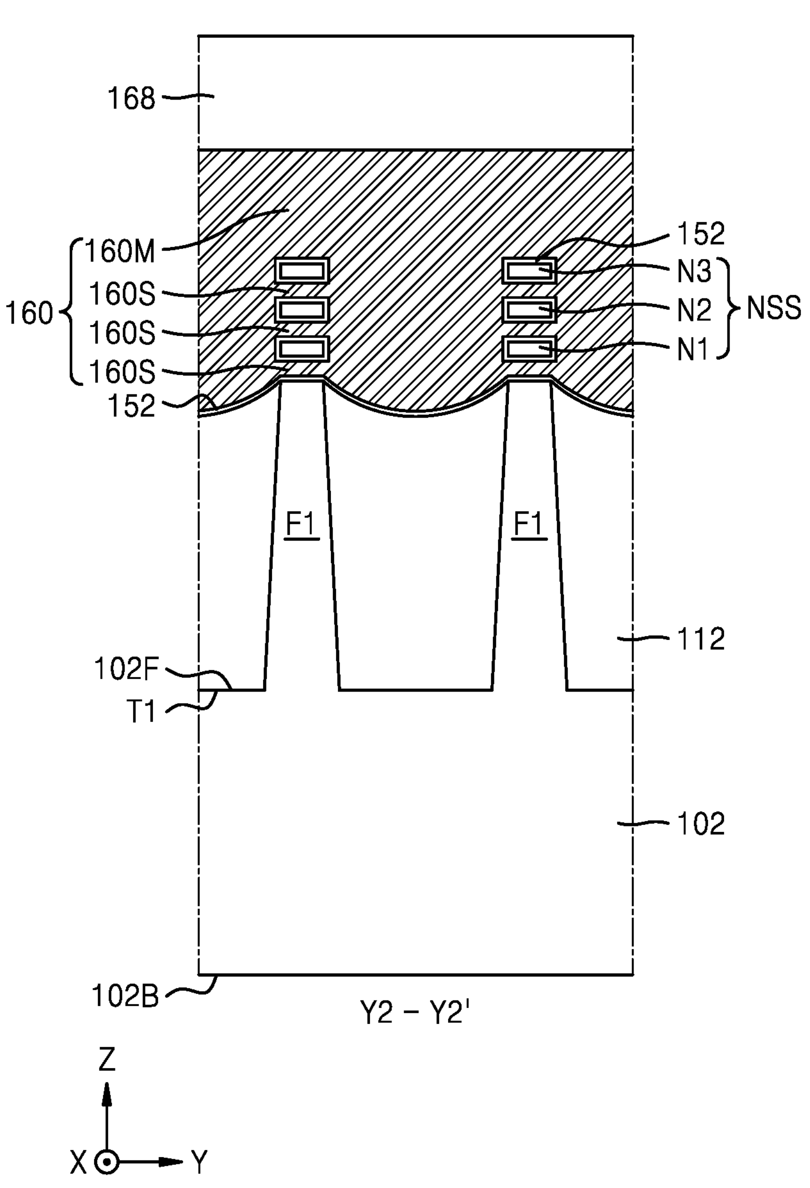
Figure 18A:
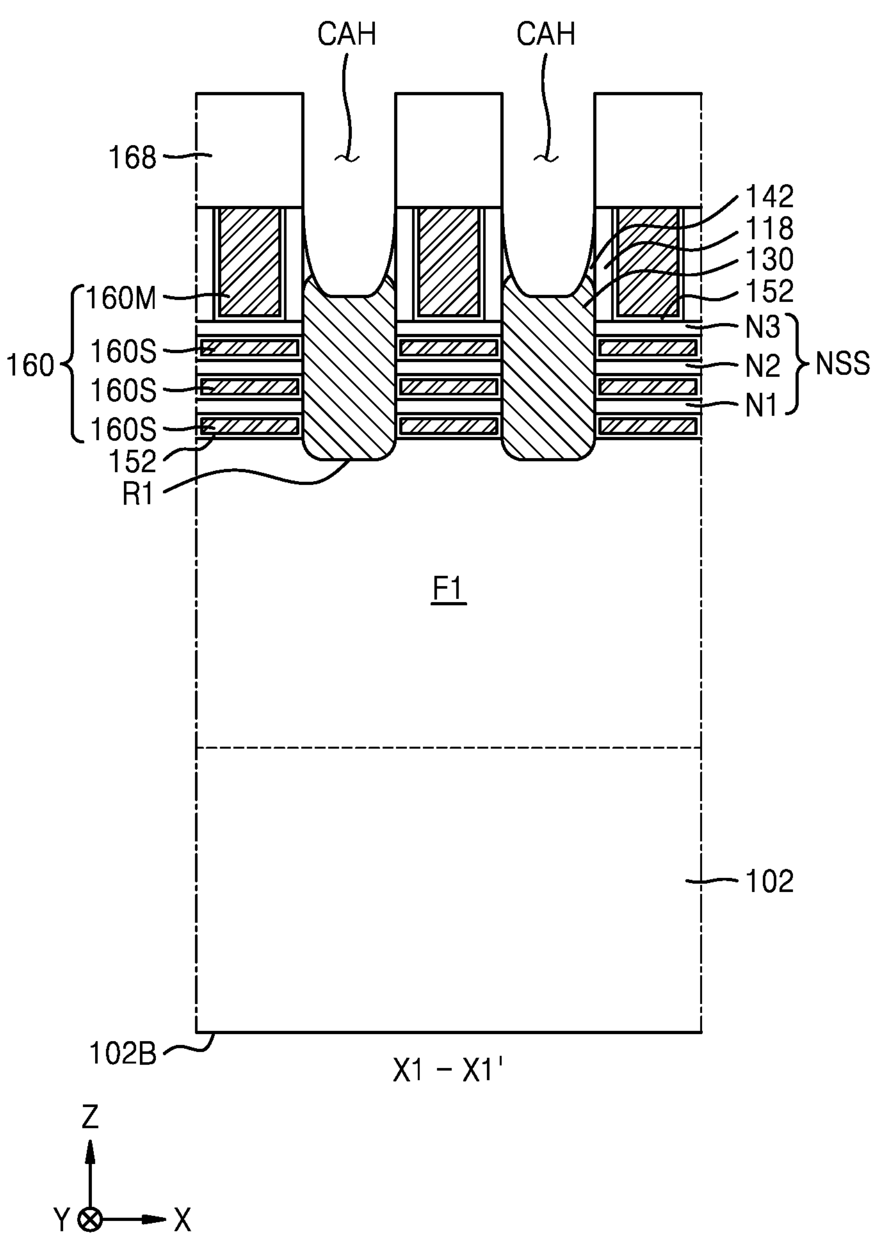
Figure 18B:
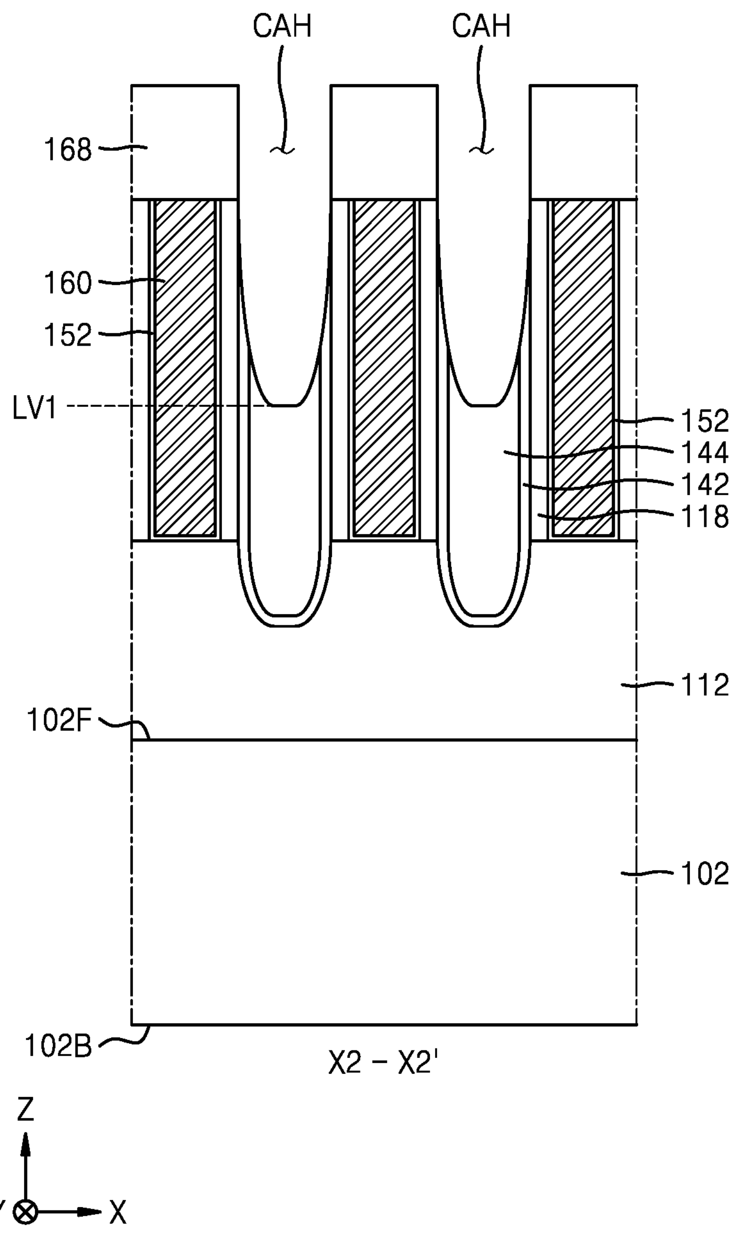
Figure 18C:
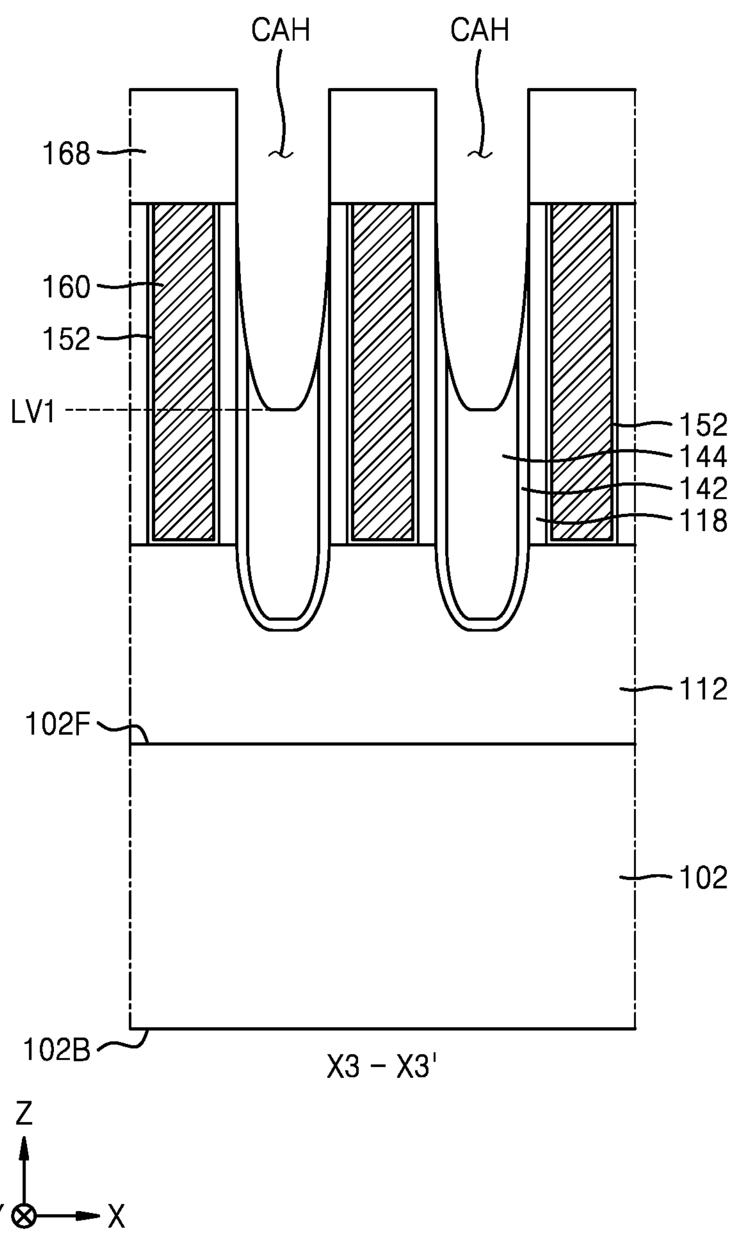
FIGS. 18C, 19C, 20C, 21C, 22C, and 23C are cross-sectional views respectively illustrating cross-sectional structures of a region corresponding to the cross-section taken along the line X3-X3' of FIG. 2, according to the sequence of processes.
Figure 18D:
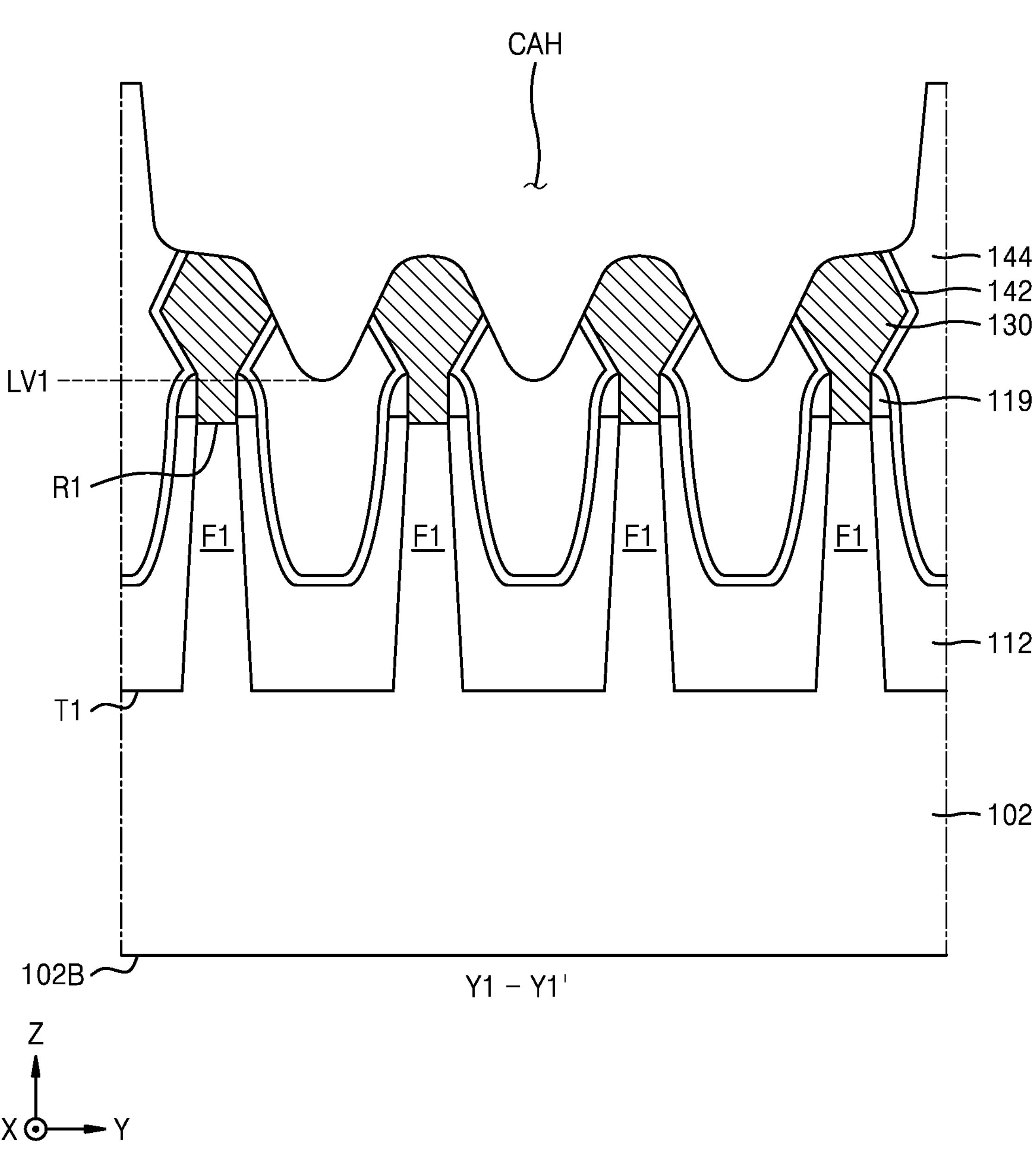
Figure 19A:
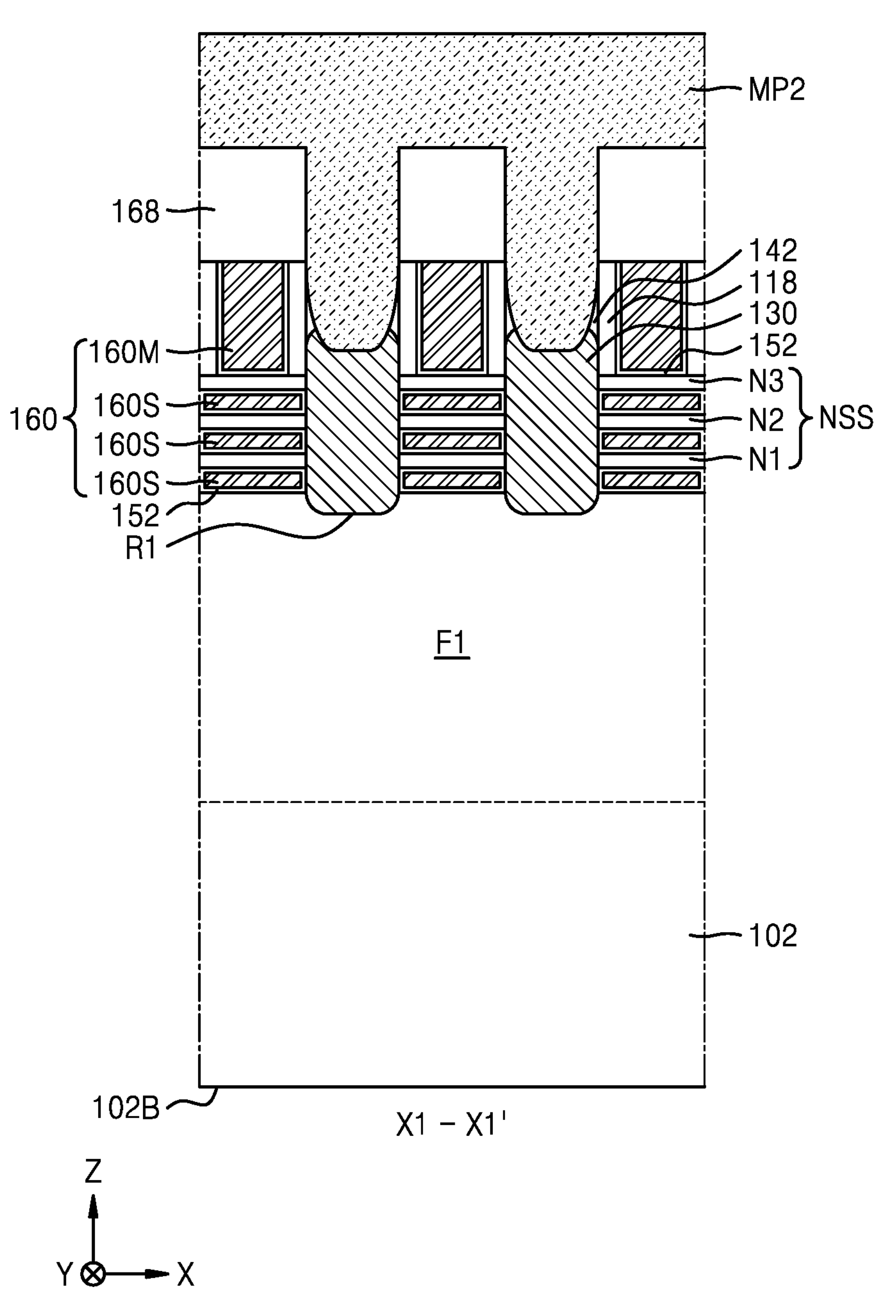
Figure 19B:
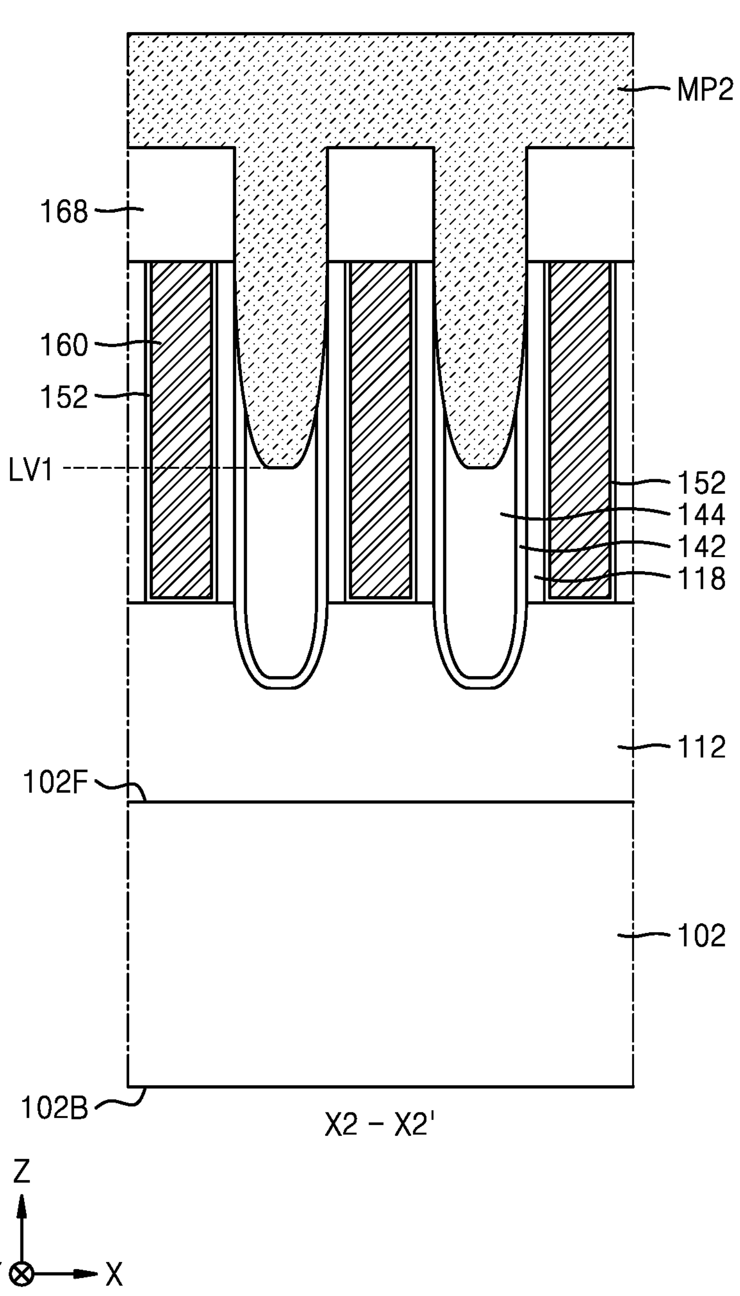
Figure 19C:
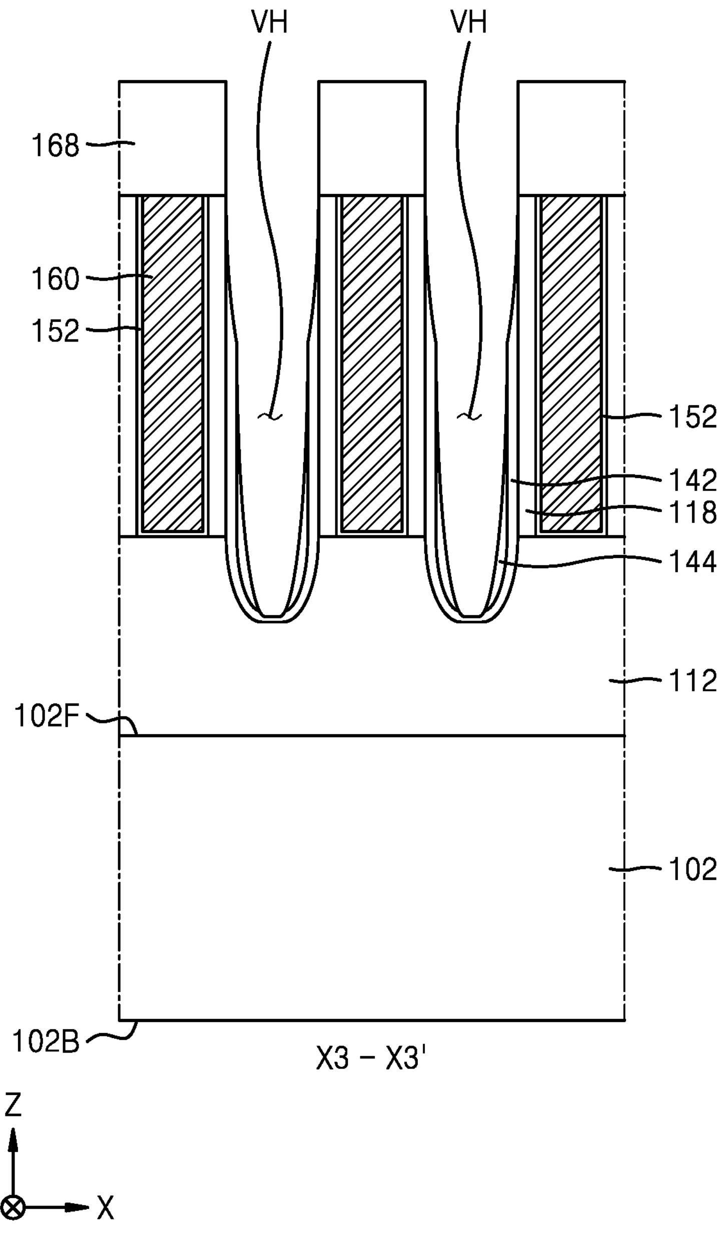
Figure 19D:
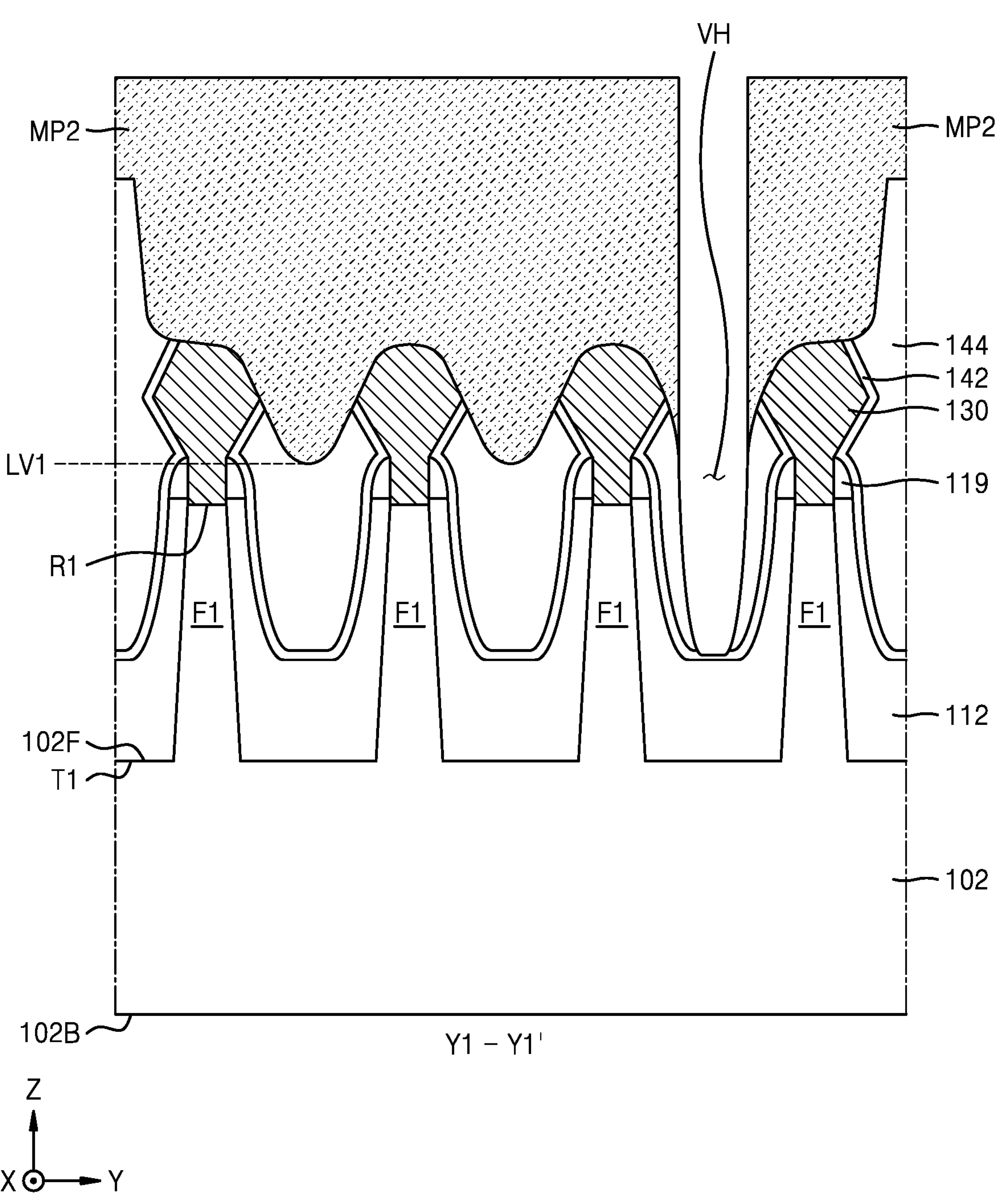
Figure 20A:
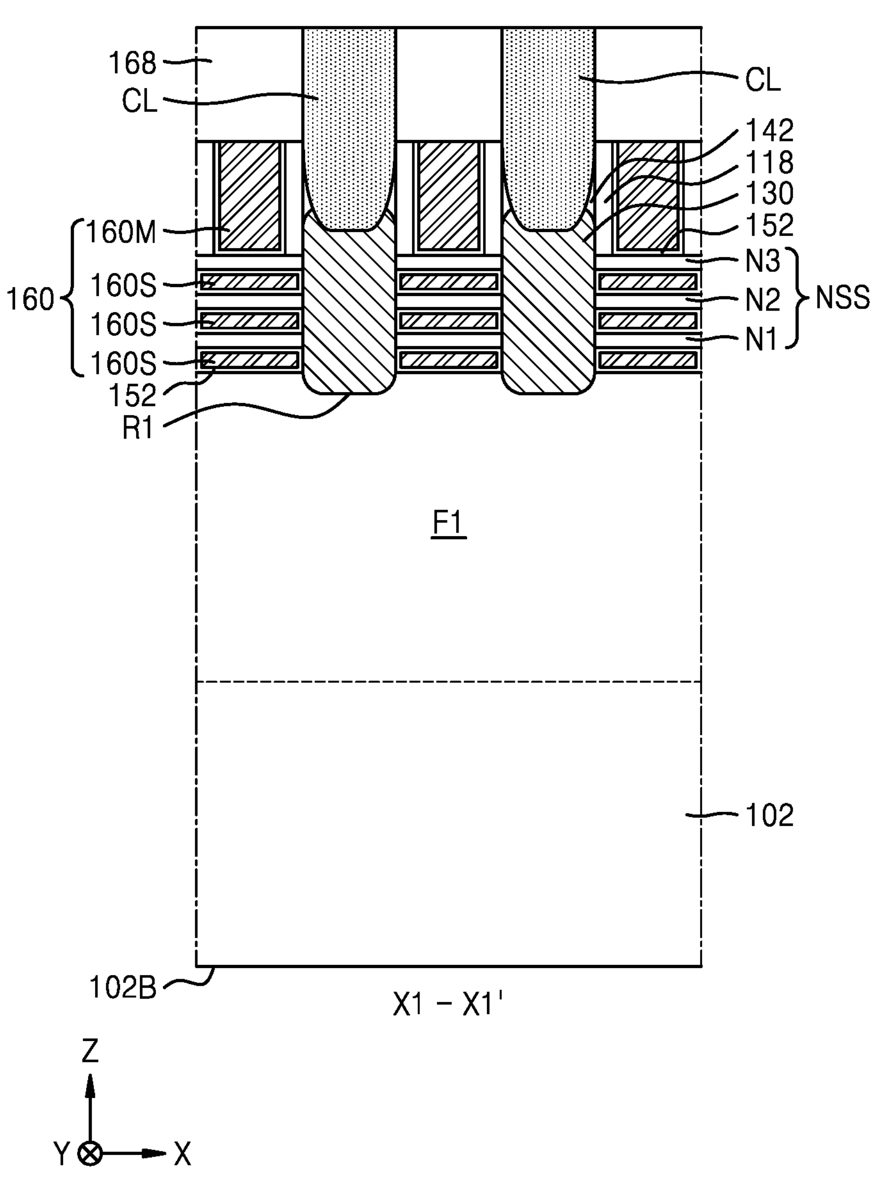
Figure 20B:
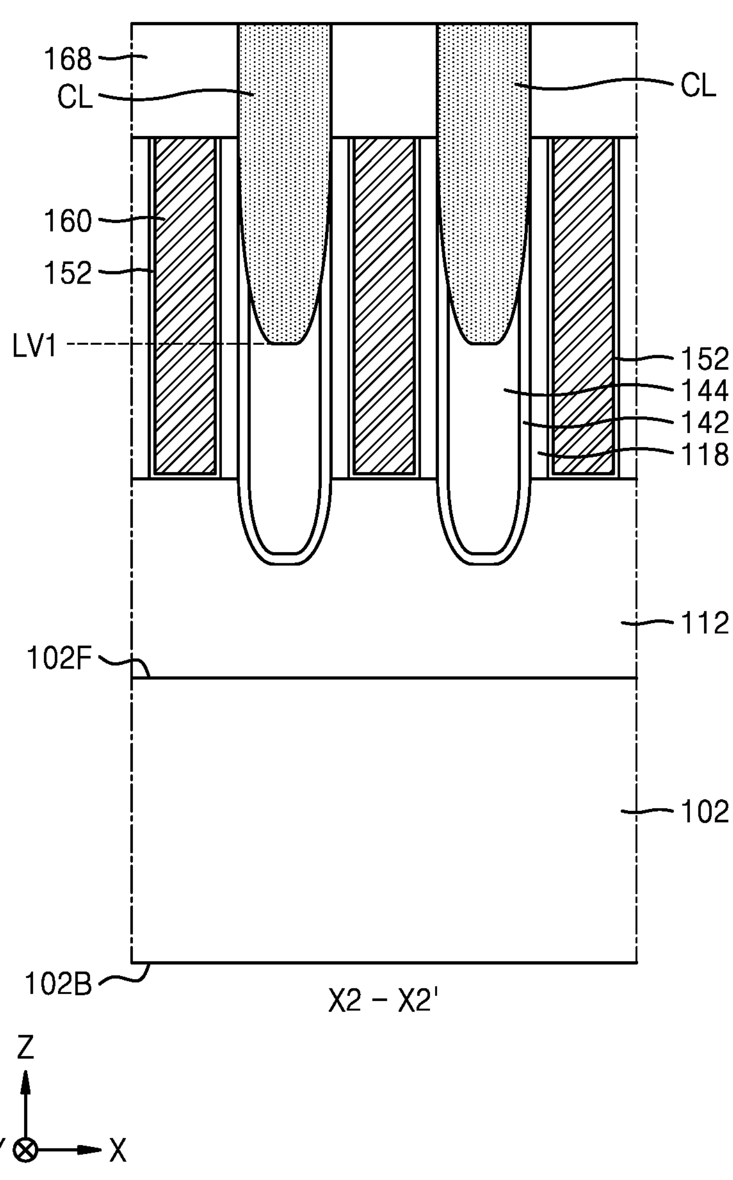
Figure 20C:
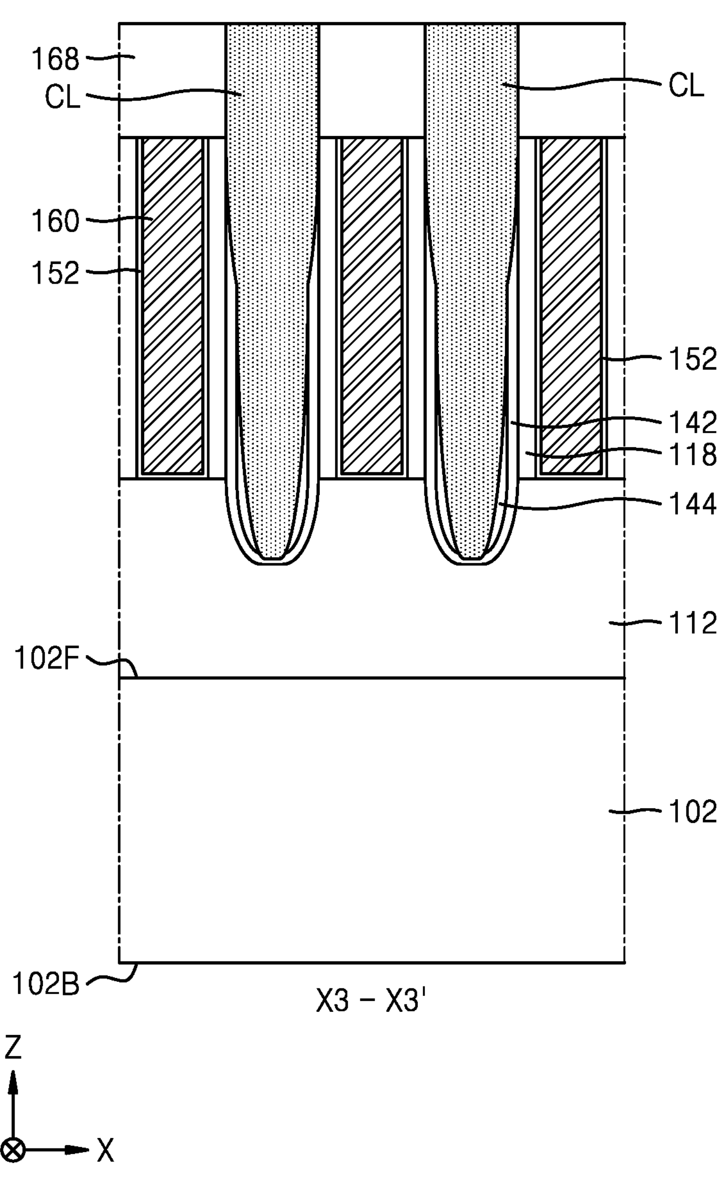
Figure 20D:
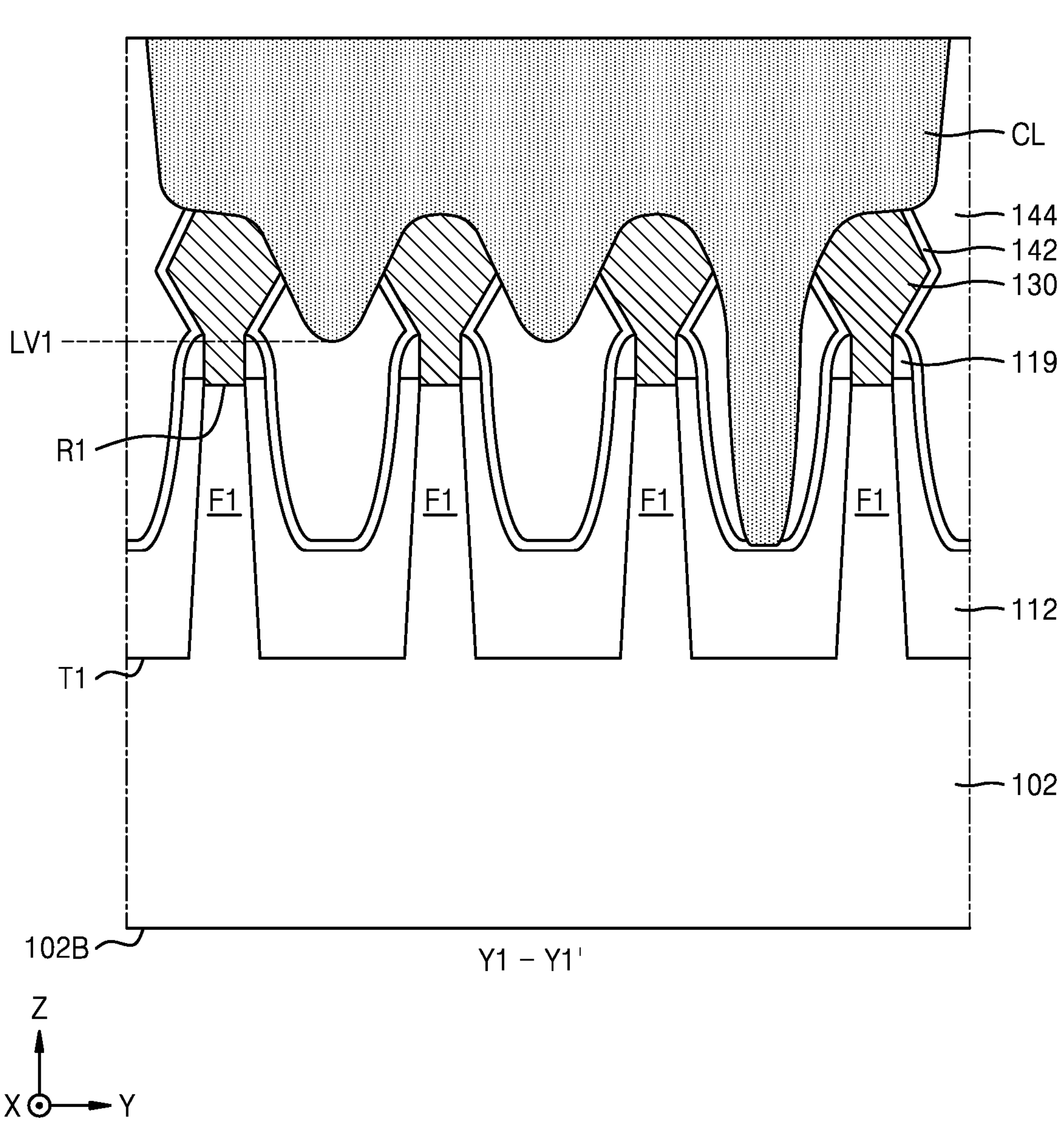
Figure 21A:
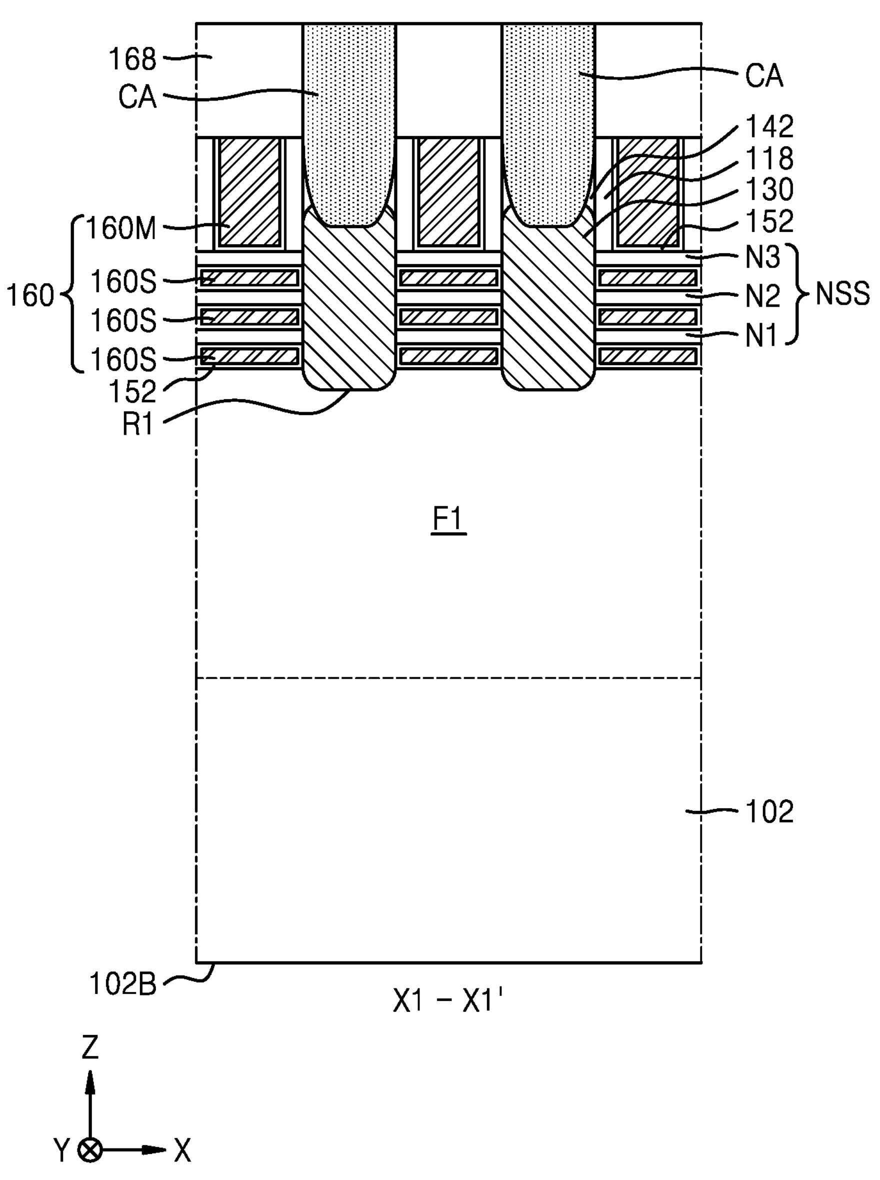
Figure 21B:
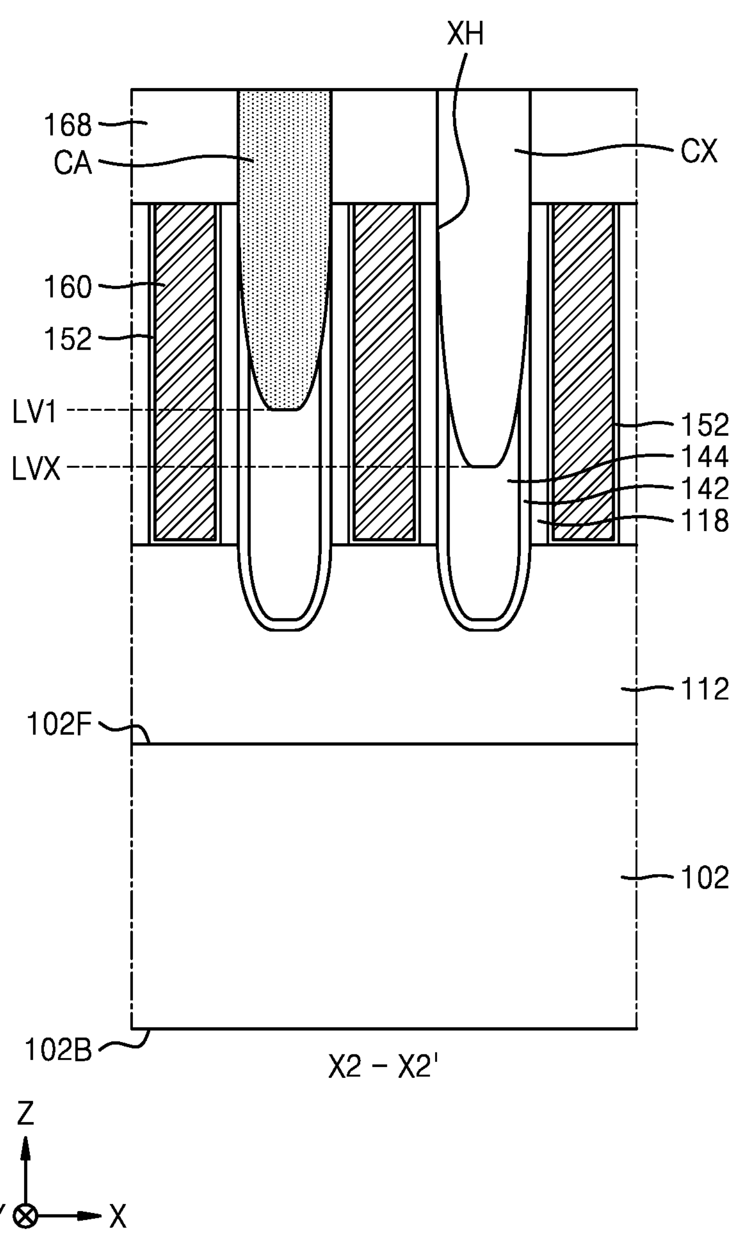
Figure 21C:
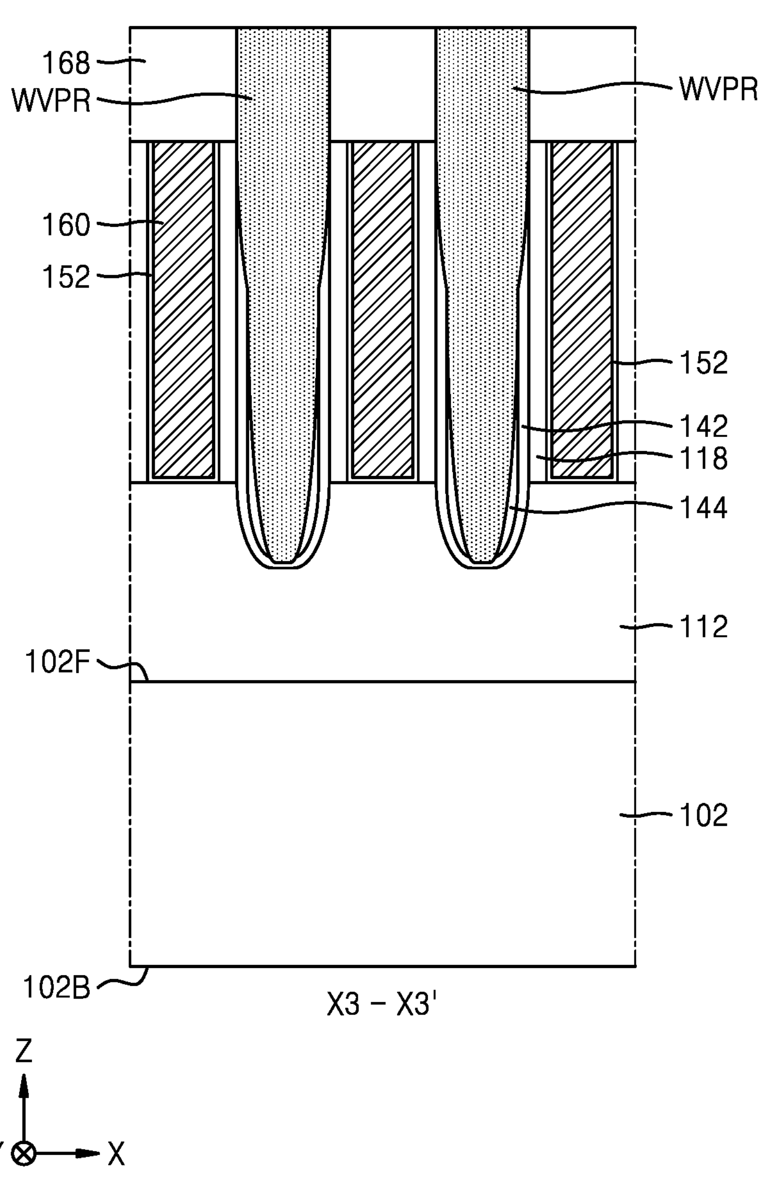
Figure 21D:
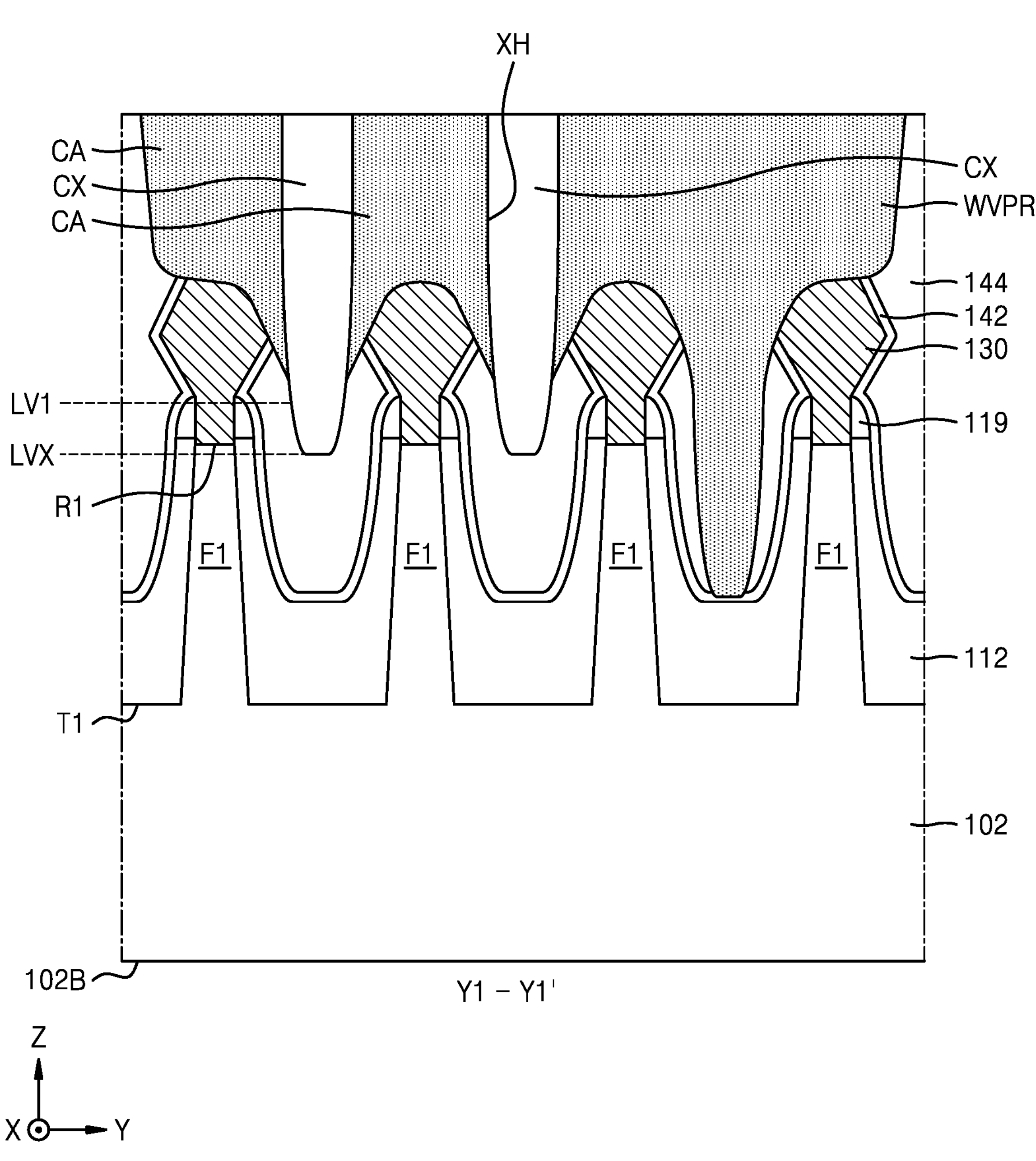
Figure 22A:
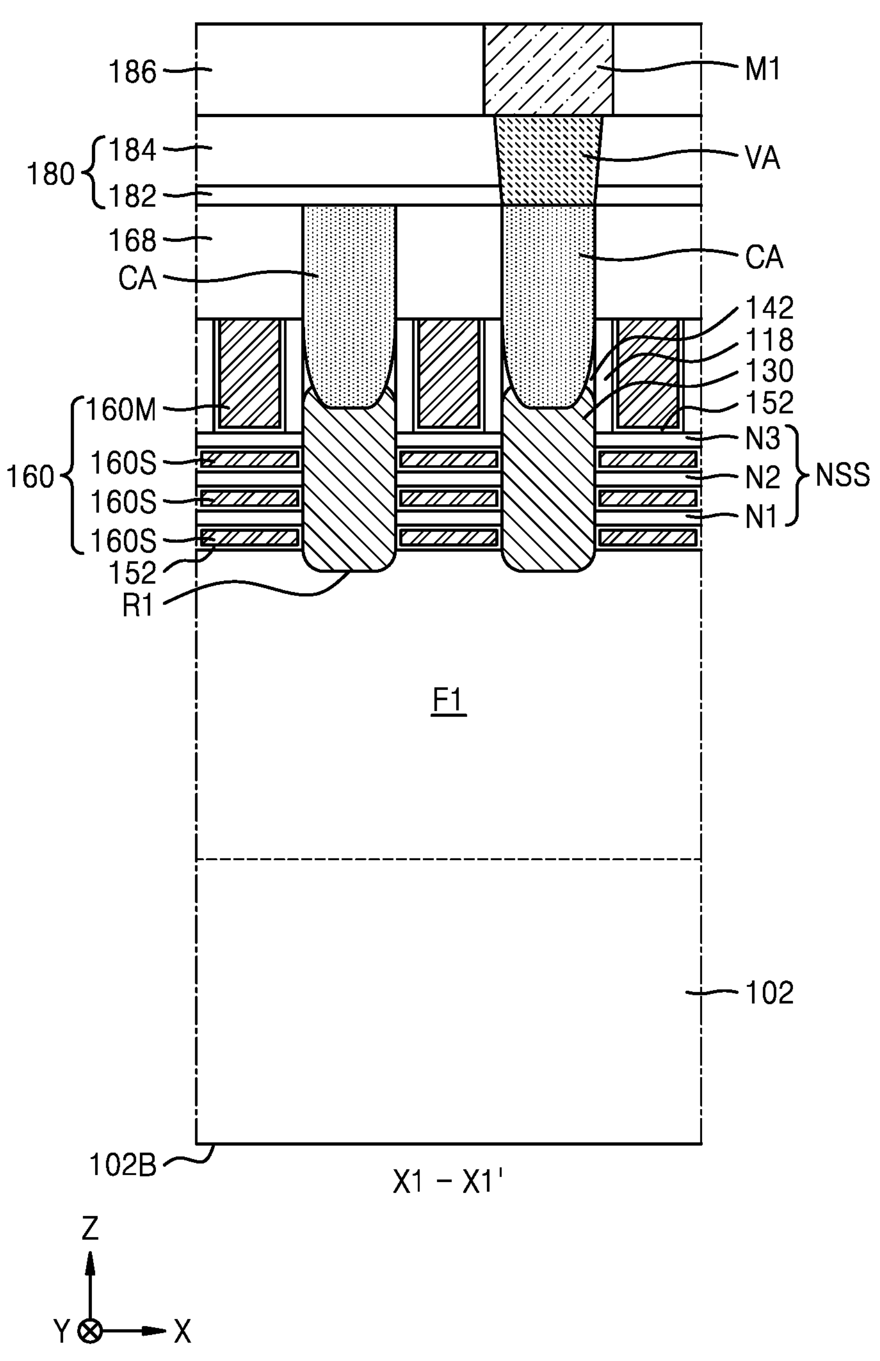
Figure 22B:
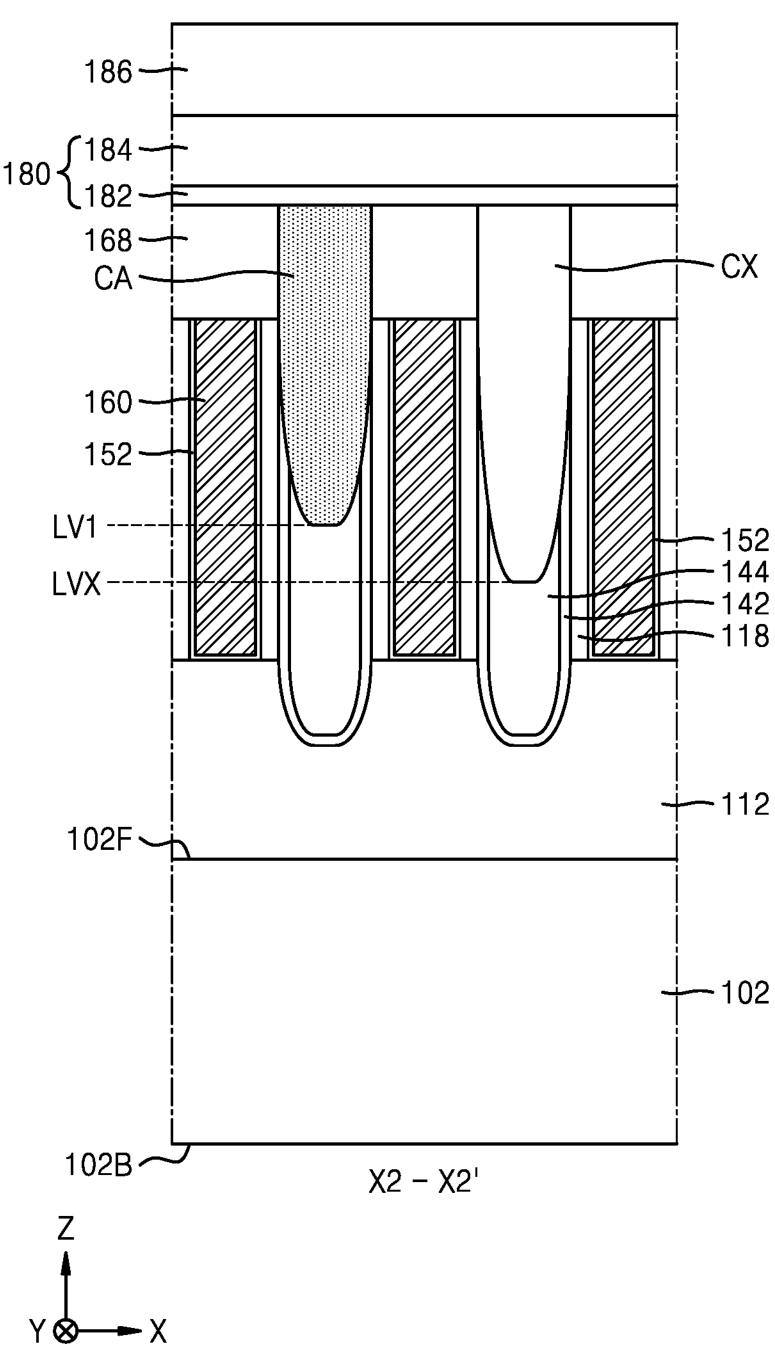
Figure 22C:
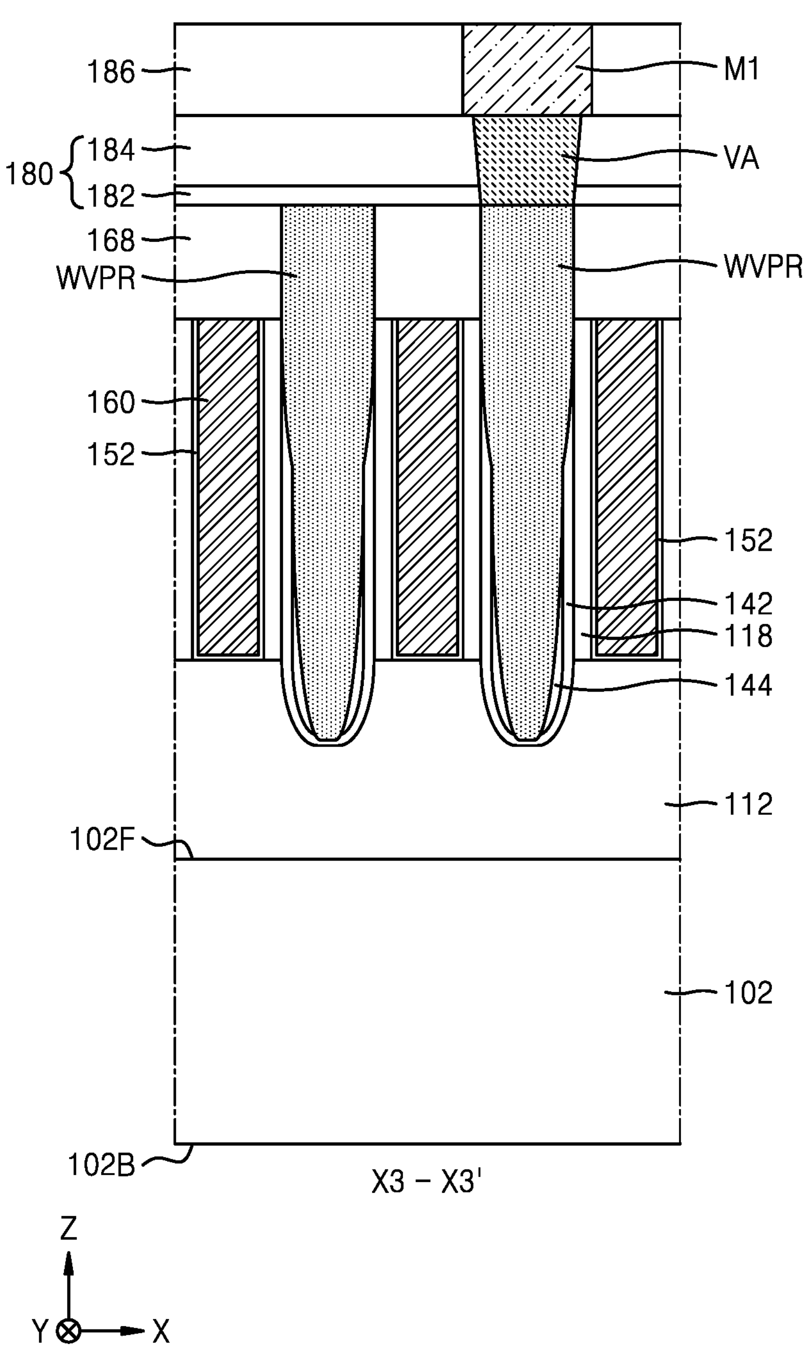
Figure 22D:
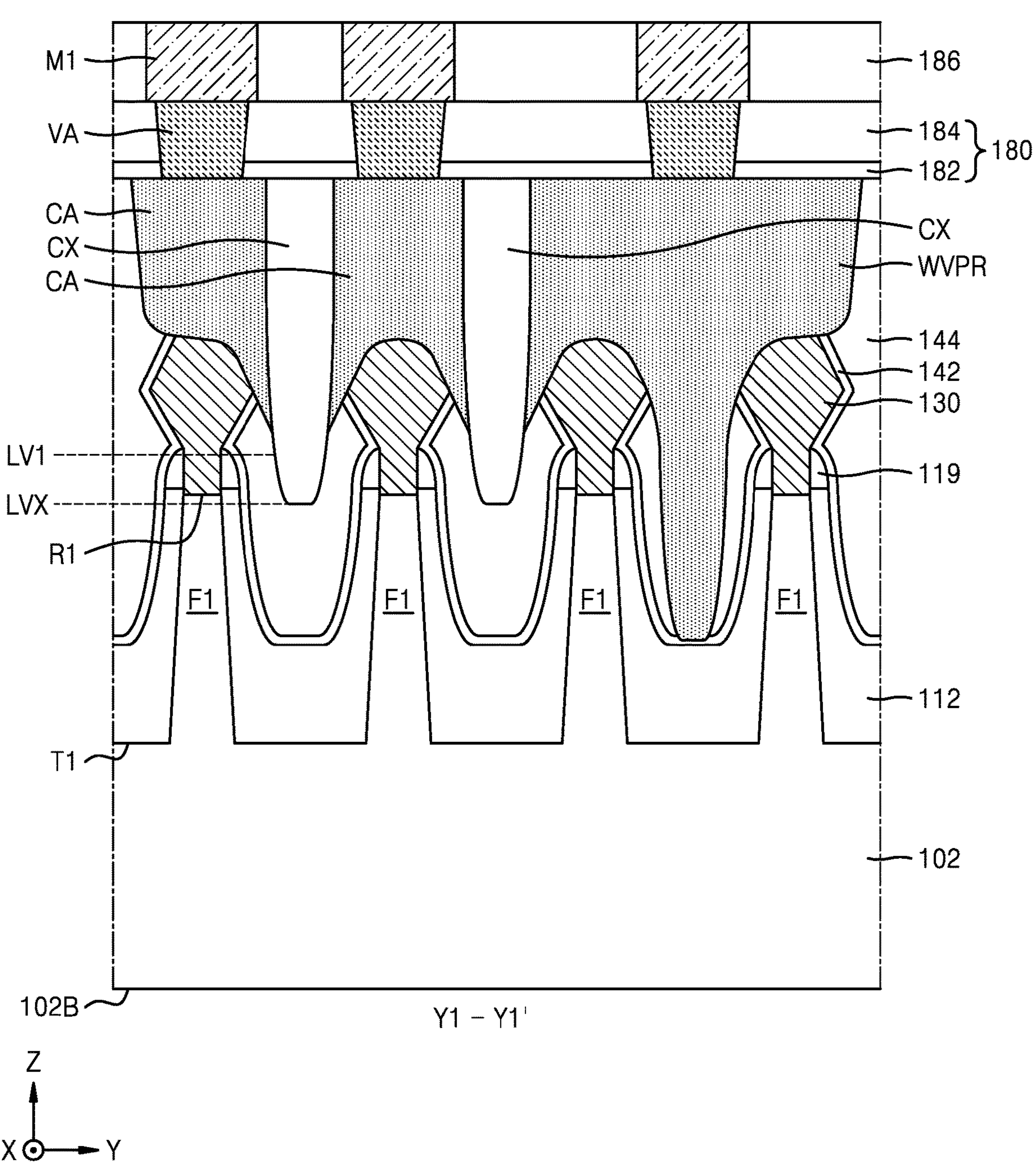

Referring to FIGS. 16A and 16B, a gate space GS may be prepared by removing the dummy gate layer D124 and the oxide film D122 thereunder from the resulting product of FIGS. 15A, 15B, and 15C, and the plurality of nanosheet stacks NSS may each be exposed by the gate space GS. Next, by removing the plurality of sacrificial semiconductor layers 104 remaining on the fin-type active region F1 through the gate space GS, the gate space GS may expand up to each space between the first nanosheet N1, the second nanosheet N2, and the third nanosheet N3 and a space between the first nanosheet N1 and the fin-type active region F1.

In some embodiments, to selectively remove the plurality of sacrificial semiconductor layers 104, a difference in etch selectivity between each of the first nanosheet N1, the second nanosheet N2, the third nanosheet N3, and the fin-type active region F1 and each of the plurality of sacrificial semiconductor layers 104 may be used. To selectively remove the plurality of sacrificial semiconductor layers 104, a liquid-phase or gas-phase etchant may be used. In some embodiments, to selectively remove the plurality of sacrificial semiconductor layers 104, a $CH_3COOH$-based etching solution, for example, an etching solution including a mixture of $CH_3COOH$, $HNO_3$, and HF, or an etching solution including a mixture of $CH_3COOH$, $H_2O_2$, and HF, may be used, but aspects of the inventive concept are not limited thereto.

Referring to FIGS. 17A, 17B, 17C, and 17D, in the resulting product of FIGS. 16A and 16B, the gate dielectric film 152 may be formed to cover respective exposed surfaces of the first nanosheet N1, the second nanosheet N2, the third nanosheet N3, and the fin-type active region F1. To form the gate dielectric film 152, an atomic layer deposition (ALD) process may be used.

Next, the gate line 160 may be formed on the gate dielectric film 152 to fill the gate space GS (see FIGS. 16A and 16B), followed by partially removing each of the gate line 160, the gate dielectric film 152, and the outer insulating spacer 118 from an upper surface thereof to reduce the height thereof, and then, the plurality of capping insulating patterns 168 may each be formed to cover the upper surface of each of the gate line 160, the gate dielectric film 152, and the outer insulating spacer 118.

Referring to FIGS. 18A, 18B, 18C, and 18D, in the resulting product of FIGS. 17A, 17B, 17C, and 17D, portions of an insulating structure including the insulating liner 142 and the inter-gate dielectric 144 in each space between the plurality of gate lines 160 may be etched, thereby forming a plurality of source/drain contact preliminary holes CAH to respectively expose the plurality of source/drain regions 130. While the etching process for forming the plurality of source/drain contact preliminary holes CAH is performed, at least portions of the plurality of source/drain regions 130, which are respectively exposed by the plurality of source/drain contact preliminary holes CAH, may be removed. After the plurality of source/drain contact preliminary holes CAH are formed, each of the plurality of source/drain regions 130 and the insulating structure including the insulating liner 142 and the inter-gate dielectric 144 may be exposed at an inner surface of each of the plurality of source/drain contact preliminary holes CAH. The vertical level LV1 of the lowermost surface in the inner surface of each of the plurality of source/drain contact preliminary holes CAH may be between two adjacent source/drain regions 130 from among the plurality of source/drain regions 130 respectively exposed at the inner surfaces of the plurality of source/drain contact preliminary holes CAH. The vertical level LV1 of the lowermost surface of each of the plurality of source/drain contact preliminary holes CAH may be closer to the substrate 102 than the uppermost surface of each of the plurality of source/drain regions 130. The inter-gate dielectric 144 may be exposed at the vertical level LV1 of the lowermost surface in each of the plurality of source/drain contact preliminary holes CAH.

In some embodiments, when the etching process for forming the plurality of source/drain contact preliminary holes CAH is performed, an etching process atmosphere may be controlled such that the plurality of source/drain contact preliminary holes CAH are respectively self-aligned by the plurality of capping insulating patterns 168.

Referring to FIGS. 19A, 19B, 19C, and 19D, a second mask pattern MP2 may be formed on the resulting product of FIGS. 18A, 18B, 18C, and 18D. Portions of the inter-gate dielectric 144 may be exposed, by the second mask pattern MP2, at the vertical level LV1 of the lowermost surface in each of the plurality of source/drain contact preliminary holes CAH. The second mask pattern MP2 may include a material having etch selectivity to the inter-gate dielectric 144 and the source/drain region 130. For example, the inter-gate dielectric 144 may include, but is not limited to, a silicon nitride film, a spin-on hardmask (SOH), or a combination thereof.

Next, the exposed portions of the inter-gate dielectric 144 may be etched by using the second mask pattern MP2 as an etch mask, thereby forming a via hole VH to extend lengthwise in the vertical direction (Z direction) toward the substrate 102. In some embodiments, when the etching process for forming the via hole VH is performed, an etching process atmosphere may be controlled such that the insulating liner 142 functions as an etch stop film.

In some embodiments, when the etching process for forming the via hole VH is performed, the etching process atmosphere may be controlled such that the frontside surface 102F of the substrate 102 functions as an etch stop film. In this case, unlike the example shown in FIG. 19D, the via hole VH may be formed to pass through the device isolation film 112 in the vertical direction (Z direction), and after the via hole VH is formed, the substrate 102 may be exposed by the via hole VH.

Referring to FIGS. 20A, 20B, 20C, and 20D, the second mask pattern MP2 may be removed from the resulting product of FIGS. 19A, 19B, 19C, and 19D. As a result, the plurality of source/drain contact preliminary holes CAH (see FIGS. 18A, 18B, 18C, and 18D) may be emptied again. The via hole VH may have a shape interconnected with one of the plurality of source/drain contact preliminary holes CAH.

Next, a conductive layer CL may fill the via hole VH and the plurality of source/drain contact preliminary holes CAH. To form the conductive layer CL, by depositing a conductive material on the resulting product of FIGS. 19A, 19B, 19C, and 19D, the conductive layer CL may be formed first to fill the via hole VH and the plurality of source/drain contact preliminary holes CAH and cover the upper surface of the inter-gate dielectric 144, followed by planarizing the obtained resulting product, whereby the conductive layer CL may be partially removed to leave only portions of the conductive layer CL, which fill the via hole VH and the plurality of source/drain contact preliminary holes CAH, and the upper surface of the inter-gate dielectric 144 may be exposed again. To perform the planarization, a chemical mechanical polishing (CMP) process may be used, but aspects of the inventive concept are not limited thereto.

In some embodiments, the conductive layer CL may include only a metal plug including a single metal. In some embodiments, the conductive layer CL may include a metal plug and a conductive barrier film surrounding the metal plug. The metal plug may include, but is not limited to, molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. The conductive barrier film may include a metal or a conductive metal nitride. For example, the conductive barrier film may include, but is not limited to, Ti, Ta, W, TiN, TaN, WN, WCN, TiSiN, TaSIN, WSiN, or a combination thereof.

In some embodiments, after the plurality of source/drain contact preliminary holes CAH are formed to respectively expose the plurality of source/drain regions 130 according to the description made with reference to FIGS. 18A, 18B, 18C, and 18D and before the second mask pattern MP2 is formed according to the description made with reference to FIGS. 19A, 19B, 19C, and 19D, or after the second mask pattern MP2 is removed according to the description made with reference to FIGS. 20A, 20B, 20C, and 20D and before the conductive layer CL fills the via hole VH and the plurality of source/drain contact preliminary holes CAH, a process of forming a metal silicide film (not shown) on an exposed surface of each of the plurality of source/drain regions 130 in the plurality of source/drain contact preliminary holes CAH may be further performed. For example, to form the metal silicide film, a metal liner (not shown), which conformally covers the exposed surface of each of the plurality of source/drain regions 130, may be formed and then heat-treated, thereby deriving a reaction between the plurality of source/drain regions 130 and a metal constituting the metal liner. After the metal silicide film is formed, the remaining portion of the metal liner may be removed. During the process of forming the metal silicide film, a portion of each of the plurality of source/drain regions 130 may be removed. In some embodiments, when the metal silicide film includes a titanium silicide film, the metal liner may include a Ti film.

Referring to FIGS. 21A, 21B, 21C, and 21D, in the resulting product of FIGS. 20A, 20B, 20C, and 20D, a plurality of contact isolation holes XH may be formed by etching portions of the conductive layer CL and portions of the inter-gate dielectric 144 thereunder, thereby separating the conductive layer CL into the plurality of source/drain contacts CA. Each of the plurality of contact isolation holes XH may be formed to completely pass through the conductive layer CL and pass through only a portion of the inter-gate dielectric 144, in the vertical direction (Z direction). The length of each of the plurality of contact isolation holes XH in the vertical direction (Z direction) may be greater than the thickness of the conductive layer CL in the vertical direction (Z direction) at a position corresponding thereto. Next, the plurality of contact isolation insulating films CX may be formed by filling the plurality of contact isolation holes XH with an insulating material. To form the plurality of contact isolation insulating films CX, an isolation insulating film may be formed first to fill the plurality of contact isolation holes XH and cover the upper surface of the inter-gate dielectric 144, followed by planarizing the obtained resulting product, whereby the isolation insulating film may be partially removed to leave only portions of the isolation insulating film, which respectively fill the plurality of contact isolation holes XH, and the upper surface of the inter-gate dielectric 144 may be exposed again. To perform the planarization, a CMP process may be used, but aspects of the inventive concept are not limited thereto. In some embodiments, the isolation insulating film may include a silicon nitride film, a silicon oxynitride film, a silicon oxycarbide film, or a combination thereof. In some embodiments, the isolation insulating film may include an air gap.

Referring to FIGS. 22A, 22B, 22C, and 22D, in the resulting product of FIGS. 21A, 21B, 21C, and 21D, the etch stop film 182 and the upper insulating film 184 may be formed in the stated order to cover the upper surface of each of the plurality of source/drain contacts CA, the plurality of contact isolation insulating films CX, the plurality of capping insulating patterns 168, and the inter-gate dielectric 144, thereby forming the upper insulating structure 180.

Next, the plurality of source/drain via contacts VA, which pass through the upper insulating structure 180 in the vertical direction (Z direction) to be respectively connected to the plurality of source/drain contacts CA, and the gate contact CB (see FIG. 3E), which passes through the upper insulating structure 180 and the capping insulating pattern 168 in the vertical direction (Z direction) to be connected to the gate line 160, may be formed. The source/drain via contact VA and the gate contact CB may be simultaneously formed or may be separately formed by separate processes from each other. The order of forming the source/drain via contact VA and the gate contact CB is not particularly limited.

Next, the interlayer dielectric 186, which covers the upper insulating structure 180, and the plurality of upper wiring layers M1, which pass through the interlayer dielectric 186, may be formed. The plurality of upper wiring layers M1 may include an upper wiring layer M1 connected to the source/drain via contact VA and an upper wiring layer M1 connected to the gate contact CB.

Referring to FIGS. 23A, 23B, 23C, and 23D, in the resulting product of FIGS. 22A, 22B, 22C, and 22D, a frontside wiring structure (not shown) may be formed on the interlayer dielectric 186 and the plurality of upper wiring layers M1. Next, a portion of the substrate 102 may be removed from the backside surface 102B of the substrate 102. To remove the portion of the substrate 102, at least one process selected from a mechanical grinding process, a CMP process, a wet etching process, and a combination thereof may be used. After the portion of the substrate 102 is removed, the backside surface 102B of the substrate 102 may be closer to the device isolation film 112.

Figure 23A:
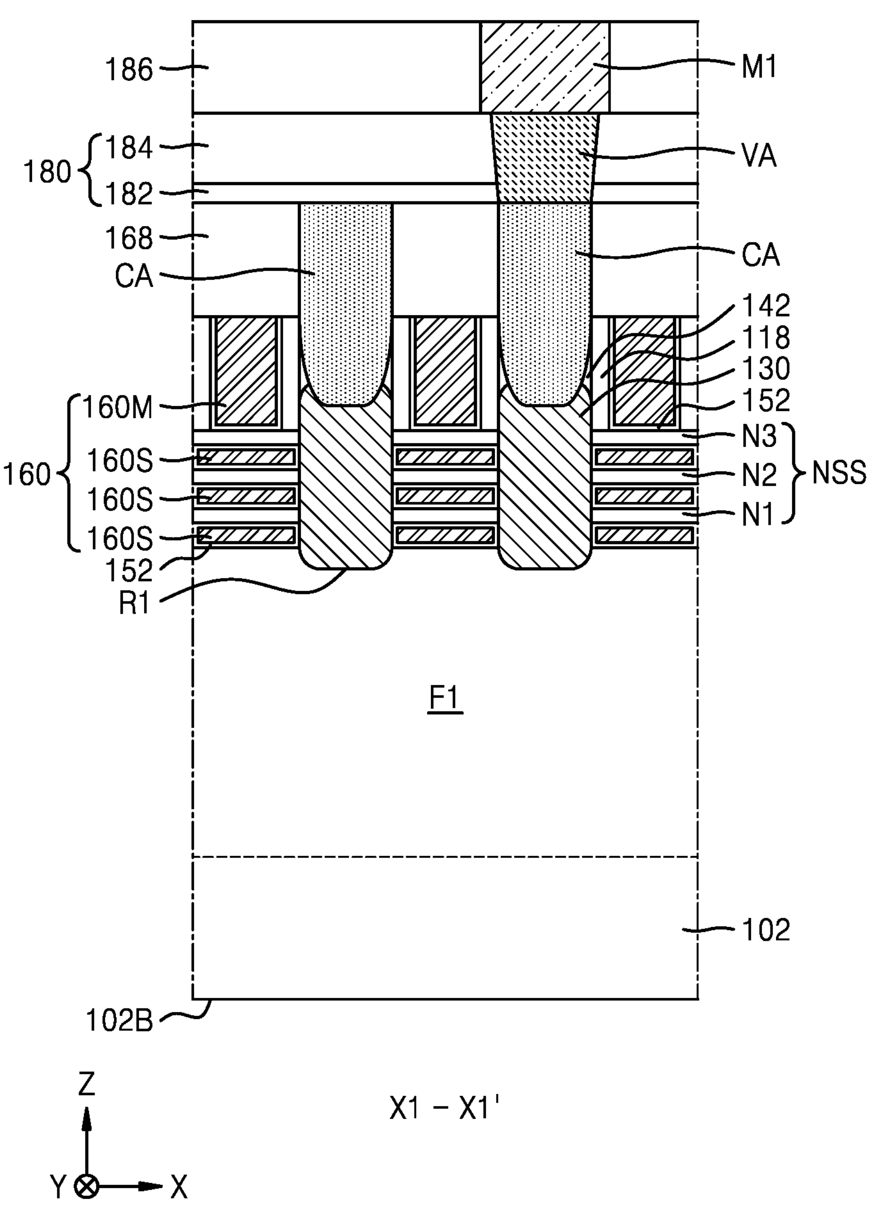
Figure 23B:
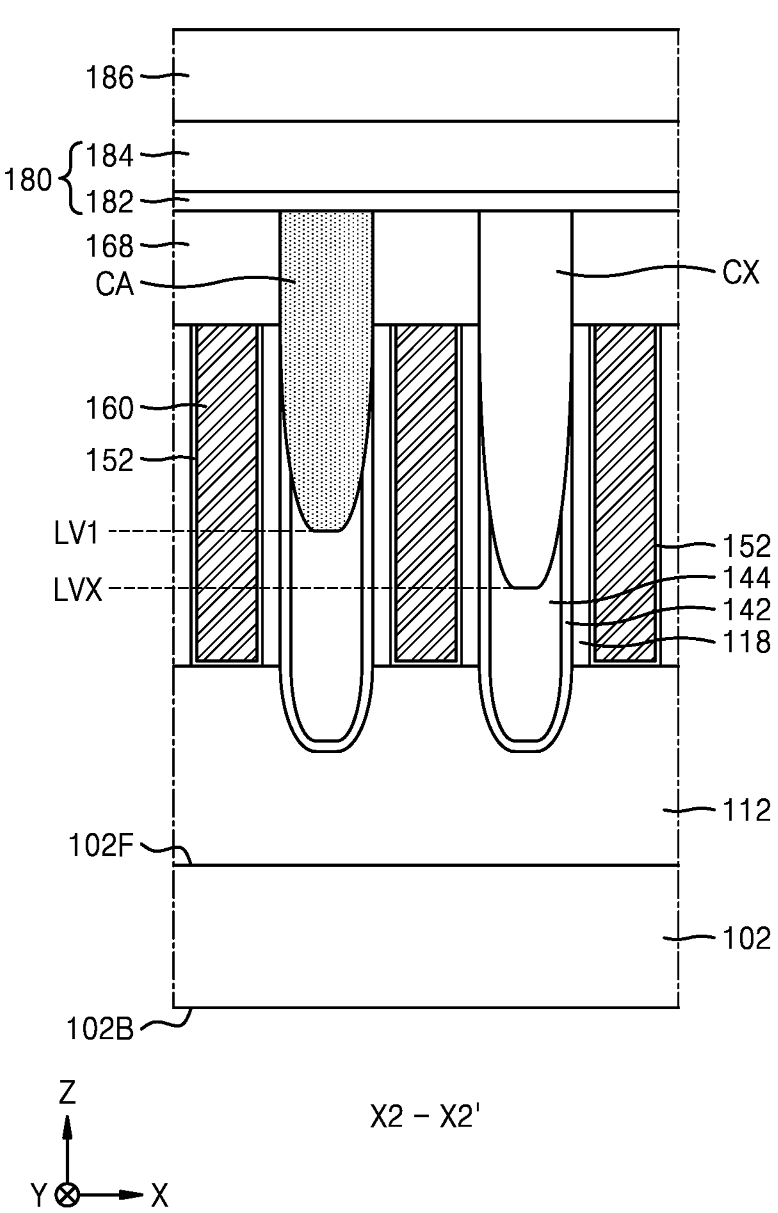
Figure 23C:
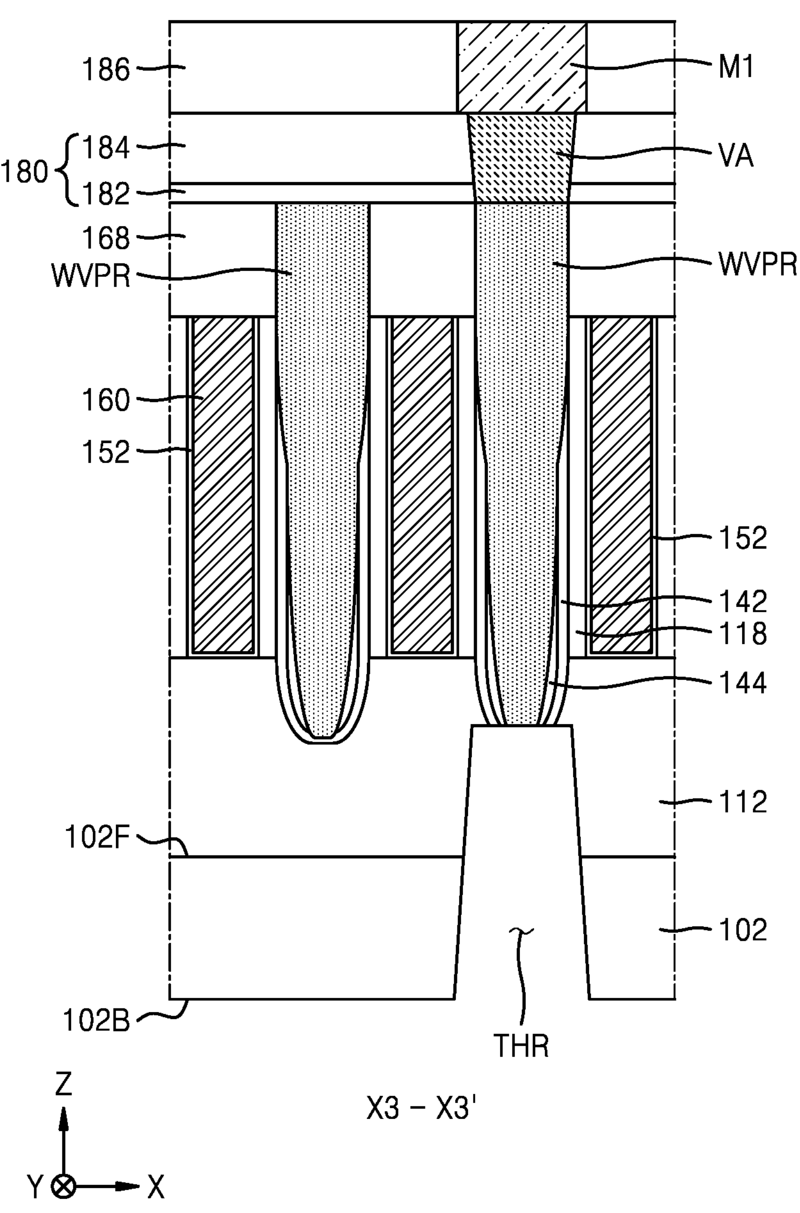
Figure 23D:
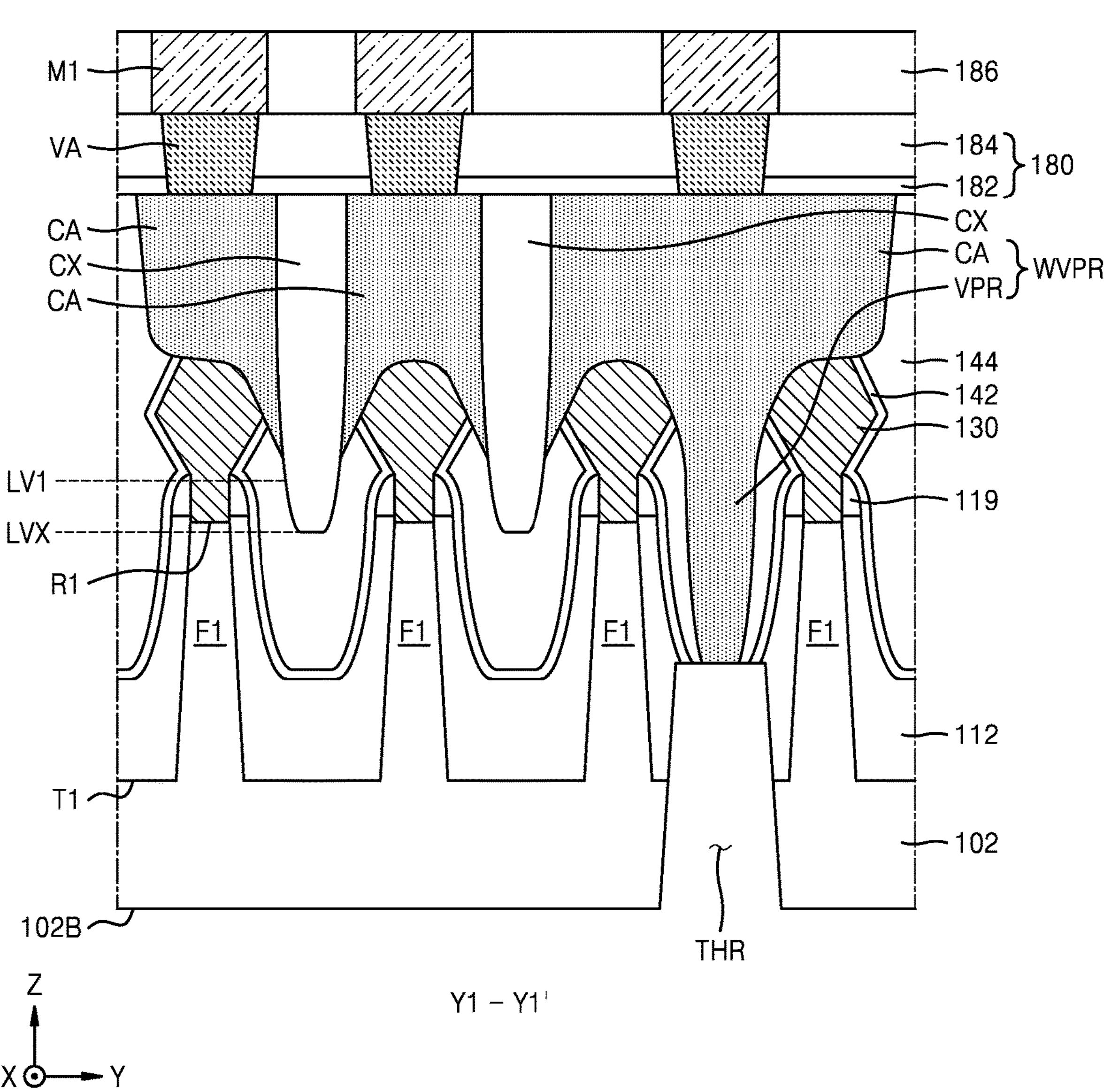

Next, as shown in FIGS. 23C and 23D, a portion of the substrate 102 may be etched from the backside surface 102B of the substrate 102, thereby forming a through-region THR to pass through the substrate 102 in the vertical direction (Z direction). In some embodiments, to form the through-region THR, the portion of the substrate 102 may be etched in a plasma atmosphere. After the through-region THR is formed, the via power rail VPR may be exposed by the through-region THR.

Next, as shown in FIGS. 3A to 3E, in the resulting product of FIGS. 23A, 23B, 23C, and 23D, the insulating liner 105 may be formed in the through-region THR. Next, a power rail wiring line MPR may be formed to fill the through-region THR that is defined by the insulating liner 105, followed by forming the backside insulating film 109 on the backside surface 102B of the substrate 102 and the power rail wiring line MPR, and then, the backside power rail BPR may be formed to pass through the backside insulating film 109 in the vertical direction (Z direction) to be connected to the power rail wiring line MPR. Next, according to the need, a backside wiring structure (not shown) may be formed on the backside power rail BPR and the backside insulating film 109, thereby fabricating the integrated circuit device 100 described with reference to FIGS. 2 and 3A to 3F.

Heretofore, although the example of the method of fabricating the integrated circuit devices 100 shown in FIGS. 2 and 3A to 3E has been described with reference to FIGS. 11A to 23D, it will be understood by those of ordinary skill in the art that, by making various modifications and changes to the example described with reference to FIGS. 11A to 23D without departing from the spirit and scope of the aspects of the inventive concept, the integrated circuit devices 200, 300, 400, 500, and 600 described with reference to FIGS. 4 to 9B and integrated circuit devices having various structures modified and changed therefrom may be fabricated.

For example, to fabricate the integrated circuit device 200 shown in FIG. 5, similar processes to those described with reference to FIGS. 11A to 23D may be performed. However, in the process described with reference to FIGS. 21A, 21B, 21C, and 21D, when the etching process for forming the plurality of contact isolation holes XH is performed, the relative amount of etching of the plurality of capping insulating patterns 168 may be controlled to an appropriate range, whereby each of the plurality of capping insulating patterns 168, which are respectively left around the plurality of contact isolation holes XH after the plurality of contact isolation holes XH are formed, may have a decreasing width in the first horizontal direction (X direction) with the increasing distance from the substrate 102. Next, the integrated circuit device 200 shown in FIG. 5 may be fabricated by performing subsequent processes.

To fabricate the integrated circuit device 400 shown in FIG. 7, similar processes to those described with reference to FIGS. 11A to 23D may be performed. However, in the process described with reference to FIGS. 20A, 20B, 20C, and 20D, a structure including the conductive barrier film B4 and the metal plug M4 may be formed as the conductive layer CL. Next, the integrated circuit device 400 shown in FIG. 7 may be fabricated by performing the processes after the process described with reference to FIGS. 21A, 21B, 21C, and 21D.

To fabricate the integrated circuit device 500 shown in FIG. 8, similar processes to those described with reference to FIGS. 11A to 23D may be performed. However, in the process described with reference to FIGS. 20A, 20B, 20C, and 20D, a sacrificial film may be formed instead of the conductive layer CL, and then, the process described with reference to FIGS. 21A, 21B, 21C, and 21D may be performed. Next, before the process described with reference to FIGS. 22A, 22B, 22C, and 22D is performed, the sacrificial film may be substituted with the plurality of source/drain contacts CA50. To this end, the sacrificial film may be removed, and then, the conductive barrier film B5 and the metal plug M5 may be formed in the stated order in each of the plurality of source/drain contact preliminary holes CAH, which are respectively defined by the plurality of contact isolation insulating films CX. Next, the integrated circuit device 500 shown in FIG. 8 may be fabricated by performing the processes after the process described with reference to FIGS. 22A, 22B, 22C, and 22D.

While aspects of the inventive concept have been particularly shown and described with reference to embodiments thereof, it will be understood that various changes in form and details may be made therein without departing from the spirit and scope of the following claims.

What is claimed is:

1. An integrated circuit device comprising:

a pair of fin-type active regions protruding from a substrate and extending lengthwise in a first horizontal direction, the pair of fin-type active regions being apart from each other in a second horizontal direction that is perpendicular to the first horizontal direction;

a pair of source/drain regions respectively arranged one-to-one on the pair of fin-type active regions;

a device isolation film covering both sidewalls of each of the pair of fin-type active regions;

an insulating structure covering the pair of source/drain regions and the device isolation film;

a pair of source/drain contacts respectively arranged on the pair of source/drain regions to be connected one-to-one to the pair of source/drain regions, the pair of source/drain contacts being apart from each other in the second horizontal direction; and a contact isolation insulating film arranged between the pair of source/drain contacts in the second horizontal direction and having a lower surface that is closer to the substrate than a lower surface of each of the pair of source/drain contacts, wherein at least one of the pair of source/drain contacts comprises a first portion, which is arranged between one source/drain region selected from the pair of source/drain regions and the contact isolation insulating film in the second horizontal direction and extends in a vertical direction toward the substrate along a surface of the contact isolation insulating film.

2. The integrated circuit device of claim 1, wherein each of the pair of source/drain contacts is in contact with a sidewall of the contact isolation insulating film, and the pair of source/drain contacts respectively have asymmetrical structures with respect to each other about the contact isolation insulating film.

3. The integrated circuit device of claim 1, further comprising:

a power rail wiring line passing through the substrate and the device isolation film in the vertical direction from a backside surface of the substrate; and a via power rail arranged between a first source/drain contact, which is selected from the pair of source/drain contacts, and the power rail wiring line to pass through the insulating structure and extend lengthwise in the vertical direction, the via power rail being integrally connected with the first source/drain contact, which is connected to a first source/drain region selected from the pair of source/drain regions.

4. The integrated circuit device of claim 1, further comprising a via power rail integrally connected with a first source/drain contact selected from the pair of source/drain contacts, the via power rail passing through the insulating structure to extend lengthwise in the vertical direction, wherein a via power rail structure, comprising the first source/drain contact and the via power rail, has a T-shaped cross-sectional structure in a cross-sectional view taken in the second horizontal direction.

5. The integrated circuit device of claim 1, further comprising a via power rail integrally connected with a first source/drain contact selected from the pair of source/drain contacts, the via power rail passing through the insulating structure to extend lengthwise in the vertical direction, wherein the contact isolation insulating film and the via power rail are apart from each other in the second horizontal direction with a first source/drain region, which is selected from the pair of source/drain regions, therebetween.

6. The integrated circuit device of claim 1, wherein at least one of the pair of source/drain contacts comprises a first side portion and a second side portion on both sides thereof in the second horizontal direction, each of the first side portion and the second side portion comprising the first portion.

7. The integrated circuit device of claim 1, wherein the substrate further comprises a power rail region arranged apart from the pair of fin-type active regions in the second horizontal direction to extend lengthwise in the first horizontal direction, at least one power rail wiring line is arranged in the power rail region to pass through the substrate in the vertical direction from a backside surface of the substrate, and the contact isolation insulating film is arranged over the substrate at a position away from the power rail region.

8. The integrated circuit device of claim 1, further comprising a pair of gate lines arranged over the pair of fin-type active regions to extend lengthwise in the second horizontal direction, wherein the contact isolation insulating film comprises a portion overlapping at least one of the pair of gate lines in the vertical direction.

9. The integrated circuit device of claim 1, further comprising a via power rail passing through the insulating structure to extend lengthwise in the vertical direction, wherein the pair of source/drain contacts comprise a first source/drain contact, which is integrally connected with the via power rail, and a second source/drain contact, which is apart from the first source/drain contact with the contact isolation insulating film therebetween, the pair of source/drain regions comprise a first source/drain region, which is connected to the first source/drain contact, and a second source/drain region, which is apart from the first source/drain region with the contact isolation insulating film therebetween, the contact isolation insulating film comprises a portion overlapping the via power rail in the vertical direction, and each of the contact isolation insulating film and the via power rail comprises a portion between the first source/drain region and the second source/drain region.

10. The integrated circuit device of claim 1, wherein at least one of the pair of source/drain contacts has a T-shaped cross-sectional structure in a cross-sectional view taken in the second horizontal direction.

11. The integrated circuit device of claim 1, wherein each of the pair of source/drain contacts comprises only a metal plug comprising a single metal.

12. The integrated circuit device of claim 1, wherein each of the pair of source/drain contacts comprises a metal plug and a conductive barrier film surrounding the metal plug, each of the pair of source/drain regions is apart from the metal plug with the conductive barrier film therebetween, the conductive barrier film is not arranged between the metal plug and the contact isolation insulating film, and the contact isolation insulating film is in contact with the metal plug.

13. The integrated circuit device of claim 1, wherein each of the pair of source/drain contacts comprises a metal plug and a conductive barrier film surrounding the metal plug, and each of the pair of source/drain regions and the contact isolation insulating film is apart from the metal plug with the conductive barrier film therebetween.

14. The integrated circuit device of claim 1, further comprising:

a gate line arranged over the pair of fin-type active regions to extend lengthwise in the second horizontal direction; and a pair of nanosheet stacks arranged between the pair of fin-type active regions and the gate line, each of the pair of nanosheet stacks comprising at least one nanosheet surrounded by the gate line, wherein the pair of source/drain regions are in contact with the at least one nanosheet of a nanosheet stack adjacent thereto out of the pair of nanosheet stacks.

15. An integrated circuit device comprising:

a plurality of fin-type active regions protruding from a substrate and extending lengthwise in a first horizontal direction, the plurality of fin-type active regions being apart from each other in a second horizontal direction that is perpendicular to the first horizontal direction;

a plurality of source/drain regions arranged on each of the plurality of fin-type active regions;

a device isolation film covering both sidewalls of each of the plurality of fin-type active regions;

an insulating structure covering the plurality of source/drain regions and the device isolation film;

a plurality of source/drain contacts arranged respectively on the plurality of source/drain regions to be apart from each other in the second horizontal direction, each of the plurality of source/drain contacts being connected to at least one of the plurality of source/drain regions;

a via power rail passing through the insulating structure in a vertical direction and connected integrally with a first source/drain contact selected from the plurality of source/drain contacts; and a plurality of contact isolation insulating films, which are each arranged one-by-one between a pair of source/drain contacts adjacent to each other in the second horizontal direction from among the plurality of source/drain contacts, and which each have a lower surface that is closer to the substrate than a lower surface of each of the plurality of source/drain contacts, wherein at least one of the plurality of source/drain contacts comprises a first portion, which is arranged between one source/drain region selected from the plurality of source/drain regions and one contact isolation insulating film selected from the plurality of contact isolation insulating films in the second horizontal direction and extends in the vertical direction toward the substrate along a surface of the selected one contact isolation insulating film.

16. The integrated circuit device of claim 15, wherein the plurality of source/drain contacts comprise the first source/drain contact and a second source/drain contact, which are in contact with one contact isolation insulating film selected from the plurality of contact isolation insulating films, and the first source/drain contact and the second source/drain contact respectively have different cross-sectional shapes and different cross-sectional areas in a cross-sectional view taken in the second horizontal direction.

17. The integrated circuit device of claim 15, wherein the first source/drain contact is connected to two source/drain regions, which are selected from the plurality of source/drain regions and apart from each other in the second horizontal direction with the via power rail therebetween, and a via power rail structure, comprising the first source/drain contact and the via power rail, has a T-shaped cross-sectional structure in a cross-sectional view taken in the second horizontal direction.

18. The integrated circuit device of claim 15, wherein the plurality of source/drain contacts comprise a second source/drain contact arranged between two contact isolation insulating films adjacent to each other in the second horizontal direction from among the plurality of contact isolation insulating films, the second source/drain contact being in contact with each of the two contact isolation insulating films, the second source/drain contact comprises a first side portion, which is in contact with one of the two contact isolation insulating films, and a second side portion, which is in contact with the other contact isolation insulating film, and each of the first side portion and the second side portion of the second source/drain contact comprises the first portion.

19. The integrated circuit device of claim 15, wherein the plurality of source/drain contacts comprise a second source/drain contact that is apart from the first source/drain contact in the second horizontal direction with, therebetween, at least a first contact isolation insulating film selected from the plurality of contact isolation insulating films, the second source/drain contact Is connected to two source/drain regions selected from the plurality of source/drain regions, each of the two source/drain regions being apart from the via power rail in the second horizontal direction with the first contact isolation insulating film therebetween, and the second source/drain contact comprises a contact sag portion arranged between the two source/drain regions to protrude toward the substrate in the vertical direction.

20. An integrated circuit device comprising:

a plurality of fin-type active regions protruding from a substrate and extending lengthwise in a first horizontal direction, the plurality of fin-type active regions being apart from each other in a second horizontal direction that is perpendicular to the first horizontal direction;

a pair of gate lines arranged over the plurality of fin-type active regions to extend lengthwise in the second horizontal direction;

a plurality of source/drain regions between the pair of gate lines, the plurality of source/drain regions being respectively arranged one-to-one on the plurality of fin-type active regions;

a device isolation film covering both sidewalls of each of the plurality of fin-type active regions;

an insulating structure arranged between the pair of gate lines to cover the plurality of source/drain regions and the device isolation film;

a plurality of source/drain contacts arranged respectively on the plurality of source/drain regions to be apart from each other in the second horizontal direction and having different cross-sectional shapes from each other in the second horizontal direction, each of the plurality of source/drain contacts being connected to at least one of the plurality of source/drain regions;

a via power rail passing through the Insulating structure In a vertical direction and connected integrally with a first source/drain contact selected from the plurality of source/drain contacts;

a power rail wiring line passing through the substrate and the device isolation film in the vertical direction and connected to the via power rail; and a contact isolation insulating film between two source/drain contacts adjacent to each other from among the plurality of source/drain contacts, the contact isolation insulating film having an uppermost surface, which is coplanar with an upper surface of each of the plurality of source/drain contacts, and a lowermost surface, which is closer to the substrate in the vertical direction than a lower surface of each of the plurality of source/drain contacts and farther from the substrate in the vertical direction than a lower surface of the via power rail, wherein a source/drain contact contacting the contact isolation insulating film from among the plurality of source/drain contacts comprises a first portion, which is arranged between one source/drain region selected from the plurality of source/drain regions and the contact isolation insulating film and extends in the vertical direction toward the substrate along a surface of the contact isolation insulating film.

* * * * *